US010957237B2

(12) United States Patent
Takahashi et al.

(10) Patent No.: US 10,957,237 B2
(45) Date of Patent: Mar. 23, 2021

(54) CIRCUIT, SEMICONDUCTOR DEVICE, DISPLAY DEVICE, ELECTRONIC DEVICE, AND DRIVING METHOD OF CIRCUIT

(71) Applicant: Semiconductor Energy Laboratory Co., Ltd., Atsugi (JP)

(72) Inventors: Kei Takahashi, Kanagawa (JP); Hiroyuki Miyake, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 201 days.

(21) Appl. No.: 15/387,190

(22) Filed: Dec. 21, 2016

(65) Prior Publication Data
US 2017/0186355 A1    Jun. 29, 2017

(30) Foreign Application Priority Data

Dec. 28, 2015 (JP) .............................. JP2015-256954

(51) Int. Cl.
*G09G 3/20* (2006.01)
*G09G 3/36* (2006.01)
*H01L 29/786* (2006.01)
*G02F 1/1345* (2006.01)
(Continued)

(52) U.S. Cl.
CPC ....... *G09G 3/2011* (2013.01); *G02F 1/13454* (2013.01); *G09G 3/3258* (2013.01);
(Continued)

(58) Field of Classification Search
CPC .. G09G 3/2011; G09G 3/3258; G09G 3/3648; G09G 3/3696; H01L 27/1207; H01L 27/1225; H03M 1/66
(Continued)

(56) References Cited

U.S. PATENT DOCUMENTS 5,396,245 A * 3/1995 Rempfer ............. H03F 3/45479
341/121
5,489,904 A * 2/1996 Hadidi ................. H03M 1/164
341/136
(Continued)

FOREIGN PATENT DOCUMENTS

JP          11-068476 A     3/1999
JP          2011-166555 A    8/2011
WO       WO-2006/118184    11/2006

*Primary Examiner* — Fred Tzeng
(74) *Attorney, Agent, or Firm* — Fish & Richardson P.C.

(57) ABSTRACT

A semiconductor device with lower power consumption or a display device including the semiconductor device is provided. A circuit to which an N-bit signal is input includes a first digital-to-analog converter circuit to which an upper M-bit signal is input, a second digital-to-analog converter circuit to which a lower (N–M)-bit signal is input, and an amplifier circuit. The amplifier circuit includes a first transistor and a second transistor. An output terminal of the first digital-to-analog converter circuit is electrically connected to a gate of the first transistor. An output terminal of the second digital-to-analog converter circuit is electrically connected to a substrate potential of the second transistor. One of a source and a drain of the first transistor is electrically connected to one of a source and a drain of the second transistor. An output terminal of the amplifier circuit is electrically connected to a gate of the second transistor.

22 Claims, 41 Drawing Sheets

(51) Int. Cl.
*G09G 3/3258* (2016.01)
*H01L 27/12* (2006.01)
*H03M 1/66* (2006.01)
*H03M 1/76* (2006.01)
*G02F 1/1362* (2006.01)
*H01L 27/092* (2006.01)

(52) U.S. Cl.
CPC ......... *G09G 3/3648* (2013.01); *G09G 3/3688* (2013.01); *G09G 3/3696* (2013.01); *H01L 27/1207* (2013.01); *H01L 27/1225* (2013.01); *H01L 27/1255* (2013.01); *H01L 29/7869* (2013.01); *H01L 29/78648* (2013.01); *H01L 29/78696* (2013.01); *H03M 1/66* (2013.01); *G02F 1/136286* (2013.01); *G09G 2300/0426* (2013.01); *G09G 2310/027* (2013.01); *G09G 2320/0276* (2013.01); *H01L 27/092* (2013.01); *H03M 1/76* (2013.01)

(58) Field of Classification Search
USPC ....................................................... 345/690
See application file for complete search history.

(56) References Cited

U.S. PATENT DOCUMENTS

| | | | |
|---|---|---|---|
| 5,731,774 A | 3/1998 | Fujii et al. | |
| 5,859,606 A * | 1/1999 | Schrader | H03M 1/682 341/144 |
| 7,391,399 B2 | 6/2008 | Kikuchi et al. | |
| 7,816,816 B2 | 10/2010 | Tanaka | |
| 7,948,418 B2 | 5/2011 | Cho et al. | |
| 8,035,593 B2 | 10/2011 | Kikuchi et al. | |
| 8,462,145 B2 | 6/2013 | Kim et al. | |
| 2005/0140630 A1 | 6/2005 | Kikuchi et al. | |
| 2010/0141493 A1 | 6/2010 | Cho et al. | |
| 2010/0156867 A1 | 6/2010 | Kim et al. | |
| 2011/0096054 A1* | 4/2011 | Cho | G09G 3/3685 345/211 |
| 2011/0199360 A1 | 8/2011 | Fujiwara | |
| 2012/0049048 A1* | 3/2012 | Dyer | G01J 1/44 250/214 AL |
| 2012/0049927 A1* | 3/2012 | Dyer | G05F 3/262 327/355 |
| 2012/0146828 A1* | 6/2012 | Narathong | H03L 7/099 341/154 |
| 2012/0310450 A1* | 12/2012 | Srivastav | G08G 5/0021 701/3 |
| 2014/0166850 A1* | 6/2014 | Zheng | G09G 3/3406 250/205 |
| 2016/0241255 A1 | 8/2016 | Takahashi | |
| 2016/0260373 A1 | 9/2016 | Miyake | |
| 2017/0005669 A1 | 1/2017 | Fujita | |
| 2017/0053584 A1 | 2/2017 | Takahashi | |
| 2017/0154560 A1 | 6/2017 | Takahashi | |
| 2017/0186751 A1 | 6/2017 | Akasawa et al. | |
| 2017/0250680 A1 | 8/2017 | Yamamoto | |

\* cited by examiner

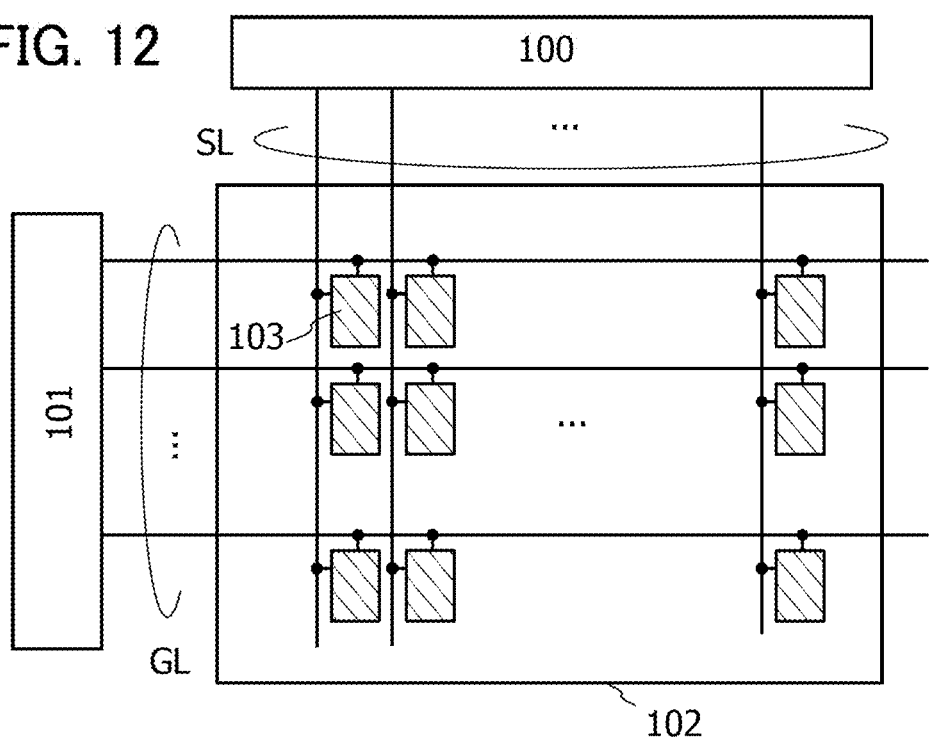

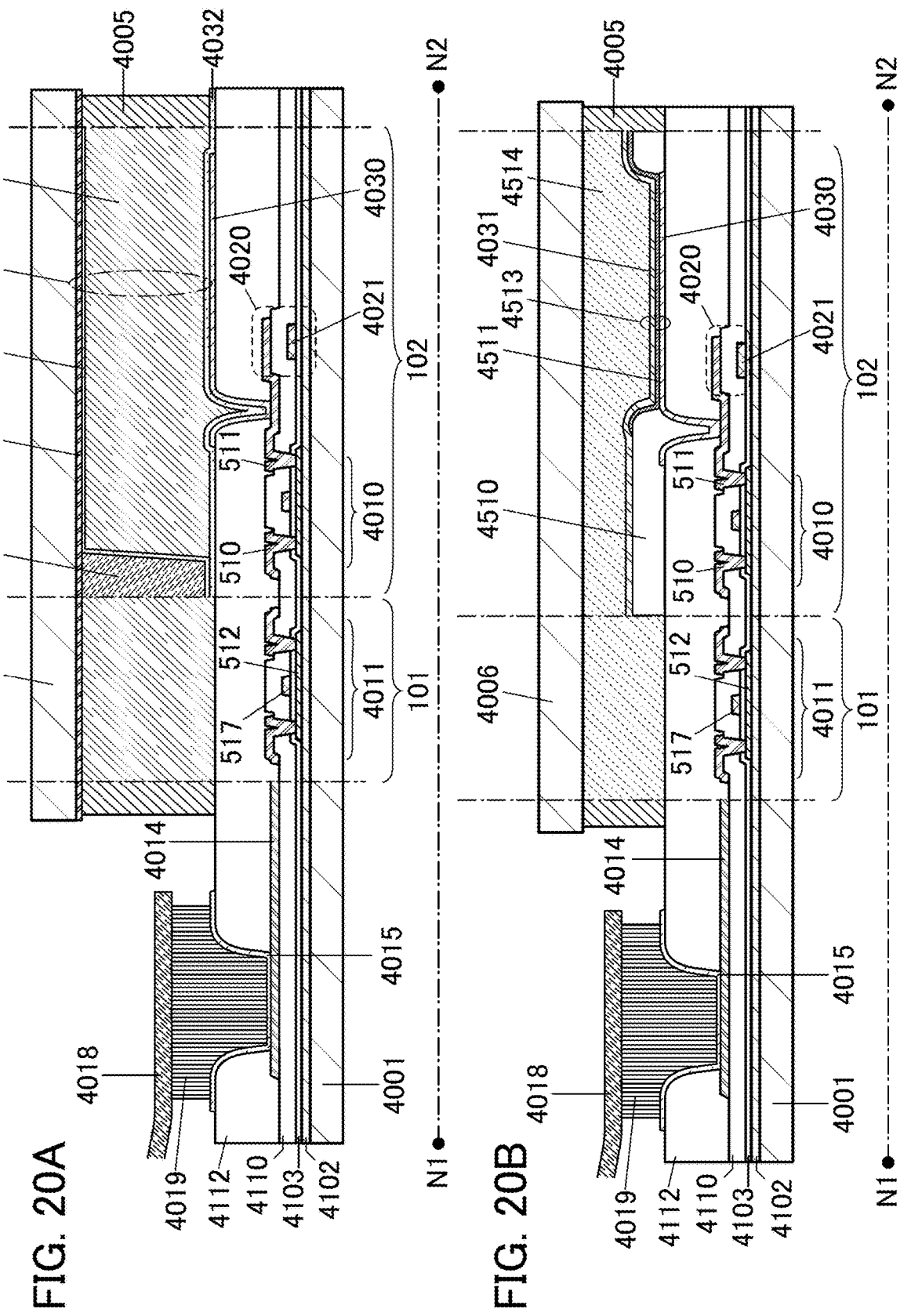

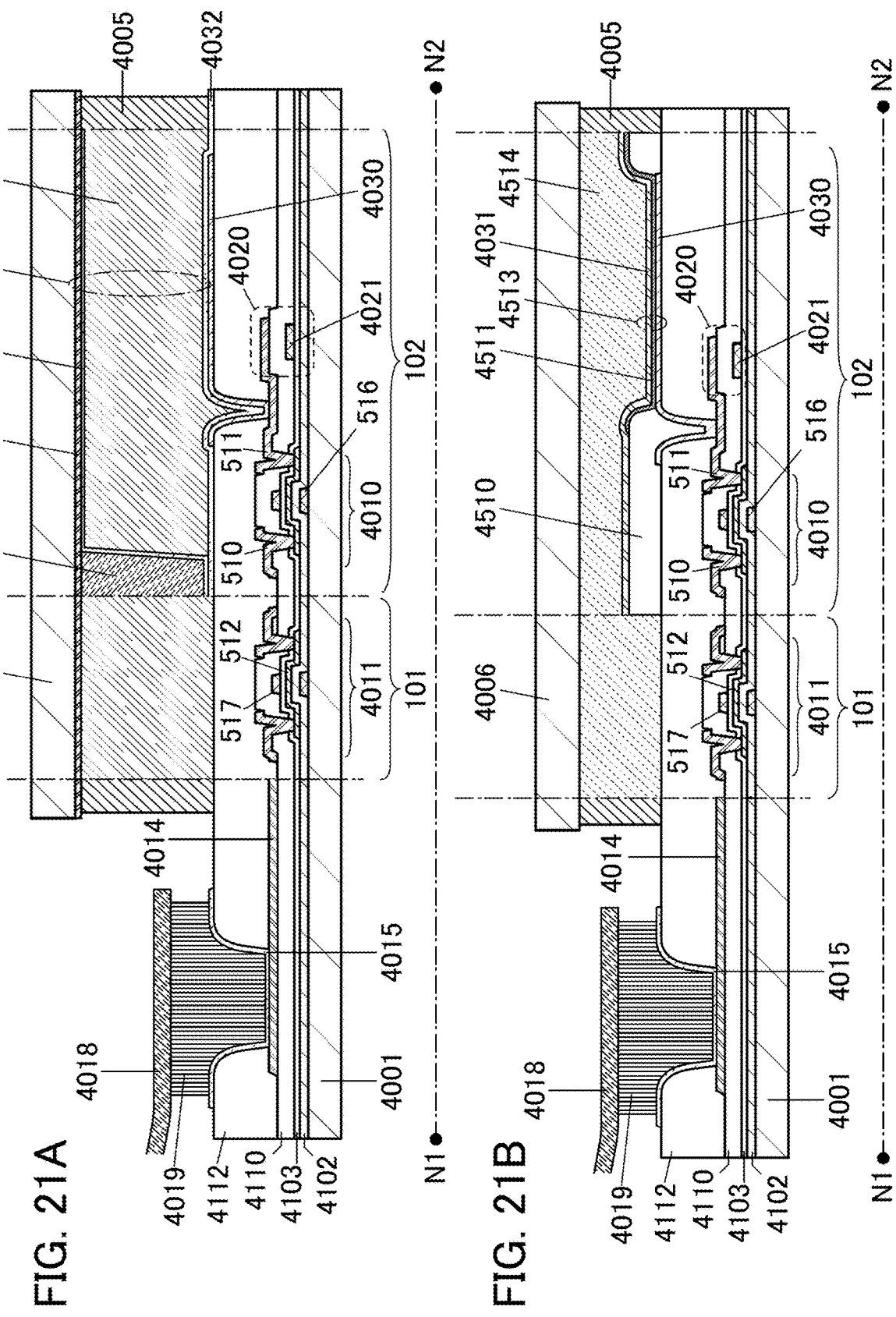

US 10,957,237 B2

CIRCUIT, SEMICONDUCTOR DEVICE, DISPLAY DEVICE, ELECTRONIC DEVICE, AND DRIVING METHOD OF CIRCUIT

BACKGROUND OF THE INVENTION

1. Field of the Invention

One embodiment of the present invention relates to a semiconductor device, a display device, and an electronic device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

In this specification and the like, a semiconductor device generally means a device that can function by utilizing semiconductor characteristics. A display device, a light-emitting device, an electro-optical device, a semiconductor circuit, and an electronic device include a semiconductor device in some cases.

2. Description of the Related Art

There has been a trend toward higher performance (e.g., multiple gray levels and higher definition) of display panels. To meet the demand for higher performance, an integrated circuit (IC, also referred to as a driver IC) is used as a driver circuit of a display panel, particularly as a signal line driver circuit (also referred to as a source driver).

A driver IC includes a grayscale voltage generator circuit for generating an analog signal supplied to pixels. The grayscale voltage generator circuit is what is called a digital-to-analog (D/A) converter circuit (DAC), which generates an analog signal from a digital signal.

As the D/A converter circuit, a resistor string DAC (R-DAC), in which resistors are provided in series, is used in consideration of the requirement of high-speed response. The number of switches in an R-DAC increases exponentially with an increase in the number of bits of digital signals; thus, the circuit area of a driver IC increases.

In view of the above, Patent Documents 1 to 3 suggest a structure in which an upper-bit digital signal and a lower-bit digital signal are independently converted into analog signals and a desired analog signal is synthesized from the analog signals.

REFERENCE

Patent Document

[Patent Document 1] United States Patent Application Publication No. 2005/0140630
[Patent Document 2] United States Patent Application Publication No. 2010/0156867
[Patent Document 3] United States Patent Application Publication No. 2010/0141493

SUMMARY OF THE INVENTION

As described above, there are a variety of structures of semiconductor devices functioning as grayscale voltage generator circuits. The structures have merits and demerits, and an appropriate structure is selected in accordance with circumstances. For example, when a current DAC is employed as in Patent Document 2, a switch is composed of a transistor with high withstand voltage. The increase in the number of switches due to the increase in the number of bits of digital signals causes a larger circuit area. Moreover, the increase in the number of switches due to a larger number of digital signal bits causes the increase in parasitic capacitance of an output portion, resulting in lower response speed.

In the structure described in Patent Document 3, an output analog signal is influenced by an offset voltage of an amplifier circuit. If the output voltage which is influenced by the offset voltage exceeds a desired grayscale voltage, there is a problem in that grayscale inversion is caused and desired grayscale display cannot be obtained.

An object of one embodiment of the present invention is to provide a grayscale voltage generator circuit which is less likely to be influenced by an offset voltage. An object of one embodiment of the present invention is to provide a grayscale voltage generator circuit with a small area. An object of one embodiment of the present invention is to provide a novel grayscale voltage generator circuit. An object of one embodiment of the present invention is to provide a display panel with improved display quality. An object of one embodiment of the present invention is to provide a novel semiconductor device.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to achieve at least one of the aforementioned objects and the other objects.

Note that the description of a plurality of objects does not mutually preclude the existence. One embodiment of the present invention does not necessarily achieve all the objects listed above. Objects other than those listed above are apparent from the description of the specification, drawings, and claims, and also such objects could be an object of one embodiment of the present invention.

One embodiment of the present invention is a circuit to which an N-bit signal is input, which includes a first digital-to-analog converter circuit, a second digital-to-analog converter circuit, a third digital-to-analog converter circuit, and an amplifier circuit. The amplifier circuit includes a first transistor, a second transistor, a third transistor, and a fourth transistor. The first transistor and the second transistor are n-channel transistors, and the third transistor and the fourth transistor are p-channel transistors. An output terminal of the first digital-to-analog converter circuit is electrically connected to a gate of the first transistor and a gate of the third transistor. An output terminal of the second digital-to-analog converter circuit is electrically connected to a substrate potential of the second transistor. An output terminal of the third digital-to-analog converter circuit is electrically connected to a substrate potential of the fourth transistor. One of a source and a drain of the first transistor is electrically connected to one of a source and a drain of the second transistor. One of a source and a drain of the third transistor is electrically connected to one of a source and a drain of the fourth transistor. An output terminal of the amplifier circuit is electrically connected to a gate of the second transistor and a gate of the fourth transistor. An upper M-bit signal of the N-bit signal is input to the first digital-to-analog converter circuit, and a lower (N−M)-bit signal of the N-bit signal is input to the second digital-to-analog converter circuit and the third digital-to-analog converter circuit.

Another embodiment of the present invention is a circuit to which an N-bit signal is input, which includes a first digital-to-analog converter circuit, a second digital-to-analog converter circuit, and an amplifier circuit. The amplifier circuit includes a first transistor, a second transistor, a third transistor, and a fourth transistor. The first transistor forms a differential pair with the second transistor, and the third transistor forms a differential pair with the fourth transistor. An output terminal of the first digital-to-analog converter circuit is electrically connected to a gate of the first transistor and a gate of the third transistor. An output terminal of the second digital-to-analog converter circuit is electrically connected to a substrate potential of the second transistor. An upper M-bit signal of the N-bit signal is input to the first digital-to-analog converter circuit. A lower (N−M)-bit signal of the N-bit signal is input to the second digital-to-analog converter circuit.

Another embodiment of the present invention is a circuit to which an N-bit signal is input, which includes a first digital-to-analog converter circuit, a second digital-to-analog converter circuit, a first amplifier circuit, and a second amplifier circuit. The first amplifier circuit includes an input terminal, a first output terminal, and a second output terminal. An output terminal of the first digital-to-analog converter circuit is electrically connected to the input terminal of the first amplifier circuit. The second amplifier circuit includes a first transistor and a second transistor. A gate of the first transistor and a gate of the second transistor are electrically connected to each other. An output terminal of the second digital-to-analog converter circuit is electrically connected to a substrate potential of the first transistor. A first potential is supplied to one of a source and a drain of the first transistor and one of a source and a drain of the second transistor. The first potential is a high potential signal when the first transistor and the second transistor are p-channel transistors, and the first potential is a low potential signal when the first transistor and the second transistor are n-channel transistors. The other of the source and the drain of the first transistor is electrically connected to the first output terminal of the first amplifier circuit. The other of the source and the drain of the second transistor is electrically connected to the second output terminal of the first amplifier circuit. An upper M-bit signal of the N-bit signal is input to the first digital-to-analog converter circuit. A lower (N−M)-bit signal of the N-bit signal is input to the second digital-to-analog converter circuit. In the above-described structure, it is preferable that the first amplifier circuit include a third transistor and a fourth transistor, that the third transistor form a differential pair with the fourth transistor, that one of a source and a drain of the third transistor be electrically connected to the first output terminal of the first amplifier circuit, and that one of a source and a drain of the fourth transistor be electrically connected to the second output terminal of the first amplifier circuit.

Another embodiment of the present invention is a circuit to which an N-bit signal is input, which includes a first digital-to-analog converter circuit, a second digital-to-analog converter circuit, and an amplifier circuit. The amplifier circuit includes a first transistor and a second transistor. The first transistor includes a first conductor. The first conductor is configured to function as a gate of the first transistor. The second transistor includes a second conductor and a third conductor. The second conductor is configured to function as a first gate of the second transistor, and the third conductor is configured to function as a second gate of the second transistor. An output terminal of the first digital-to-analog converter circuit is electrically connected to the first conductor. An output terminal of the second digital-to-analog converter circuit is electrically connected to the third conductor. One of a source and a drain of the second transistor is electrically connected to one of a source and a drain of the first transistor. An output terminal of the amplifier circuit is electrically connected to the second conductor. An upper M-bit signal of the N-bit signal is input to the first digital-to-analog converter circuit. A lower (N−M)-bit signal of the N-bit signal is input to the second digital-to-analog converter circuit. The first transistor and the second transistor each include an oxide semiconductor.

Another embodiment of the present invention is a circuit to which an N-bit signal is input, which includes a first digital-to-analog converter circuit, a second digital-to-analog converter circuit, a first amplifier circuit, and a second amplifier circuit. The first amplifier circuit includes an input terminal, a first output terminal, and a second output terminal. An output terminal of the first digital-to-analog converter circuit is electrically connected to the input terminal of the first amplifier circuit. The second amplifier circuit includes a first transistor and a second transistor. A gate of the first transistor and a first gate of the second transistor are electrically connected to each other. The first transistor includes a first conductor. The first conductor is configured to function as the gate of the first transistor. The second transistor includes a second conductor and a third conductor. The second conductor is configured to function as the first gate of the second transistor, and the third conductor functions as a second gate of the second transistor. A low potential signal is supplied to one of a source and a drain of the first transistor and one of a source and a drain of the second transistor. The other of the source and the drain of the first transistor is electrically connected to the first output terminal of the first amplifier circuit. The other of the source and the drain of the second transistor is electrically connected to the second output terminal of the first amplifier circuit. The first conductor and the second conductor are electrically connected to each other. An output terminal of the second digital-to-analog converter circuit is electrically connected to the third conductor. An upper (N−M)-bit signal of the N-bit signal is input to the first digital-to-analog converter circuit. A lower M-bit signal of the N-bit signal is input to the second digital-to-analog converter circuit. The first transistor and the second transistor each include an oxide semiconductor. In the above-described structure, it is preferable that the first amplifier circuit include a third transistor and a fourth transistor, that the third transistor form a differential pair with the fourth transistor, that one of a source and a drain of the third transistor be electrically connected to the first output terminal of the first amplifier circuit, and that one of a source and a drain of the fourth transistor be electrically connected to the second output terminal of the first amplifier circuit.

Another embodiment of the present invention is a semiconductor device including any of the above-described circuits. Another embodiment of the present invention is an electronic device including the above-described semiconductor device.

Another embodiment of the present invention is a display device including any of the above-described circuits, and at least one of a touch sensor, a speaker, and an imaging device.

Another embodiment of the present invention is an electronic device including the above-described display device.

Another embodiment of the present invention is a method for driving a circuit to which an N-bit signal is input. The circuit includes a first digital-to-analog converter circuit, a second digital-to-analog converter circuit, and an amplifier circuit. The amplifier circuit includes a first transistor and a second transistor. The method includes the steps of electrically connecting an output terminal of the first digital-to-analog converter circuit to a gate of the first transistor and a gate of the second transistor, electrically connecting an output terminal of the second digital-to-analog converter circuit to a substrate potential of the second transistor, electrically connecting one of a source and a drain of the first transistor to one of a source and a drain of the second transistor, electrically connecting an output terminal of the amplifier circuit to the gate of the second transistor, connecting an upper M-bit signal of the N-bit signal to the first digital-to-analog converter circuit, connecting a lower (N−M)-bit signal of the N-bit signal to the second digital-to-analog converter circuit, connecting a substrate potential of the first transistor to a constant voltage source, and changing a potential supplied to the substrate potential of the second transistor so that a potential output from the amplifier circuit is changed.

One embodiment of the present invention can provide a novel semiconductor device, a novel electronic device, or the like.

One embodiment of the present invention can provide a grayscale voltage generator circuit which is less likely to be influenced by an offset voltage. One embodiment of the present invention can provide a grayscale voltage generator circuit with a small area. One embodiment of the present invention can provide a novel grayscale voltage generator circuit. One embodiment of the present invention can provide a display panel with improved display quality. One embodiment of the present invention can provide a novel semiconductor device.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIG. 12 is a circuit block diagram illustrating a configuration example of a display panel;

FIGS. 20A and 20B are cross-sectional views each illustrating a structure example of a display panel;

FIGS. 21A and 21B are cross-sectional views each illustrating a structure example of a display panel;

DETAILED DESCRIPTION OF THE INVENTION

Figure 1A:
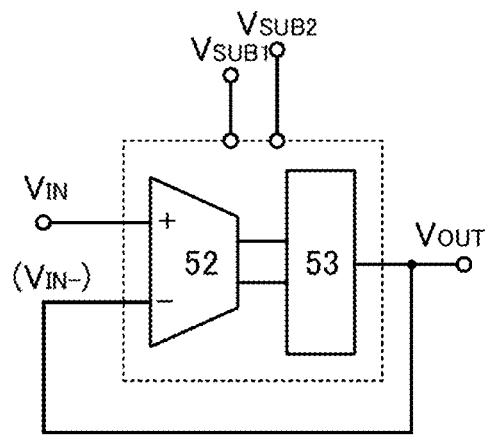
FIGS. 1A to 1D are circuit diagrams illustrating configuration examples of an amplifier circuit.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the same components, components having similar functions, components formed of the same material, or components formed at the same time are denoted by the same reference numerals in some cases, and description thereof is not repeated in some cases.

Furthermore, in this specification, any of the embodiments below can be combined as appropriate. In addition, in the case where a plurality of structure examples are described in one embodiment, some of the structure examples can be combined as appropriate.

In this specification, DEC[M:N] means DEC[M] to DEC[N], and DECB means an inverted data of DEC.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

In this specification and the like, ordinal numbers such as "first", "second", and "third" are used in order to avoid confusion among components. Thus, the terms do not limit the number or order of components. In this specification and the like, a "first" component in one embodiment can be referred to as a "second" component in other embodiments or claims. Furthermore, in this specification and the like, a "first" component in one embodiment can be referred to without the ordinal number in other embodiments or claims.

In this specification and the like, the terms "one of a source and a drain" (or first electrode or first terminal) and "the other of the source and the drain" (or second electrode or second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a switch is in a conductive state (on state) or in a non-conductive state (off state) to determine whether current flows therethrough or not. Alternatively, a switch has a function of selecting and changing a current path. Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "In the ca of the transistor refers to a state in which a source and a drain of the transistor are electrically short-circuited. Furthermore, an "of the tranof the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, and a layer).

Examples of the case where X and Y are directly connected include the case where an element that enables electrical connection between X and Y (e.g., a switch, a transistor, a capacitor, an inductor, a resistor, a diode, a display element, a light-emitting element, and a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, and a load) can be connected between X and Y.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, and a buffer circuit; a signal generator circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "Even when independent in this specification includes in its category such a case where one conductive film has functions of a plurality of components.

Any of the embodiments described below can be combined as appropriate. In addition, in the case where some structure examples (including a manufacturing method, an operating method, and the like) are given in one embodiment, any of the structure examples can be combined as appropriate, and any of the structure examples can be combined with one or more structure examples described in the other embodiments.

Embodiment 1

In this embodiment, an example of a semiconductor device 10 functioning as a grayscale voltage generator circuit will be described.

<Amplifier Circuit>

FIG. 1A illustrates an example of an amplifier circuit 51. The amplifier circuit 51 includes a terminal IN functioning as a non-inverting input terminal, a terminal IN− functioning as an inverting input terminal, and a terminal OUT functioning as an output terminal. A potential $V_{IN}$ is supplied to the terminal IN. A potential $V_{OUT}$ is output from the terminal OUT. The output from the terminal OUT is fed back to the terminal IN−.

The amplifier circuit 51 includes a terminal SUB1 and a terminal SUB2. A potential $V_{SUB1}$ and a potential $V_{SUB2}$ are supplied to the terminal SUB1 and the terminal SUB2, respectively. In the amplifier circuit 51, a value obtained by adding a voltage represented by ΔV to the potential $V_{IN}$ is obtained as the potential $V_{OUT}$. Here, ΔV is a value controlled by the potentials $V_{SUB1}$ and $V_{SUB2}$ input to the amplifier circuit 51. Note that ΔV is not limited to a positive value. Depending on the values of the potentials $V_{SUB1}$ and $V_{SUB2}$, ΔV might become negative.

The amplifier circuit 51 in FIG. 1A includes an amplifier circuit 52 and an amplifier circuit 53. The terminals IN and IN− are electrically connected to the amplifier circuit 52. A signal generated in the amplifier circuit 52 is supplied to the amplifier circuit 53. The amplifier circuit 53 is electrically connected to the terminal OUT.

Figure 1D:
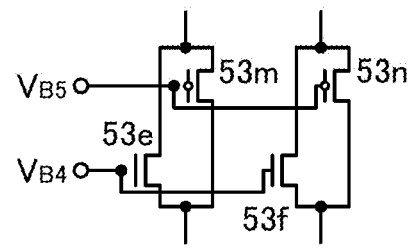
Figure 1B:
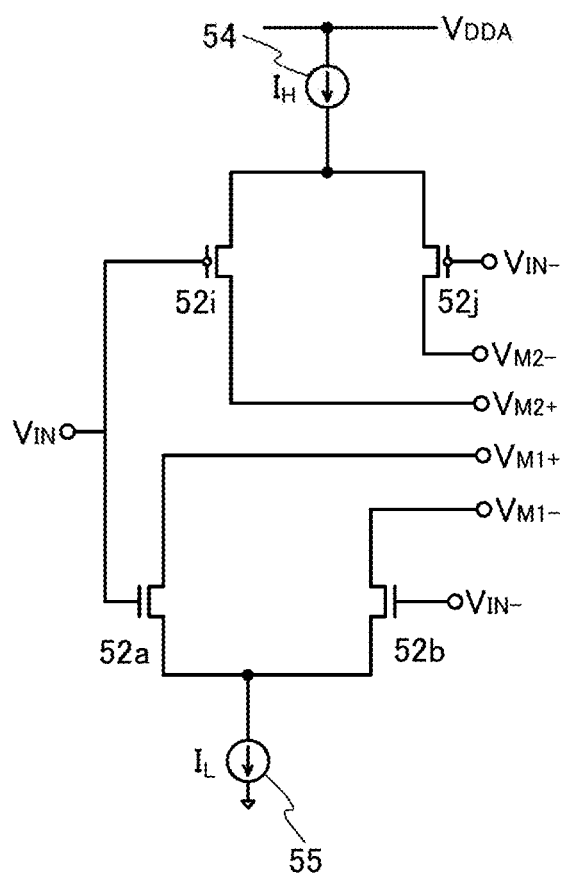
Figure 1C:
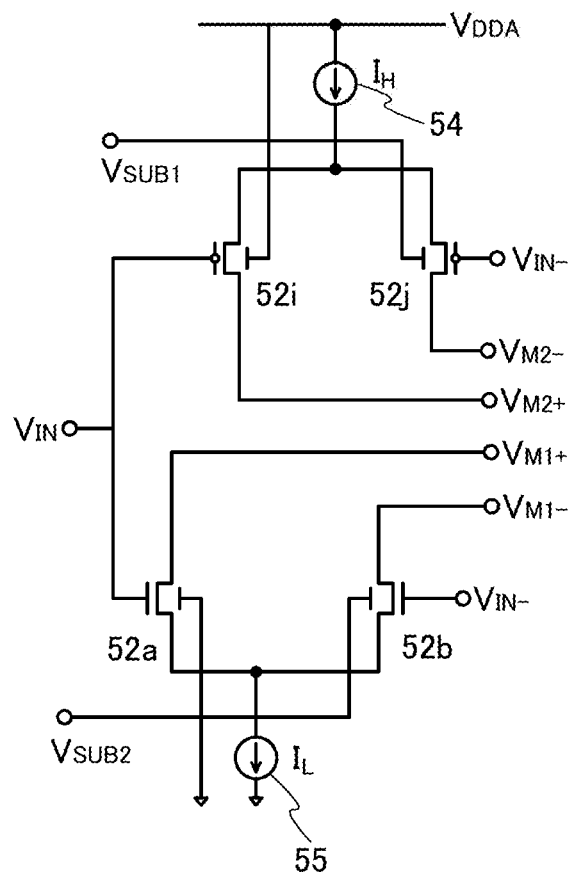

As the amplifier circuit 52, a differential amplifier can be used, for example. FIGS. 1B and 1C illustrate examples of a differential amplifier.

The amplifier circuit 52 illustrated in FIG. 1B includes a terminal M1+, a terminal M1−, a terminal M2+, and a terminal M2−. A potential $V_{M1+}$, a potential $V_{M1-}$, a potential $V_{M2+}$, and a potential $V_{M2-}$ are output from the terminal M1+, the terminal M1−, the terminal M2+, and the terminal M2−, respectively.

The amplifier circuit 52 in FIG. 1B includes a current source 54 and a current source 55. The current source 54 is connected to a potential $V_{DDA}$, and the current source 55 is connected to a potential $V_{GND}$.

The amplifier circuit 52 in FIG. 1B includes a transistor 52a and a transistor 52b which are n-channel transistors. The terminal IN is electrically connected to a first gate of the transistor 52a, and the terminal IN− is electrically connected to a first gate of the transistor 52b. One of a source and a drain of the transistor 52a and one of a source and a drain of the transistor 52b are electrically connected to the current source 55. The terminal M1+ is electrically connected to the other of the source and the drain of the transistor 52a, and the terminal M1− is electrically connected to the other of the source and the drain of the transistor 52b.

The amplifier circuit 52 in FIG. 1B includes a transistor 52i and a transistor 52j which are p-channel transistors. The terminal IN is electrically connected to a first gate of the transistor 52i, and the terminal IN− is electrically connected to a first gate of the transistor 52j. One of a source and a drain of the transistor 52i and one of a source and a drain of the transistor 52j are electrically connected to the current source 54. The terminal M2+ is electrically connected to the other of the source and the drain of the transistor 52i, and the terminal M2− is electrically connected to the other of the source and the drain of the transistor 52j.

In FIG. 1B, the transistor 52a, the transistor 52b, the transistor 52i, and the transistor 52j each preferably include a second gate. A potential $V_N$ is preferably supplied to the second gates of the transistor 52a and the transistor 52b. A potential $V_P$ is preferably supplied to the second gates of the transistor 52i and the transistor 52j.

The amplifier circuit 52 illustrated in FIG. 1C is different from that in FIG. 1B in that the terminal SUB1 and the terminal SUB2 are electrically connected to each other.

In FIG. 1C, the terminal SUB1 is electrically connected to the second gate of the transistor 52j. Alternatively, the terminal SUB1 may be electrically connected to a substrate potential of the transistor 52j. The terminal SUB2 is electrically connected to the second gate of the transistor 52b. Alternatively, the terminal SUB2 may be electrically connected to a substrate potential of the transistor 52b.

In FIG. 1C, the second gate or a substrate potential of the transistor 52a is preferably connected to a potential $V_{GND}$. In addition, in FIG. 1C, the second gate or a substrate potential of the transistor 52i is preferably connected to the potential $V_{DDA}$.

The potential $V_{GND}$ is a ground potential, for example. The potential $V_{GND}$ can be used as the certain reference potential, for example. The potential $V_{GND}$ refers to a voltage 0 [V] in some cases when used as the reference potential.

Figure 2A:
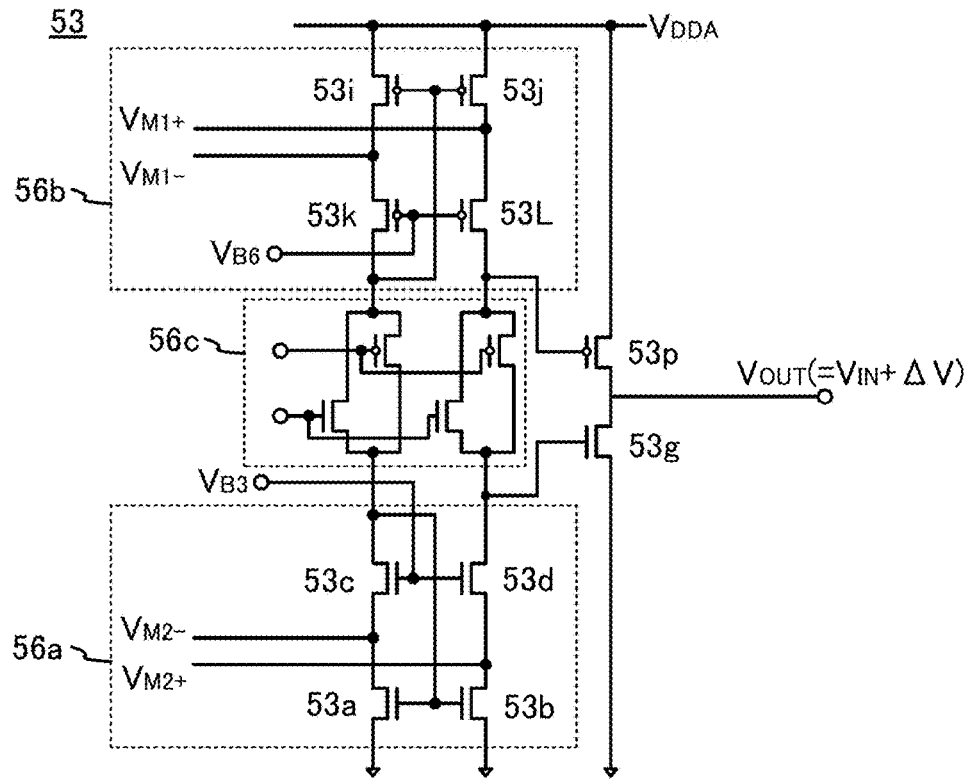
FIGS. 2A and 2B are circuit diagrams illustrating configuration examples of an amplifier circuit.

FIG. 2A illustrates an example of the amplifier circuit 53. The terminal M1+, the terminal M1−, the terminal M2+, and the terminal M2− to which signals are output from the amplifier circuit 52 are electrically connected to the amplifier circuit 53.

The amplifier circuit 53 illustrated in FIG. 2A includes a circuit 56a, a circuit 56b, a circuit 56c, a transistor 53g, and a transistor 53p. Here, the circuit 56a and the circuit 56b are referred to as current mirror circuits in some cases. FIG. 1D illustrates the circuit 56c in detail.

The circuit 56a includes a transistor 53a, a transistor 53b, a transistor 53c, and a transistor 53d which are n-channel transistors. One of a source and a drain of the transistor 53a is electrically connected to the terminal M2−, and the other of the source and the drain thereof is electrically connected to the potential $V_{GND}$. One of a source and a drain of the transistor 53b is electrically connected to the terminal M2+, and the other of the source and the drain thereof is electrically connected to the potential $V_{GND}$. A first gate of the transistor 53a is electrically connected to a first gate of the transistor 53b.

One of a source and a drain of the transistor 53c is electrically connected to the terminal M2−. One of a source and a drain of the transistor 53d is electrically connected to the terminal M2+, and the other of the source and the drain thereof is electrically connected to a first gate of the transistor 53g. A terminal B3 is electrically connected to a first gate of the transistor 53c. A voltage $V_{B3}$ is supplied to the terminal B3.

The circuit 56b includes a transistor 53i, a transistor 53j, a transistor 53k, and a transistor 53L which are p-channel transistors. One of a source and a drain of the transistor 53i is electrically connected to the terminal M1−, and the other of the source and the drain thereof is electrically connected to the potential $V_{DDA}$. One of a source and a drain of the transistor 53j is electrically connected to the terminal M1+, and the other of the source and the drain thereof is electrically connected to the potential $V_{DDA}$. A first gate of the transistor 53i is electrically connected to a first gate of the transistor 53j.

One of a source and a drain of the transistor 53k is electrically connected to the terminal M1−. One of a source and a drain of the transistor 53L is electrically connected to the terminal M1+, and the other of the source and the drain thereof is electrically connected to a first gate of the transistor 53p. A terminal B6 is electrically connected to a first gate of the transistor 53k. A voltage $V_{B6}$ is supplied to the terminal B6.

The circuit 56c includes a transistor 53e and a transistor 53f which are n-channel transistors and a transistor 53m and a transistor 53n which are p-channel transistors. The circuit 56c further includes a terminal B4 and a terminal B5. The terminal B4 is electrically connected to a gate of the transistor 53e and a gate of the transistor 53f. The terminal B5 is electrically connected to a gate of the transistor 53m and a gate of the transistor 53n. A potential $V_{B4}$ and a potential $V_{B5}$ are supplied to the terminal B4 and the terminal B5, respectively.

One of a source and a drain of the transistor 53e is electrically connected to one of a source and a drain of the transistor 53m, and the other of the source and the drain of the transistor 53e is electrically connected to the other of the source and the drain of the transistor 53m. One of a source and a drain of the transistor 53f is electrically connected to one of a source and a drain of the transistor 53n, and the other of the source and the drain of the transistor 53f is electrically connected to the other of the source and the drain of the transistor 53n.

The one of the source and the drain of the transistor 53e is electrically connected to the other of the source and the drain of the transistor 53c, the other of the source and the drain of the transistor 53e is electrically connected to the other of the source and the drain of the transistor 53k, the one of the source and the drain of the transistor 53f is electrically connected to the first gate of the transistor 53g, and the other of the source and the drain of the transistor 53f is electrically connected to the first gate of the transistor 53p.

One of a source and a drain of the transistor 53g and one of a source and a drain of the transistor 53p are electrically connected to the terminal OUT. The potential $V_{GND}$ is supplied to the other of the source and the drain of the transistor 53g, and the potential $V_{DDA}$ is supplied to the other of the source and the drain of the transistor 53p.

Figure 2B:
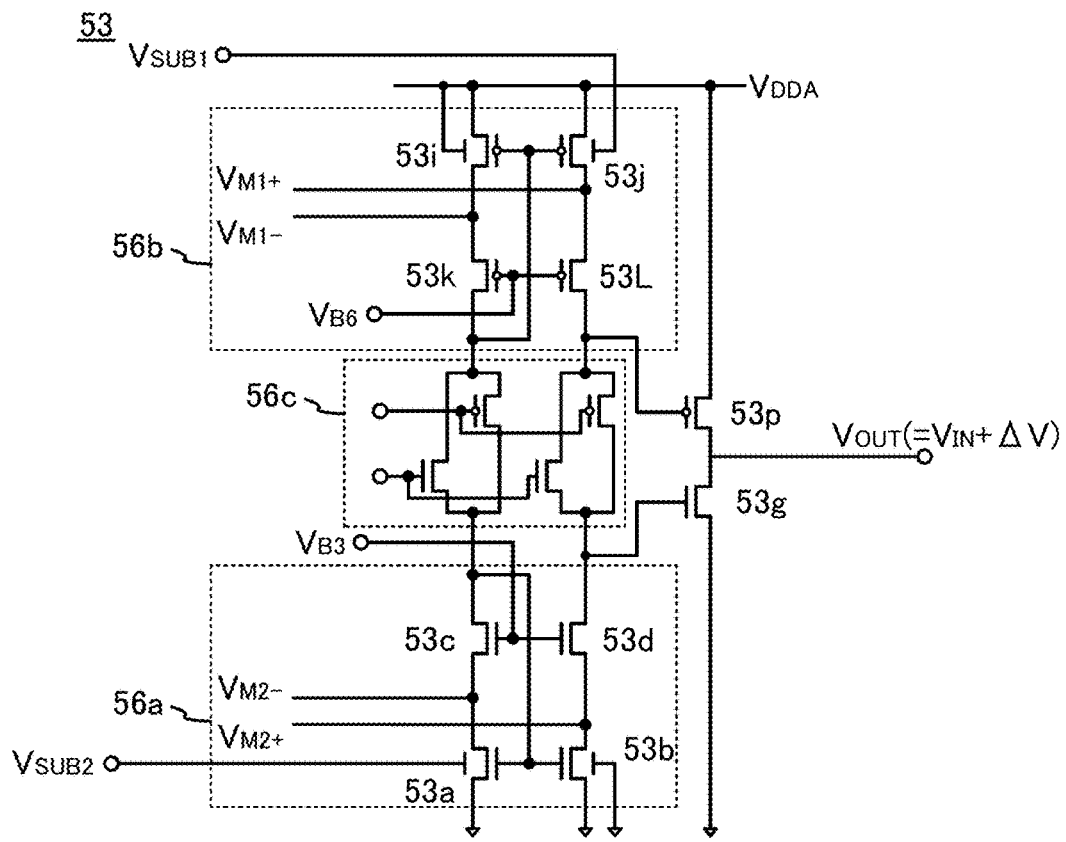

The amplifier circuit 53 illustrated in FIG. 2B is different from that in FIG. 2A in that the terminal SUB1 and the terminal SUB2 are electrically connected to each other.

In FIG. 2B, the terminal SUB1 is electrically connected to a second gate of the transistor 53j. Alternatively, the terminal SUB1 may be electrically connected to a substrate potential of the transistor 53j. The terminal SUB2 is electrically connected to a second gate of the transistor 53a. Alternatively, the terminal SUB2 may be electrically connected to a substrate potential of the transistor 53a.

It is preferable that a second gate or a substrate potential of the transistor 53b be electrically connected to the potential $V_{GND}$. In addition, it is preferable that a second gate or a substrate potential of the transistor 53i be electrically connected to the potential $V_{DDA}$.

Figure 3A:
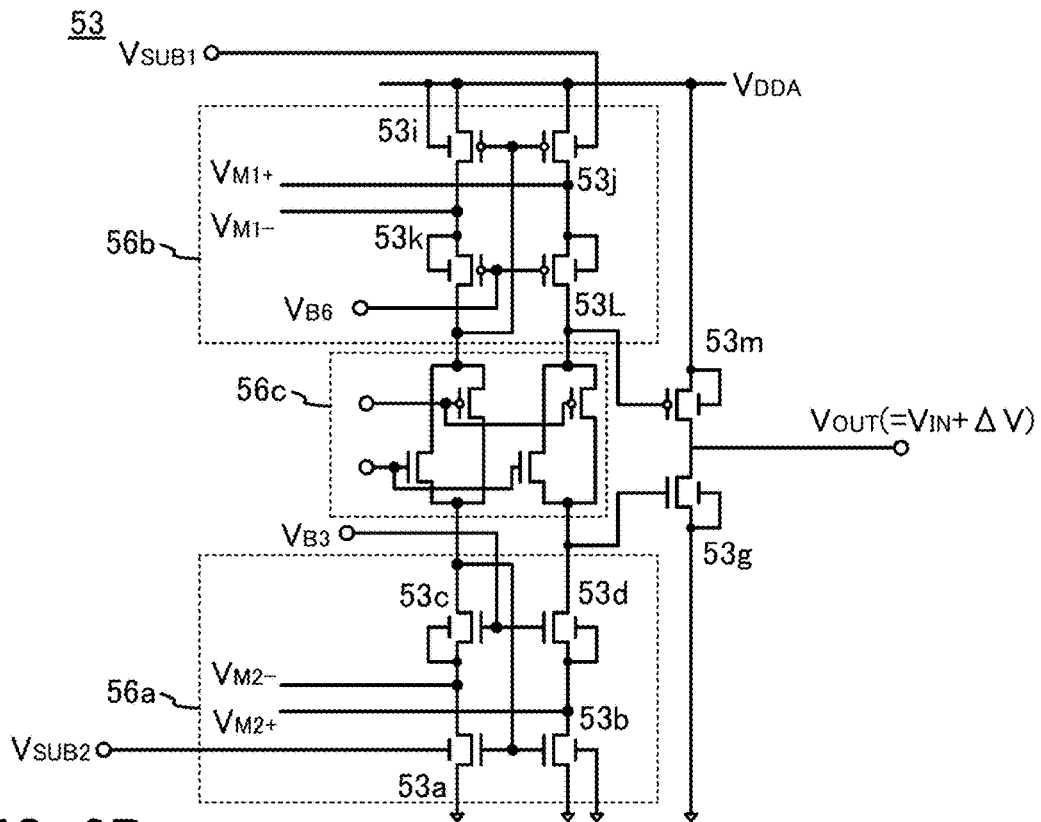
FIGS. 3A and 3B are circuit diagrams illustrating configuration examples of an amplifier circuit.

Here, as illustrated as an example in FIG. 3A, a source and the like of a transistor of one embodiment of the present invention may be electrically grounded to a substrate potential.

Figure 3B:
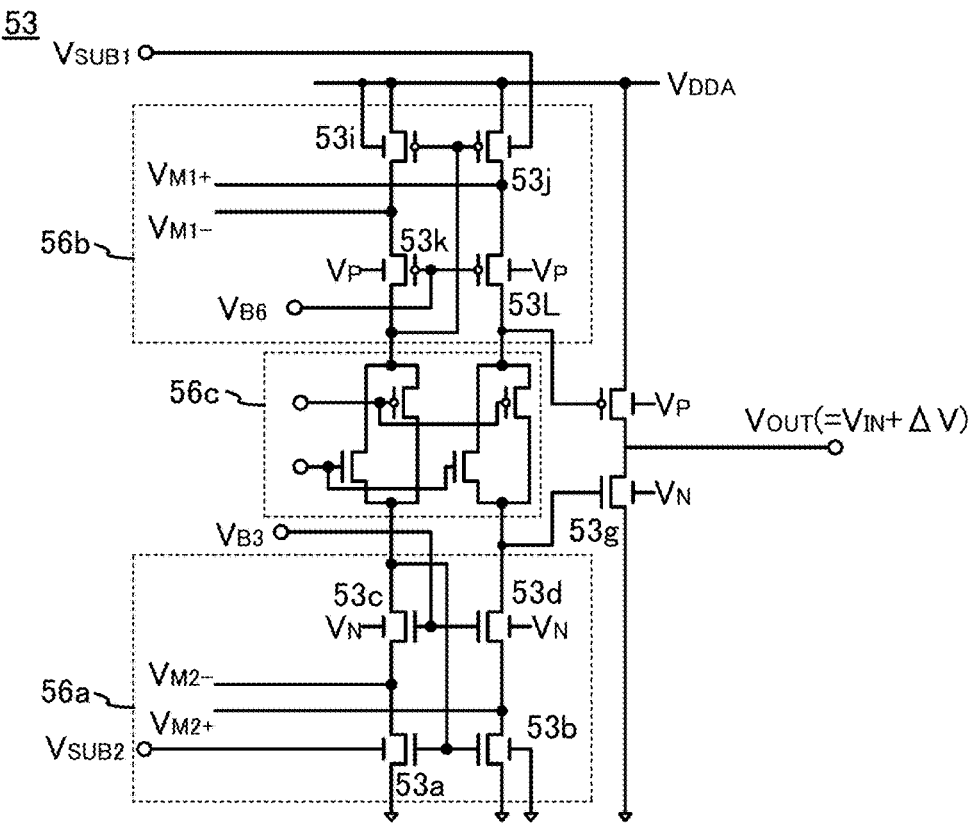

Each of the transistors 53a, 53b, 53c, 53d, 53i, 53j, 53k, and 53L may include a second gate as illustrated as an example in FIG. 3B. In the case of having a second gate, a potential $V_N$ is preferably supplied to the second gate of each of the transistors 53a, 53b, 53c, and 53d. A potential $V_P$ is preferably supplied to the second gate of each of the transistors 53i, 53j, 53k, and 53L.

<Example 1 of Semiconductor Device>

The semiconductor device 10 of one embodiment of the present invention includes a digital-to-analog converter circuit (D/A converter circuit) 11, a D/A converter circuit 31, a D/A converter circuit 32, and the amplifier circuit 51. The amplifier circuit 51 includes the amplifier circuit 52 and the amplifier circuit 53.

The semiconductor device 10 has a function of converting an N-bit image signal (N is a natural number of 2 or more) into an analog signal to output the analog signal. An output of the semiconductor device 10 is output from the terminal OUT as the potential $V_{OUT}$.

The D/A converter circuit 11 is a circuit that converts an upper M-bit image signal (such a signal is hereinafter referred to as an upper-bit signal) of the N-bit signal into analog signals. Note that M is a natural number smaller than N. The D/A converter circuit 11 has a function of generating a potential $V_{IN}$ for $2^M$ gray level which corresponds to the upper-bit signal.

The D/A converter circuit 31 and the D/A converter circuit 32 have functions of generating the potential $V_{SUB1}$ and the potential $V_{SUB2}$, respectively, from a lower (N−M)-bit image signal (hereinafter referred to as a lower-bit signal) of the N-bit signal.

In the semiconductor device 10, the potential $V_{IN}$ is supplied to the terminal IN from the D/A converter circuit 11. The potential $V_{SUB1}$ is supplied to the terminal SUB1 from the D/A converter circuit 31. In addition, the potential $V_{SUB2}$ is supplied to the terminal SUB2 from the D/A converter circuit 32.

Figure 4:
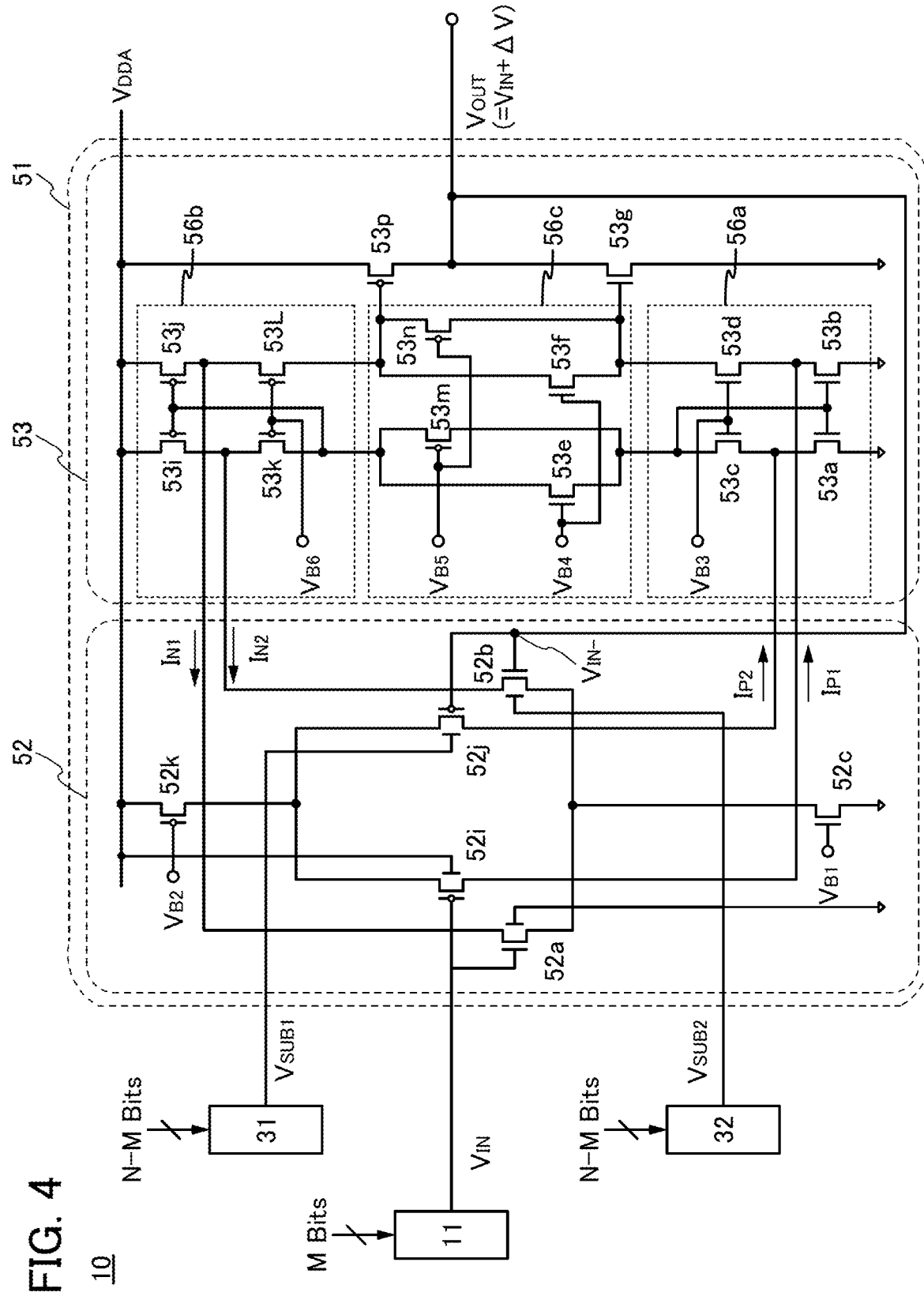
FIG. 4 is a circuit diagram illustrating a configuration example of a semiconductor device.

In the semiconductor device 10 illustrated in FIG. 4, the circuit in FIG. 1C is used as the amplifier circuit 52 and the circuit in FIG. 2A is used as the amplifier circuit 53. As the current source 54, a transistor 52k whose gate is electrically connected to a terminal B2 is used. As the current source 55, a transistor 52c whose gate is electrically connected to a terminal B1 is used. A potential $V_{B1}$ and a potential $V_{B2}$ are supplied to the terminal B1 and the terminal B2, respectively.

The amplifier circuit 51 included in the semiconductor device 10 has a function of outputting a value obtained by adding a voltage $\Delta V$ to the potential $V_{IN}$ as the potential $V_{OUT}$. The voltage $\Delta V$ is a potential which corresponds to the lower-bit signal and is determined as follows.

The potential $V_{SUB1}$ which corresponds to the lower-bit signal is generated from the D/A converter circuit 31. The potential $V_{SUB1}$ is supplied to the second gate or the substrate potential of the transistor 52i. An example where the potential $V_{SUB1}$ is supplied to the second gate of the transistor 52i is described below.

Figure 6:
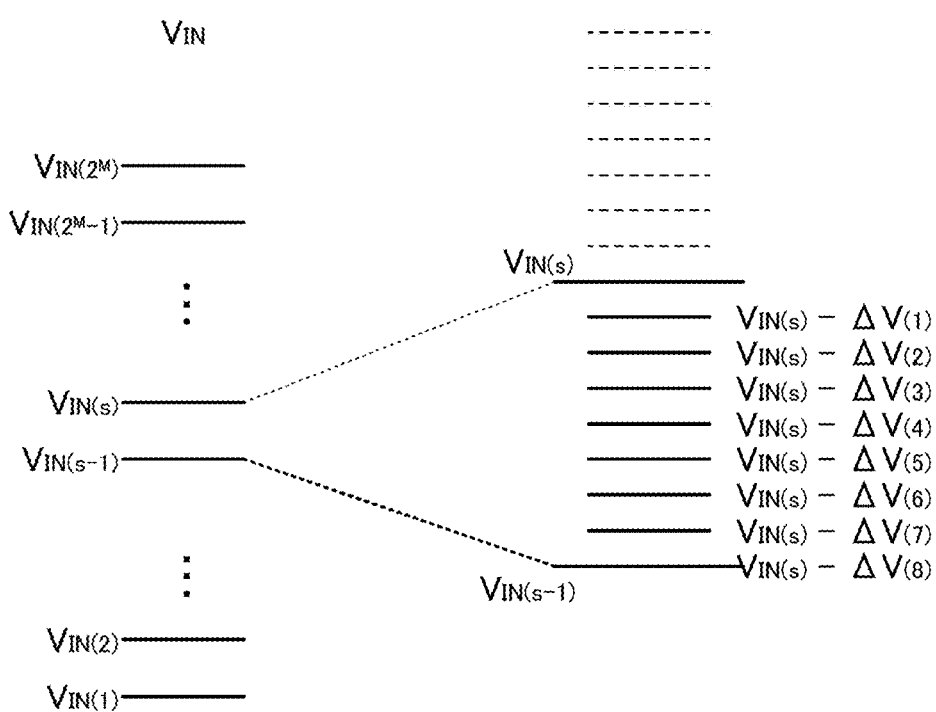
FIG. 6 shows a relation between an input digital signal and an output voltage.

In the semiconductor device 10 in FIG. 4, the potential $V_{IN}$ which corresponds to the upper-bit signal is supplied to the first gate of the transistor 52i. Here, the potential $V_{IN}$ which corresponds to an s-th output signal of the signal controlled by the upper-bit signal is expressed as a potential $V_{IN(s)}$, and the voltage $\Delta V$ which corresponds to a t-th output signal of the signal controlled by the lower-bit signal is expressed as $\Delta V_{(t)}$. Note that s is a natural number greater than or equal to 0 and less than or equal to $2^M$, and t is a natural number greater than or equal to 1 and less than or equal to $2^{(N-M)}$. For example, $\Delta V_{(t)}$ can be expressed as follows: $\Delta V_{(t)} = (t-1) \times \{V_{IN(S)} - V_{IN(s-1)}\}/2^{(N-M)}$. FIG. 6 shows a relation between the potential $V_{IN}$ and the potential $V_{OUT}$ in the case where $2^{(N-M)}=8$, i.e., N−M=3.

The potential $V_{DDA}$ is supplied to the second gate or the substrate potential of the transistor 52i. An example where the potential $V_{DDA}$ is supplied to the second gate of the transistor 52j is described below.

Here, in the amplifier circuit 52 which is a differential amplifier, an output from the amplifier circuit 52 (the output is hereinafter referred to as a potential $V_{IN\_}$) is fed back to the first gate of the transistor 52j which forms a differential pair with the transistor 52i. The potential $V_{SUB1}$ is supplied to the second gate of the transistor 52j. The potential $V_{SUB1}$ is $2^{(N-M)}$ potentials which are greater than or equal to ($V_{DDA}-\alpha$) and less than or equal to $V_{DDA}$. The potential $V_{SUB1}$ which corresponds to a t-th bit signal of the lower-bit signal is expressed as a potential $V_{SUB1(t)}$. The potential $V_{SUB1(t)}$ can be expressed as follows: $V_{SUB1(t)}=V_{DDA}-[(t-1)\times\alpha/\{2^{(N-M)}\}]$.

Here, in the semiconductor device 10 in FIG. 4, current flowing through the transistor 52i and current flowing through the transistor 52j are assumed to be $I_{P1}$ and $I_{P2}$, respectively. The current $I_{P2}$ flowing through the transistor 52j is changed depending on the potential $V_{SUB1}$ input to the second gate thereof. In accordance with the change of the current $I_{P1}$ input to the amplifier circuit 53, the amplification degree of the amplifier circuit 51 is changed. The value of $\Delta V$ becomes larger as a difference between the potential $V_{DDA}$ and the potential $V_{SUB1}$ gets broader. In the case where the channel length and the channel width of the transistor 52i are substantially the same as those of the transistor 52j, the $\Delta V$ becomes negative when the potential $V_{SUB1}$ is lower than the potential $V_{DDA}$.

The potential $V_{SUB2}$ which corresponds to the lower-bit signal is generated from the D/A converter circuit 32. The potential $V_{SUB2}$ is supplied to the second gate or the substrate potential of the transistor 52b. An example where the potential $V_{SUB2}$ is supplied to the second gate of the transistor 52a is described below.

The potential $V_{IN}$ which corresponds to the upper-bit signal is supplied to the first gate of the transistor 52a. The potential $V_{GND}$ is supplied to the second gate or the substrate potential of the transistor 52a. An example where the potential $V_{GND}$ is supplied to the second gate of the transistor 52a is described below.

Here, in the amplifier circuit 52 which is a differential amplifier, an output from the amplifier circuit 53 (the output is hereinafter referred to as a potential $V_{IN\_}$) is fed back to the first gate of the transistor 52b which forms a differential pair with the transistor 52a. The potential $V_{SUB2}$ is supplied to the second gate of the transistor 52b. The potential $V_{SUB2}$ is $2^{(N-M)}$ potentials which are greater than or equal to the potential $V_{GND}$ and less than or equal to $\beta$. The potential $V_{SUB2}$ which corresponds to the t-th bit signal of the lower-bit signal is expressed as a potential $V_{SUB2(t)}$. The potential $V_{SUB2(t)}$ can be expressed as follows: $V_{SUB2(t)}=V_{GND}+[(t-1)\times\beta/\{2^{(N-M)}\}]$.

In the semiconductor device 10 in FIG. 4, the amplification degree of the amplifier circuit 51 is determined depending on a difference between the potential $V_{GND}$ and the potential $V_{SUB2}$. The absolute value of $\Delta V$ becomes larger as the difference between the potential $V_{GND}$ and the potential $V_{SUB2}$ gets broader.

<Example 2 of Semiconductor Device>

Figure 5:
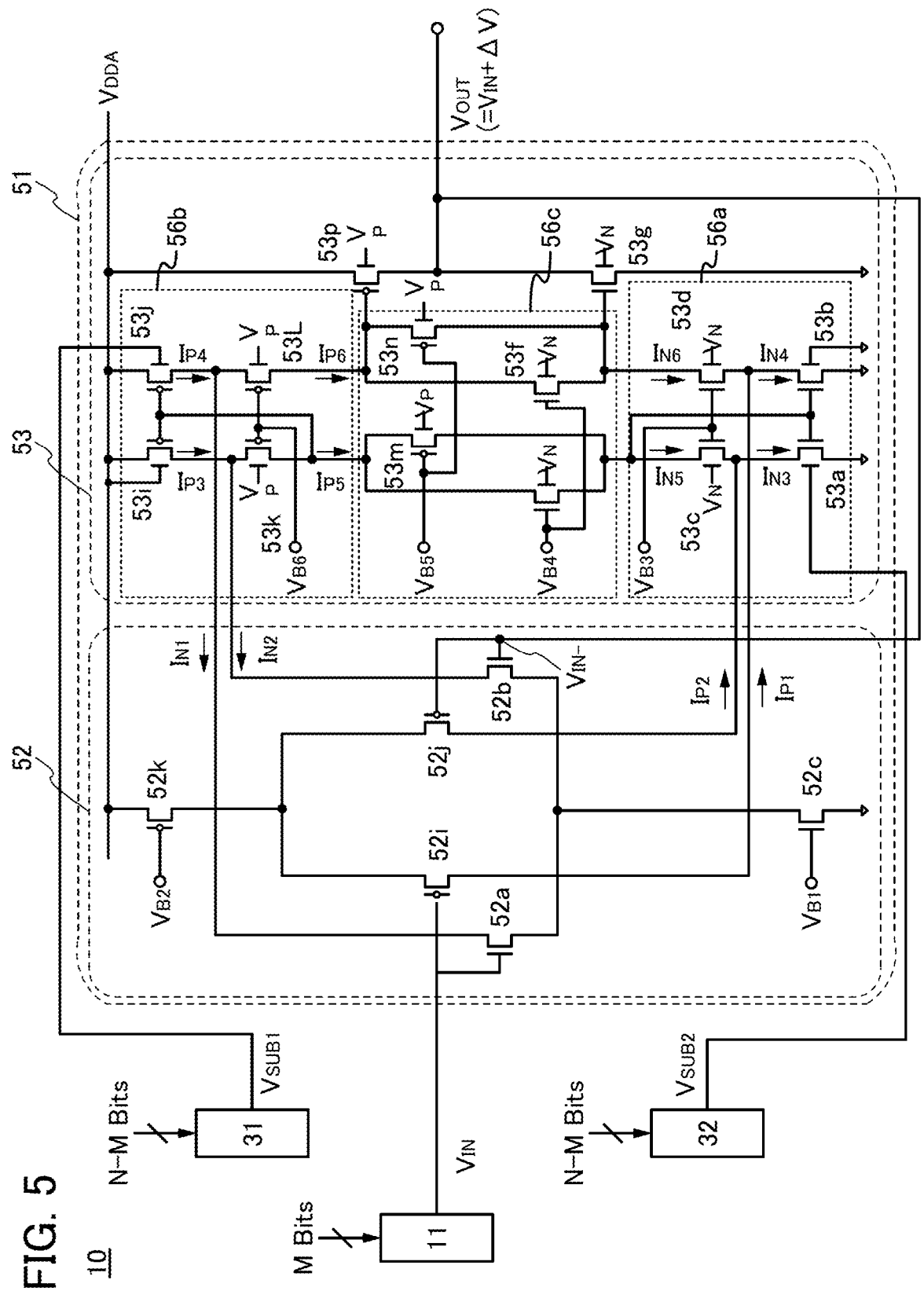
FIG. 5 is a circuit diagram illustrating a configuration example of a semiconductor device.

FIG. 5 illustrates an example of the semiconductor device 10 which is different from that in FIG. 4. In the semiconductor device 10 illustrated in FIG. 5, the circuit in FIG. 1B is used as the amplifier circuit 52 and the circuit in FIG. 3B is used as the amplifier circuit 53.

A difference between FIG. 4 and FIG. 5 is described. In FIG. 4, the potential $V_{SUB1}$ is supplied to the second gate or the substrate potential of the transistor 52j and the potential $V_{SUB2}$ is supplied to the second gate or the substrate potential of the transistor 52b, whereas, in FIG. 5, the potential $V_{SUB1}$ is supplied to the second gate or the substrate potential of the transistor 53j and the potential $V_{SUB2}$ is supplied to the second gate or the substrate potential of the transistor 53a.

A pair of the transistor 53j and the transistor 53i in the amplifier circuit 53 in FIG. 5 is described. The first gate of the transistor 53i and the first gate of the transistor 53j are electrically connected to each other. The potential $V_{SUB1}$ is input to the second gate or the substrate potential of the transistor 53j. An example where the potential $V_{SUB1}$ is input to the second gate of the transistor 53j is described below. The potential $V_{DDA}$ is input to the second gate or the substrate potential of the transistor 53i. An example where the potential $V_{DDA}$ is input to the second gate of the transistor 53i is described below.

A pair of the transistor 53a and the transistor 53b in the amplifier circuit 53 in FIG. 5 is described. The first gate of the transistor 53a and the first gate of the transistor 53b are electrically connected to each other. The potential $V_{SUB2}$ is input to the second gate or the substrate potential of the transistor 53a. An example where the potential $V_{SUB2}$ is input to the second gate of the transistor 53a is described below. The potential $V_{GND}$ is input to the second gate or the substrate potential of the transistor 53b. An example where the potential $V_{GND}$ is input to the second gate of the transistor 53b is described below.

In the semiconductor device 10 in FIG. 5, the amplification degree of the amplifier circuit 51 is changed in accordance with the difference between the potential $V_{DDA}$ and the potential $V_{SUB1}$ and the difference between the potential $V_{GND}$ and the potential $V_{SUB2}$.

Current flowing through the transistor 53i, current flowing through the transistor 53j, current flowing through the transistor 53k, and current flowing through the transistor 53L are assumed to be $I_{P3}$, $I_{P4}$, $I_{P5}$, and $I_{P6}$, respectively. The current $I_{P4}$ is changed depending on the current $I_{P3}$ and the potential $V_{SUB1}$. Current flowing through the transistor 53a, current flowing through the transistor 53b, current flowing through the transistor 53c, and current flowing through the transistor 53d are assumed to be $I_{N3}$, $I_{N4}$, $I_{N5}$, and $I_{N6}$, respectively. The current $I_{N4}$ is changed depending on the current $I_{N3}$ and the potential $V_{SUB2}$.

The potential supplied to the first gate of the transistor 53g is changed depending on the current $I_{N4}$. In addition, the potential supplied to the first gate of the transistor 53p is changed depending on the current $I_{P4}$.

<D/A Converter Circuit>

The D/A converter circuit 11, the D/A converter circuit 31, and the D/A converter circuit 32 are each a circuit for generating an analog value from a digital signal. For example, the D/A converter circuit 11, the D/A converter circuit 31, and the D/A converter circuit 32 can each generate a grayscale voltage from a digital signal.

Figure 7:
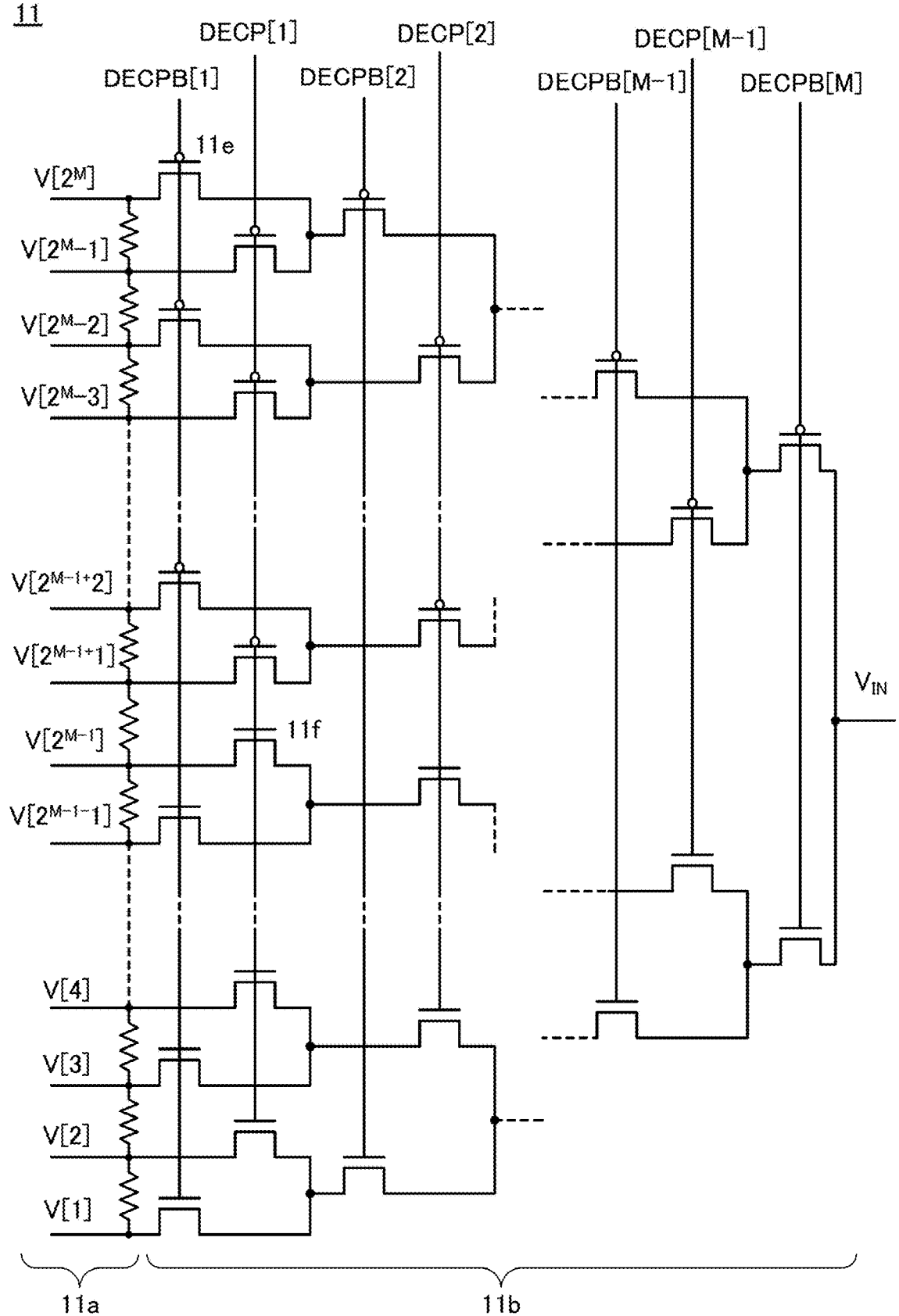
FIG. 7 is a circuit diagram illustrating a configuration example of a D/A converter circuit.

An example of the circuit that can be used for the D/A converter circuit 11 is described with reference to FIG. 7. The D/A converter circuit 11 in FIG. 7 includes a voltage generation circuit 11a and a pass transistor logic (PTL) 11b.

The voltage generation circuit 11a can be configured by connecting a plurality of resistors in series, for example. The voltage generation circuit 11a generates V[1] to V[$2^M$] which are potentials of $2^M$ gray level, where the minimum value ($V_{GND}+0.5$)[V] is V[1] and the maximum value ($V_{DDR}-0.5$)[V] is V[$2^M$].

The PTL 11b includes a plurality of p-channel transistors 11e and a plurality of n-channel transistors 11f.

The transistors 11e and 11f are pass transistors and function as switches. Each of the switches is switched on or off in accordance with the upper-bit signal. The PTL 11b has a function of selecting a desired voltage among the voltages V[1] to V[$2^M$] to be output as the potential $V_{IN}$ in FIG. 4 and FIG. 5 by switching of the switches. As described above, the potential $V_{IN}$ is converted into a voltage based on the lower-bit signal in a circuit in a later stage.

The D/A converter circuit 11 is an R-DAC including resistors provided in series. Although an R-DAC can perform D/A conversion at high speed, an increase in the number of bits of a digital signal causes an increase in an area occupied by the circuit. However, in the semiconductor device 10 of one embodiment of the present invention, only the upper-bit signal of a digital signal is allocated to the R-DAC, so that the area occupied by the circuit can be reduced.

Examples of circuits that can be used for the D/A converter circuit 31 and the D/A converter circuit 32 are described with reference to FIG. 8 and FIG. 9, respectively.

Figure 8:
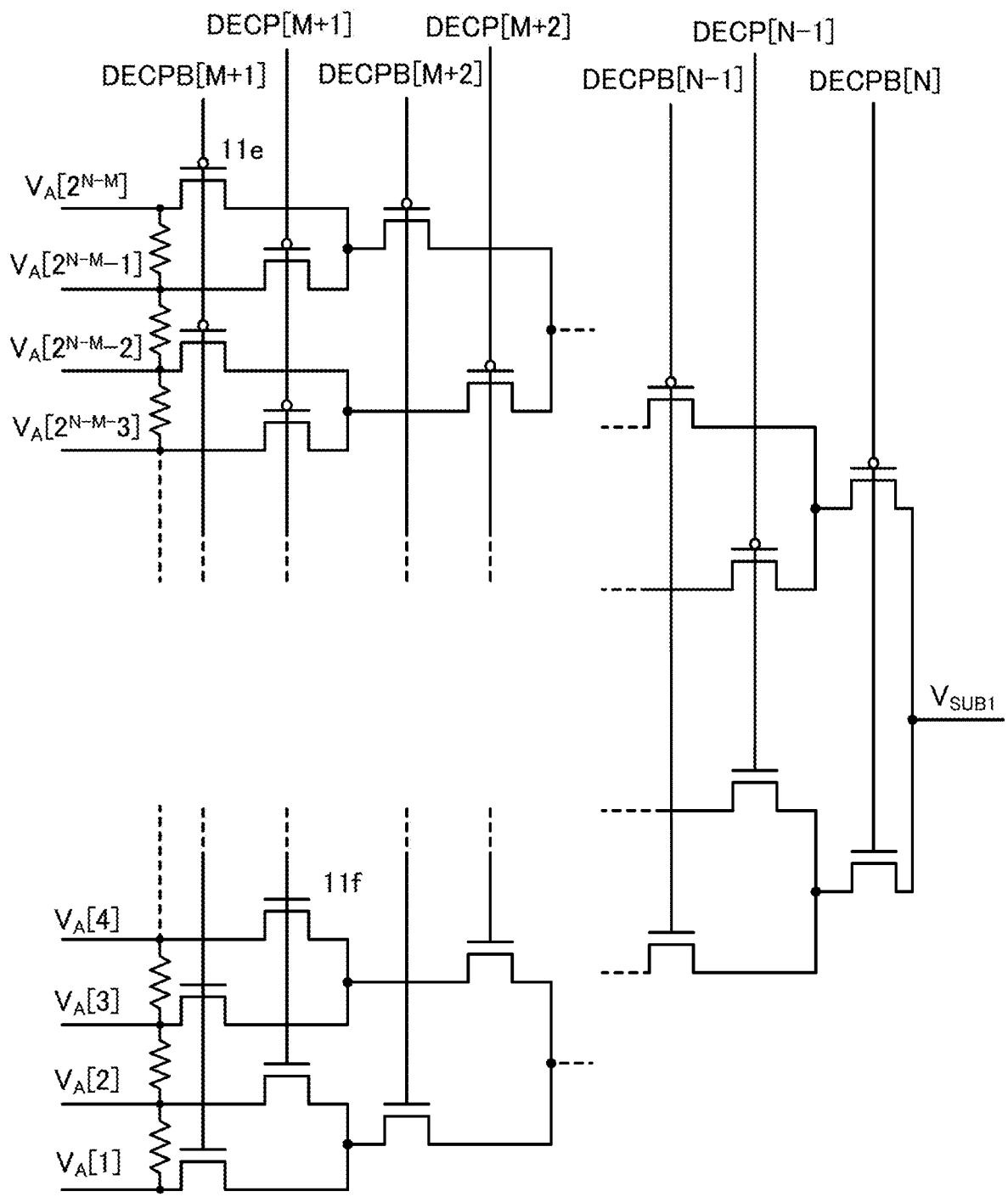
FIG. 8 is a circuit diagram illustrating a configuration example of a D/A converter circuit.
Figure 9:
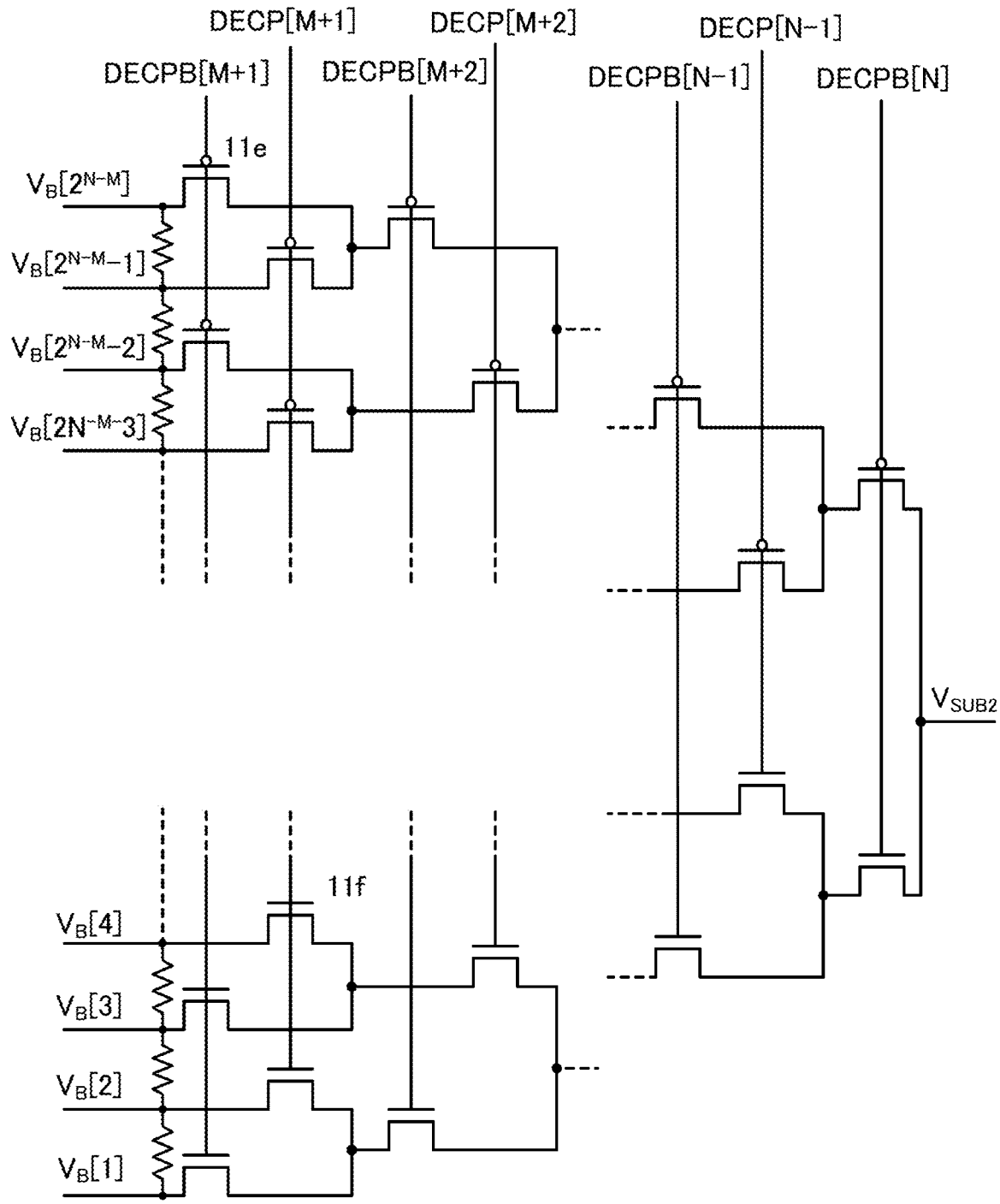
FIG. 9 is a circuit diagram illustrating a configuration example of a D/A converter circuit.

The D/A converter circuit 31 and the D/A converter circuit 32 illustrated in FIG. 8 and FIG. 9 have functions similar to the function of the D/A converter circuit 11. The D/A converter circuit 31 generates $V_A[1]$ to $V_A[2^{(N-M)}]$ which are potentials of $2^{(N-M)}$ gray level, where the minimum value $(V_{DDA}-\alpha)$[V] is $V_A[1]$ and the maximum value $V_{DDA}$[V] is $V_A[2^{(N-M)}]$. The D/A converter circuit 32 generates $V_B[1]$ to $V_B[2^{(N-M)}]$ which are potentials of $2^{(N-M)}$ gray level, where the minimum value $V_{GND}$[V] is $V_B[1]$ and the maximum value $\beta$[V] is $V_B[2^{(N-M)}]$.

Embodiment 2

In this embodiment, an example of the structure of a semiconductor device of one embodiment of the present invention will be described.

<Example of Cross-Sectional Structure of Semiconductor Device>

Figure 10:
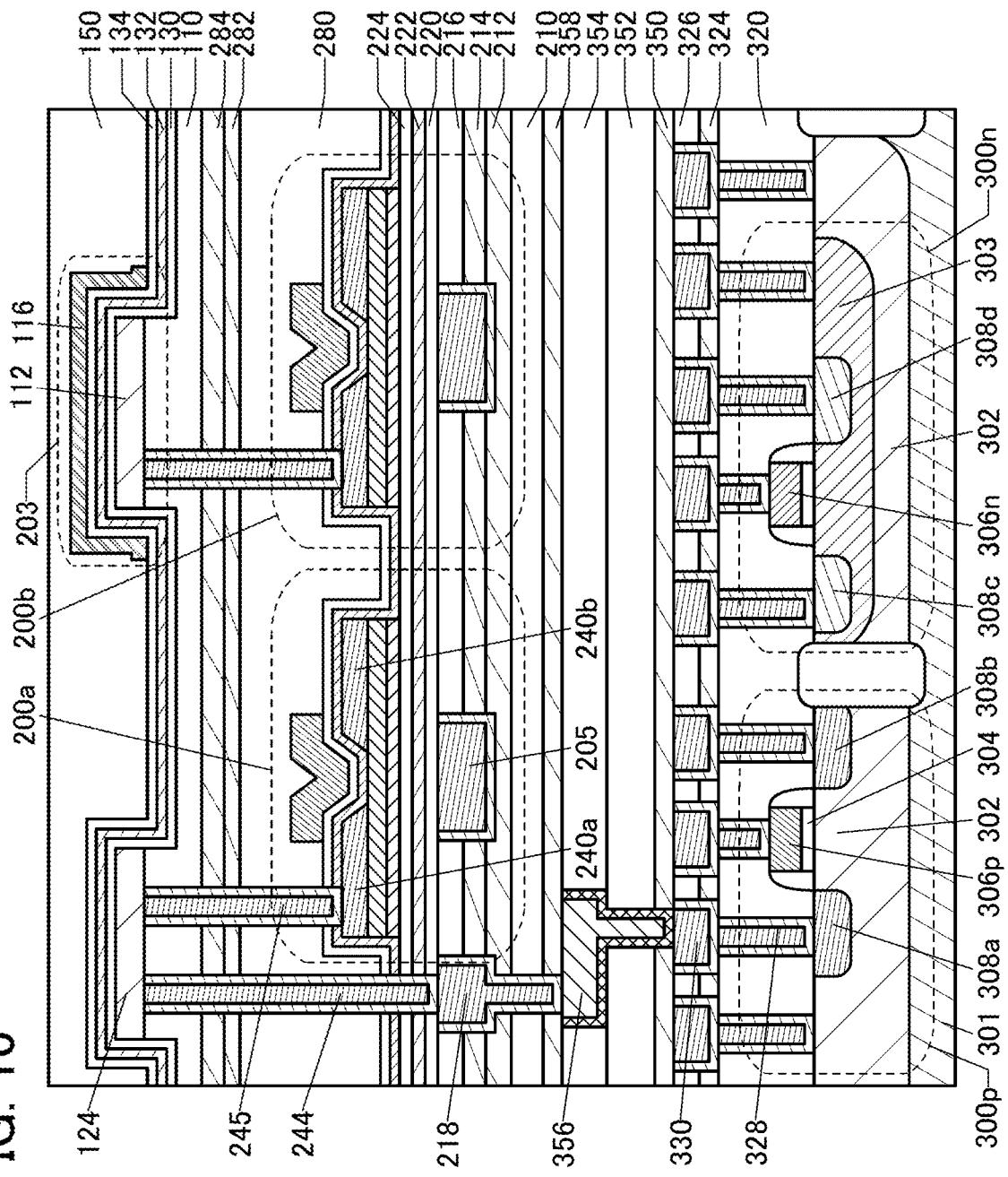
FIG. 10 illustrates a cross section of a semiconductor device.

FIG. 10 illustrates an example of the cross-sectional structure of a semiconductor device of one embodiment of the present invention. The semiconductor device of one embodiment of the present invention preferably includes a signal line driver circuit 100 or part of the signal line driver circuit 100, which will be described later, for example.

The semiconductor device illustrated in FIG. 10 includes a transistor 300n, a transistor 300p, a transistor 200a, a transistor 200b, a capacitor 203, and the like. The transistor 200a and the transistor 200b are provided over the transistor 300n and the transistor 300p, and the capacitor 203 is provided over the transistor 200a and the transistor 200b.

The transistor 200a and the transistor 200b preferably include an oxide semiconductor. A transistor 200 which will be described later can be used as the transistor 200a and the transistor 200b.

The transistor 300p is a p-channel transistor. The transistor 300n, the transistor 200a, and the transistor 200b are n-channel transistors, for example. In the D/A converter circuit 11 in FIG. 7, the transistor 300p can be used as the p-channel transistor, and the transistor 300n, the transistor 200a, and the like can be used as the n-channel transistor. FIG. 10 illustrates an example where the transistor 200a is used as an n-channel transistor and the transistor 300p is used as a p-channel transistor in the case where one of a source and a drain of a p-channel transistor is electrically connected to one of a source and a drain of an n-channel transistor.

The transistor 300p is provided over a substrate 301 and includes a conductor 306p, an insulator 304, a semiconductor region 302 that is part of the substrate 301, and low-resistance regions 308a and 308b functioning as a source region and a drain region.

The transistor 300n is provided over the substrate 301 and includes the conductor 306p, the insulator 304, the semiconductor region 302 that is part of the substrate 301, a semiconductor region 303 that is part of the substrate 301, and low-resistance regions 308c and 308d functioning as a source region and a drain region.

In the example of FIG. 10, transistors such as the transistor 300n and the transistor 300p are separated from each other by an element separation layer.

It is preferable that the substrate 301, the semiconductor region 302, and the semiconductor region 303 have a p-type polarity, an n-type polarity, and a p-type polarity, respectively. In the transistor 300p in FIG. 10, the low-resistance regions 308a and 308b are formed to be embedded in the semiconductor region 302. In the transistor 300n in FIG. 10, the low-resistance regions 308c and 308d are formed to be embedded in the semiconductor region 303. The semiconductor region 303 is formed to be embedded in the semiconductor region 302.

Potentials are supplied to the low-resistance region 308a and 308b, the low-resistance region 308c and 308d, a conductor 306n, the conductor 306p, the semiconductor region 302, and the semiconductor region 303 through conductors such as conductors 328. In the transistor 300p, a substrate potential of the transistor 300p can be controlled through the conductors connected to the semiconductor region 302. In the transistor 300n, a substrate potential of the transistor 300n can be controlled through the conductors connected to the semiconductor region 303.

Here, when the substrate potential of the transistor 300p is controlled, the following two cases can be considered: the case where a potential of the substrate 301 is controlled and the case where a potential of the semiconductor region 302 is controlled. In the case where the potential of the substrate 301 is controlled, the potential of the substrate 301 is the same as an adjacent transistor; therefore, characteristics of the transistor 300p and another transistor adjacent to the transistor 300p are changed in accordance with a change of the potential of the substrate 301. In contrast, the semiconductor region 302 is almost electrically isolated from another transistor through an element isolation region and the substrate 301. Thus, in the case where the potential of the semiconductor region 302 is controlled, mainly the characteristics of the transistor 300p can be changed, and an influence on an adjacent another transistor can be suppressed.

Similarly, when the substrate potential of the transistor 300n is controlled, the case where the potentials of the substrate 301, the semiconductor region 302, and the semiconductor region 303 are controlled is considered. It is preferable to control the potential of the semiconductor region 303 to suppress an influence on the adjacent other transistor.

Thus, in the case where the transistor 300p is used as the transistor 52j in FIG. 1C, the transistor 53j in FIG. 2B, and the like, for example, it is preferable that the terminal SUB1 be electrically connected to the semiconductor region 302.

In addition, in the case where the transistor 300n is used as the transistor 52b in FIG. 1C, the transistor 53a in FIG. 2B, and the like, for example, it is preferable that the terminal SUB2 be electrically connected to the semiconductor region 303.

Each region of the semiconductor region 302 and the semiconductor region 303 where a channel is formed, a region in the vicinity thereof, the low-resistance regions 308a and 308b functioning as a source region and a drain region, the low-resistance regions 308c and 308d functioning as a source region and a drain region, and the like preferably contains a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300n and the transistor 300p each may be a high-electron-mobility transistor (HEMT) with GaAs, GaAlAs, or the like.

The low-resistance regions 308a and 308b and the low-resistance regions 308c and 308d contain an element which imparts conductivity in addition to a semiconductor material used for the semiconductor region 302. Arsenic or phosphorus can be used as an element which imparts n-type conductivity, and boron or the like can be used as an element which imparts p-type conductivity.

The conductors functioning as gates can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a stack of metal materials such as tungsten and aluminum as the conductor. In particular, tungsten is preferable in terms of heat resistance.

Note that the transistor 300p and the transistor 300n in FIG. 10 are just an example and are not limited to the structure shown therein; an appropriate transistor may be used in accordance with a circuit structure or a driving method.

Figure 11A:
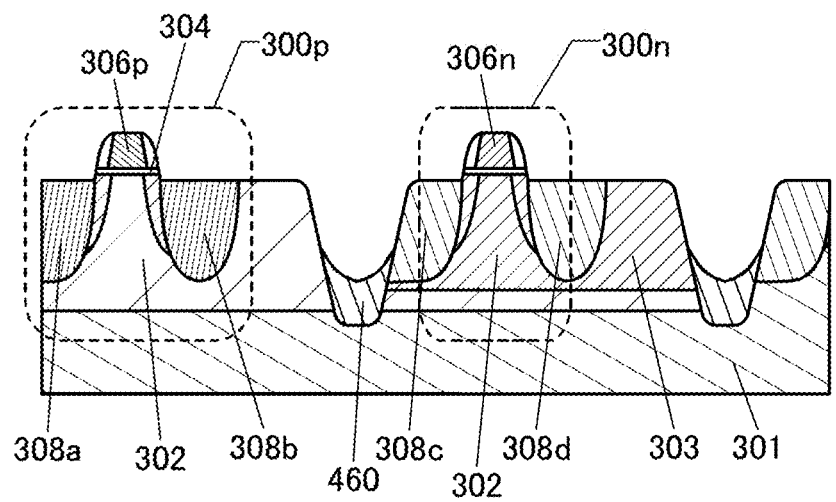
FIGS. 11A and 11B illustrate cross sections of transistors.

For example, as illustrated in FIG. 11A, the transistor 300p and the transistor 300n may be formed over projected portions provided over the substrate 301. FIG. 11A illustrates an example where the transistor 300p and the transistor 300n are isolated by providing an element isolation region 460 by a trench isolation method (shallow trench isolation (STI) method) or the like. In addition, the semiconductor region 302 and the like and the low-resistance region 308a and the like are provided in the projected portions of the substrate 301 which are positioned in a region other than a trench.

Figure 11B:
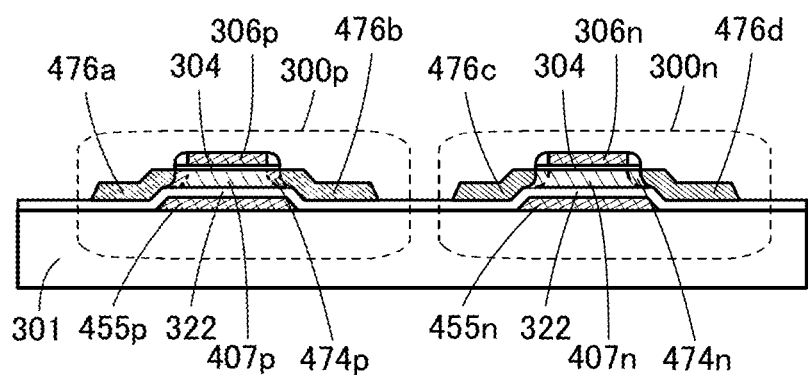

As illustrated in FIG. 11B, the transistor 300p and the transistor 300n may be formed over a silicon on insulator (SOI) substrate or an insulating substrate. In FIG. 11B, the transistor 300p and the transistor 300n include a conductor 455p and a conductor 455n functioning as second gates, respectively. An insulator 322 is provided over the conductor 455p and the conductor 455n. The insulator 322 functions as a second gate insulator.

In the transistor 300p, a channel formation region 407p and low-resistance regions 476a and 476b are provided over the insulator 322. In addition, a region 474p may be provided between the low-resistance region 476a and the channel formation region 407p and between the low-resistance region 476b and the channel formation region 407p. The region 474p may be referred to as a lightly doped drain region. In the transistor 300n, a channel formation region 407n and low-resistance regions 476c and 476d are provided over the insulator 322. In addition, a region 474n may be provided between the low-resistance region 476c and the channel formation region 407n and between the low-resistance region 476d and the channel formation region 407p. The region 474n may be referred to as a lightly doped drain region.

In the transistor 300p, an insulator 304 functioning as a gate insulator and a conductor 306p over the insulator 304 are provided over the channel formation region 407p. The conductor 306p functions as a first gate of the transistor 300p. In the transistor 300n, the insulator 304 functioning as a gate insulator and a conductor 306n over the insulator 304 are provided over the channel formation region 407n. The conductor 306n functions as a first gate of the transistor 300n.

An insulator 320, an insulator 324, and an insulator 326 are stacked sequentially and cover the transistor 300p and the transistor 300n.

The insulator 320, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 324 is preferably formed using, for example, a film having a barrier property that prevents hydrogen or impurities from diffusing from the substrate 301, the transistor 300p, or the like into a region where the transistor 200a is formed. As an example of the film having a barrier property with respect to hydrogen, silicon nitride formed by a CVD method can be given. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in TDS analysis in the range of 50° C. to 500° C., for example.

Note that the dielectric constant of the insulator 326 is preferably lower than that of the insulator 324. For example, the relative dielectric constant of the insulator 326 is preferably lower than 4, further preferably lower than 3. For example, the relative dielectric constant of the insulator 324 is preferably 0.7 times or less that of the insulator 326, further preferably 0.6 times or less that of the insulator 326. In the case where a material with a low dielectric constant is used as an interlayer film, the parasitic capacitance between wirings can be reduced.

The conductor 328, a conductor 330, and the like that are electrically connected to the transistor 200a and the like are embedded in the insulator 320, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

Furthermore, the conductor 328 and the conductor 330 preferably include a conductor having a barrier property with respect to hydrogen. The conductor having a barrier property with respect to hydrogen is formed particularly in an opening of the insulator 324 having a barrier property with respect to hydrogen. In such a structure, the transistor 300p, the transistor 300n, the transistor 200a, and the transistor 200b are separated by a layer having a barrier property, so that diffusion of hydrogen from the transistor 300p and the transistor 300n to the transistor 200a and the transistor 200b can be prevented.

Note that as the conductor having a barrier property with respect to hydrogen, tantalum nitride is used, for example. Tantalum nitride and tungsten, which has high conductivity, may be stacked. In this case, a tantalum nitride layer having a barrier property with respect to hydrogen is preferably in contact with the insulator 324 having a barrier property with respect to hydrogen.

A wiring layer may be provided over the insulator 326 and the conductor 330. For example, in FIG. 10, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to that used for forming the conductor 328 and the conductor 330.

In addition, the conductor 356 is preferably formed using a low-resistance conductive material such as aluminum or copper. In the case where copper is used for the conductor 356, a conductor which inhibits diffusion of copper is preferably stacked in the conductor 356. Examples of the conductor which inhibits diffusion of copper include tantalum, an alloy containing tantalum such as tantalum nitride, ruthenium, and alloy containing ruthenium.

Furthermore, the insulator 350 is preferably formed using an insulator that inhibits diffusion of copper or an insulator having a barrier property with respect to oxygen and hydrogen. As an example of a film which inhibits diffusion of copper, silicon nitride can be used. Thus, the material similar to that used for the insulator 324 can be used.

An insulator 358, an insulator 210, an insulator 212, and an insulator 214 are stacked sequentially over the insulator 354. A material which inhibits diffusion of copper or which has a barrier property with respect to oxygen or hydrogen is preferably used for one or all of the insulator 358, insulator 210, the insulator 212, and the insulator 214.

The insulator 358 and the insulator 212 can be formed using a material similar to that used for forming the insulator 324, for example. The insulator 210 can be formed using a material similar to that used for the insulator 320.

As the insulator 214, a metal oxide such as aluminum oxide, hafnium oxide, or tantalum oxide is preferably used, for example. In particular, aluminum oxide is preferable because of having an excellent blocking effect that prevents permeation of oxygen and impurities such as hydrogen and moisture which cause a change in electrical characteristics of the transistor.

An insulator 216 is provided over the insulator 214. The insulator 216 can be formed using a material similar to that used for forming the insulator 320.

A conductor 218 and a conductor 205 that forms the transistor 200a and the like are embedded in the insulator 358, the insulator 210, the insulator 212, the insulator 214, and the insulator 216, for example. The conductor 218 can be formed using a material similar to that used for forming the conductor 328 and the conductor 330.

In particular, the conductor 218 in a region in contact with the insulator 358, the insulator 212, and the insulator 214 is preferably a conductor that inhibits diffusion of copper or that has a barrier property with respect to oxygen, hydrogen, and water.

The transistor 200a, the transistor 200b, and an insulator 280 are provided over the insulator 214. Note that the transistor 200a and the transistor 200b in FIG. 10 are just an example and are not limited to the structure shown therein; an appropriate transistor may be used in accordance with a circuit structure or a driving method.

An insulator 282, an insulator 284, and an insulator 110 are sequentially stacked over the insulator 280. A conductor 244 and the like are embedded in an insulator 220, an insulator 222, an insulator 224, the insulator 280, the insulator 282, the insulator 284, and the insulator 110. Over conductors such as a conductor 240a and a conductor 240b of the transistor 200a, a conductor 245 and the like which are connected to an upper conductor is provided. Note that the conductor 244 functions as a plug or a wiring that is electrically connected to the capacitor 203, the transistor 200a, the transistor 300p, and the like. The conductor 244 can be formed using a material similar to that used for forming the conductor 328 and the conductor 330.

Here, in FIG. 10, the low-resistance region 308a of the transistor 300p is electrically connected to one of a source and a drain of the transistor 200a through the conductor 328, the conductor 218, the conductor 245, and the like.

A material having a barrier property with respect to oxygen or hydrogen is preferably used for one or both of the insulator 282 and the insulator 284. Thus, the insulator 282 can be formed using a material similar to that used for forming the insulator 214. The insulator 284 can be formed using a material similar to that used for forming the insulator 212. As the insulator 282, for example, a metal oxide such as aluminum oxide, hafnium oxide, or tantalum oxide is preferably used. In particular, aluminum oxide is preferably used.

In addition, the insulator 284 is preferably formed using a film having a barrier property that prevents hydrogen or impurities from diffusing from a region where the capacitor 203 is formed into a region where the transistor 200a is formed. Therefore, the insulator 284 can be formed using a material similar to that used for forming the insulator 324.

Therefore, a structure can be obtained in which the transistor 200a and the insulator 280 including the excess-oxygen region are positioned between a stacked-layer structure of the insulator 210, the insulator 212, and the insulator 214 and a stacked-layer structure of the insulator 282 and the insulator 284. The insulator 210, the insulator 212, the insulator 214, the insulator 282, and the insulator 284 have a barrier property that prevents diffusion of oxygen or impurities such as hydrogen and water.

Embodiment 3

In this embodiment, a display panel including the semiconductor device 10 described in Embodiment 1 will be described.

<Block Diagram of Display Panel>

A display panel in a block diagram of FIG. 12 includes the signal line driver circuit 100, a scan line driver circuit 101, and a pixel portion 102. In the pixel portion 102, pixels 103 are arranged in a matrix. The pixel portion 102 may be referred to as a display portion.

The signal line driver circuit 100 has a function of outputting an image signal that has been converted into an analog signal to a plurality of signal lines SL.

A circuit included in the signal line driver circuit 100 may be an IC or may be formed using the same transistor as that in the pixel 103 in the pixel portion 102. Note that a plurality of signal line driver circuits 100 may be provided to control the signal lines SL separately.

The scan line driver circuit 101 has a function of outputting scan signals to scan lines GL. The scan line driver circuit 101 includes a shift register and a buffer, for example. The scan line driver circuit 101 has a function of receiving a gate start pulse, a gate clock signal, and the like and outputting a pulse signal.

A circuit included in the scan line driver circuit 101 may be an IC or may be formed using the same transistor as that in the pixel 103 in the pixel portion 102. Note that a plurality of scan line driver circuits 101 may be provided to control the scan lines GL separately.

In the pixel portion 102, the scan lines GL and the signal lines SL are provided to intersect at substantially right angles. The pixel 103 is provided at the intersection of the scan line GL and the signal line SL. For color display, the pixels 103 corresponding to the respective colors of red, green, and blue (RGB) are arranged in sequence in the pixel portion 102. Note that the pixels of RGB can be arranged in a stripe pattern, a mosaic pattern, a delta pattern, or the like as appropriate. Without limitation to RGB, white, yellow, or the like may be added to RGB for color display.

<Signal Line Driver Circuit 100>

Figure 13:
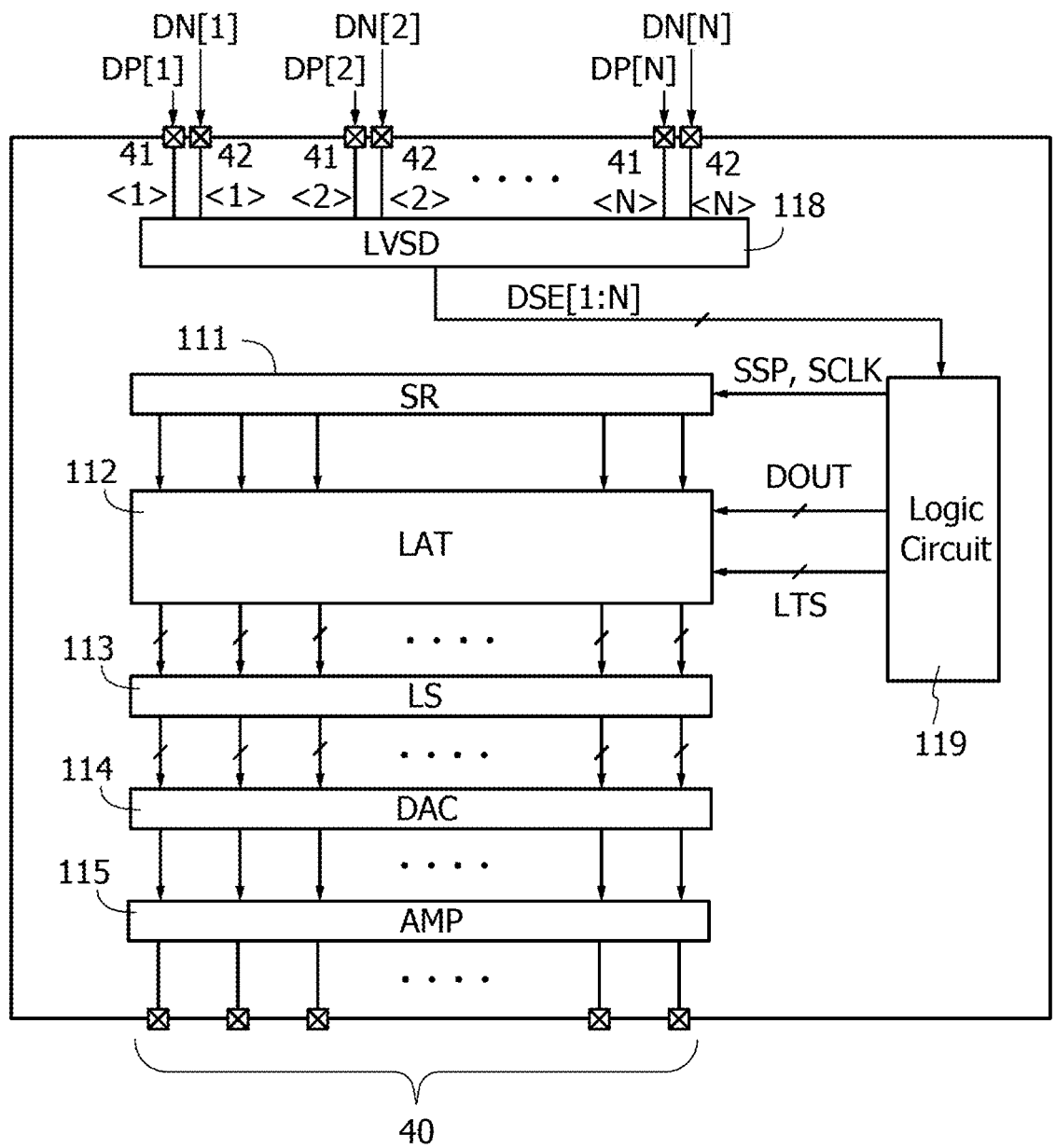
FIG. 13 is a circuit block diagram illustrating a configuration example of a signal line driver circuit.

Next, the signal line driver circuit 100 is described in detail with reference to FIG. 13. A circuit block diagram in FIG. 13 shows a configuration example of the signal line driver circuit 100 capable of processing an N-bit image signal.

The signal line driver circuit 100 includes terminals 40, terminals 41, terminals 42, a low-voltage differential signaling (LVDS) receiver 118, a logic circuit 119, a shift register 111, a latch circuit 112, a level shifter 113, a D/A converter circuit 114, and an amplifier circuit 115.

The terminals 40 are output terminals for an image signal that has been converted into an analog signal, and are electrically connected to the signal lines SL. The terminals 41 and 42 are input terminals for differential signals. For example, a signal whose logic is inverted with respect to that of an input signal of the terminal 41<1> is input to the terminal 42<1>. For example, image signals DP[1] to DP[N] are input to the terminals 41<1> to 41<N>, respectively, and image signals DN[1] to DN[N] are input to the terminals 42<1> to 42<N>, respectively.

To the terminals 41 and 42, not only the image signals DP[1:N] and DN[1:N] but also command signals are input. The signal line driver circuit 100 is provided with, in addition to the terminals 40, 41, and 42, an input terminal for a power supply voltage, input terminals for various signals, output terminals for various signals, and the like.

The LVDS receiver 118 has a function of converting input differential signals into a single-ended signal. The LVDS receiver 118 converts the image signals DP[1:N] and DN[1:N] into a single-ended image signal DSE.

The logic circuit 119 has a function of controlling the circuits included in the signal line driver circuit 100 in accordance with a command signal or the like input from the outside. Specifically, the logic circuit 119 generates signals SSP, SCLK, LTS, and the like. The signals SSP and SCLK are control signals for the shift register 111. The signal LTS is a control signal for the latch circuit 112.

The logic circuit 119 has a function of converting a serial image signal DSE into a parallel image signal DOUT (serial-to-parallel conversion function).

The shift register 111 includes plural flip-flop (FF) circuits. The signal SSP (start pulse signal) is input to the first FF circuit, whereby a sampling signal is output from each FF circuit at predetermined timing. The timing at which each FF circuit outputs the sampling signal is controlled by the signal SCLK (clock signal).

The latch circuit 112 samples the image signal DOUT in accordance with the sampling signal and stores the image signal DOUT. The timing at which the latch circuit 112 outputs the stored image signal is controlled by the signal LTS.

The level shifter 113 has a function of boosting the image signal output from the latch circuit 112 and outputting it.

The D/A converter circuit 114 has the structure of the semiconductor device described in Embodiment 1. With such a structure, reduction in a circuit area and improvement in display quality can be achieved.

The amplifier circuit 115 has a function of amplifying the analog image signal output from the D/A converter circuit 114 and outputting it to the signal lines SL. Note that the amplifier circuit 115 is referred to as an output circuit or a buffer circuit in some cases.

Next, a configuration example of a circuit that can be used for the pixel 103 is described.

<Example of Pixel Circuit for Display Panel Including Light-Emitting Element>

Figure 14A:
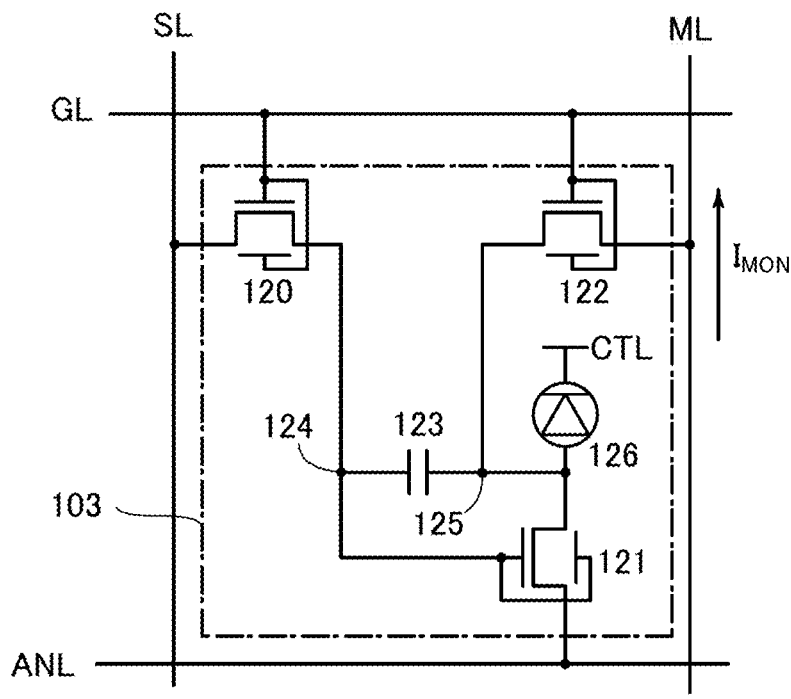
FIG. 14A is a circuit diagram illustrating a configuration example of a pixel.
Figure 14B:
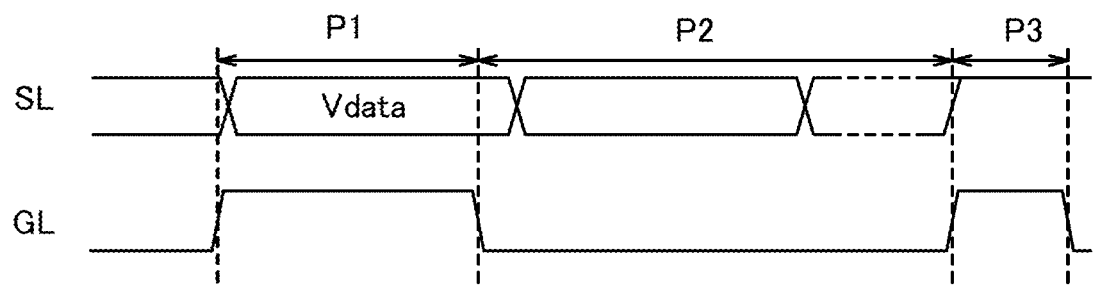
FIG. 14B is a timing chart illustrating an operation example of the pixel.

FIG. 14A illustrates an example of the pixel 103 that can be used for a panel including a light-emitting element. FIG. 14B is a timing chart showing an operation example of the pixel 103 illustrated in FIG. 14A.

The pixel 103 is electrically connected to the scan line GL, the signal line SL, a wiring ML, a wiring CTL, and a wiring ANL. The pixel 103 includes a transistor 120, a transistor 121, a transistor 122, a capacitor 123, and a light-emitting element 126.

The light-emitting element 126 includes a pair of terminals (an anode and a cathode). As the light-emitting element 126, an element which can control the luminance with current or voltage can be used. As the light-emitting element 126, a light-emitting element utilizing electroluminescence (also referred to as an EL element) can be used. An EL element includes a layer containing a light-emitting compound (also referred to as an EL layer) between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer and a light-emitting substance contained in the EL layer emits light. EL elements are classified according to whether a light-emitting material is an organic compound or an inorganic compound. In general, the former is referred to as an organic EL element (organic light-emitting diode (OLED)), and the latter is referred to as an inorganic EL element.

Although the transistors 120 to 122 are n-channel transistors in FIG. 14A, some or all of the transistors 120 to 122 may be p-channel transistors. The transistors 120 to 122 each include a back gate electrically connected to a gate. With such a device structure, the current drive capability of the transistors 120 to 122 can be improved. Some or all of the transistors 120 to 122 may be transistors without back gates.

The transistor 120 is a pass transistor which connects a gate of the transistor 121 (a node 124) and the signal line SL. The transistor 122 is a pass transistor which connects the wiring ML and an anode of the light-emitting element 126 (a node 125). The transistor 121 is a driving transistor and functions as a source of current supplied to the light-emitting element 126. In accordance with the amount of drain current of the transistor 121, the luminance of the light-emitting element 126 is adjusted. The capacitor 123 is a storage capacitor which stores voltage between the node 125 and the node 124.

Variation in the drive capability of the transistors 121 in the pixels 103 causes variation in the luminance of the light-emitting elements 126, which results in decrease in display quality. The pixels 103 in FIG. 14A have a function of correcting variation in the luminance of the light-emitting elements 126 by monitoring drain currents of the transistors 121.

FIG. 14B illustrates an example of a timing chart of a potential of the scan line GL illustrated in FIG. 14A and a potential of the image signal supplied to the signal line SL. Note that the timing chart of FIG. 14B is an example in which all the transistors included in the pixel 103 are n-channel transistors.

A period P1 is a writing operation period and the light-emitting element 126 does not emit light during the period. A high-level potential is supplied to the scan line GL, and the transistor 120 and the transistor 122 are turned on. A potential Vdata is supplied to the signal line SL as an image signal. The potential Vdata is supplied to the node 124 through the transistor 120.

In the case where the transistor 121 is an n-channel type, it is preferable that, in the period P1, the potential of the wiring ML be lower than the sum of the potential of the wiring CTL and the threshold voltage Vthe of the light-emitting element 126, and the potential of the wiring ANL be higher than the sum of the potential of the wiring ML and the threshold voltage Vth of the transistor 121. With the above configuration, the drain current of the transistor 121 can be made to flow preferentially through the wiring ML instead of the light-emitting element 126.

A period P2 is a light emission period and the light-emitting element 126 emits light during the period. A low-level potential is supplied to the scan line GL, and the transistor 120 and the transistor 122 are turned off. When the transistor 120 is turned off, the potential Vdata is held at the node 124. A potential Vano is supplied to the wiring ANL, and a potential Vcat is supplied to the wiring CTL. The potential Vano is preferably higher than the sum of the potential Vcat, the threshold voltage Vthe of the light-emitting element 126, and the threshold voltage Vth of the transistor 121. The potential difference between the wiring ANL and the wiring CTL allows the drain current of the transistor 121 to flow into the light-emitting element 126; thus, the light-emitting element 126 emits light.

A period P3 is a monitor period in which the drain current of the transistor 121 is obtained. A high-level potential is supplied to the scan line GL, and the transistor 120 and the transistor 122 are turned on. In addition, such a potential that the gate voltage of the transistor 121 is higher than the threshold voltage Vth thereof is supplied to the signal line SL. The potential of the wiring ML is preferably lower than the sum of the potential of the wiring CTL and the threshold voltage Vthe of the light-emitting element 126. The potential of the wiring ANL is preferably higher than the sum of the potential of the wiring ML and the threshold voltage Vth of the transistor 121. With the above configuration, the drain current of the transistor 121 can be made to flow preferentially through the wiring ML instead of the light-emitting element 126.

A current $I_{MON}$ output from the pixel 103 to the wiring ML in the period P3 corresponds to the drain current flowing into the transistor 121 during the light emission period. The current $I_{MON}$ is supplied to a monitor circuit. The monitor circuit analyzes the current $I_{MON}$ and generates a correction signal on the basis of the analysis result. Through the operation, deviation of the luminance of the pixels 103 can be corrected.

The monitor operation is not necessarily performed after the light-emitting operation. For example, in the pixel 103, the monitor operation can be performed after the cycle of data writing operation and light-emitting operation is repeated plural times. Alternatively, after the monitor operation, the light-emitting element 126 may be brought into a non-light-emitting state by writing a data signal corresponding to the lowest grayscale level [0] to the pixel 103.

Figure 15A:
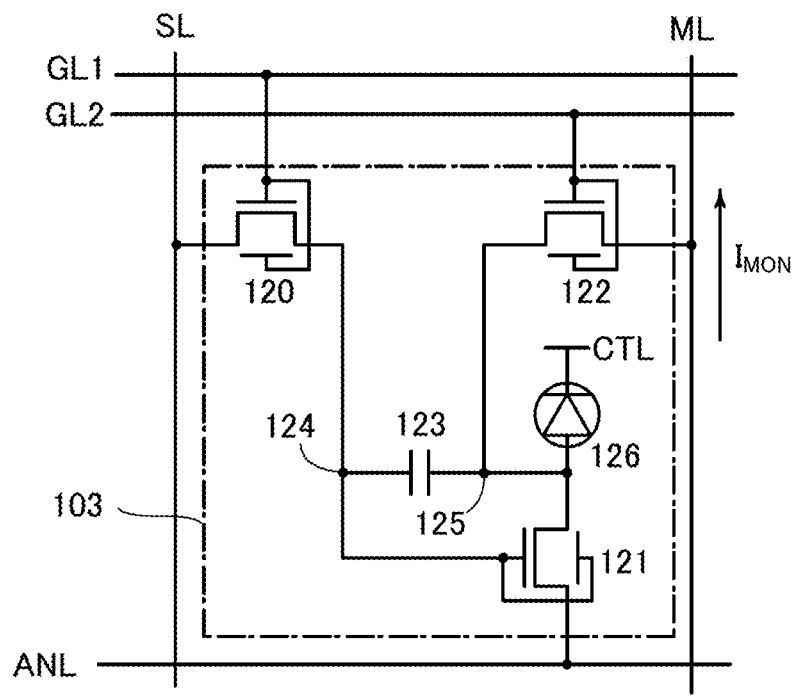
FIGS. 15A and 15B are circuit diagrams each illustrating a configuration example of a pixel.

The pixel 103 illustrated in FIG. 14A may be connected to a plurality of scan lines. A circuit diagram of such a case is illustrated in FIG. 15A. In the pixel 103 illustrated in FIG. 15A, the gate of the transistor 120 is electrically connected to a scan line GL1, and the gate of the transistor 122 is electrically connected to a scan line GL2. With such a structure, the transistor 120 and the transistor 122 can be individually turned on and off and the timing of the monitor operation can be controlled more freely.

Figure 15B:
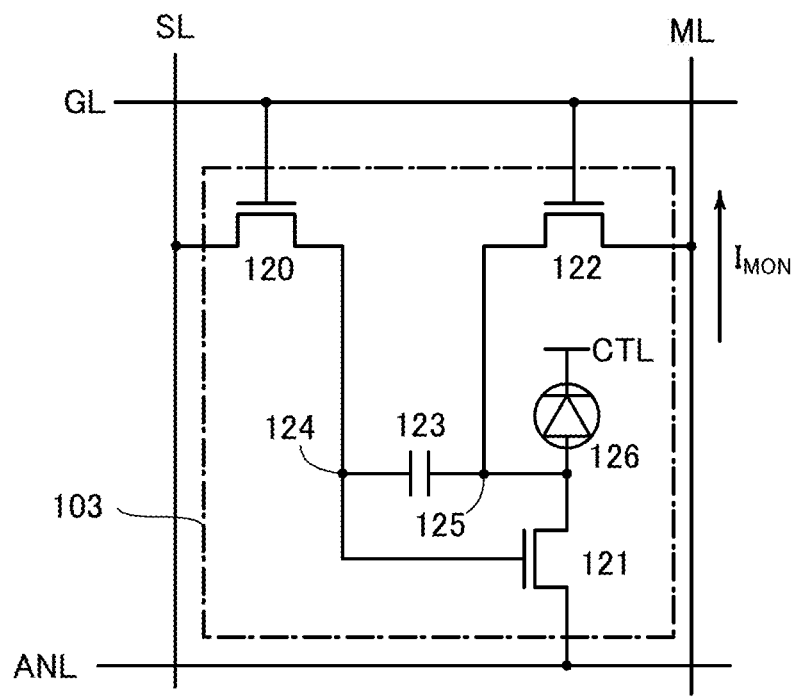

In the pixel 103 illustrated in FIG. 14A, the transistors 120 to 122 do not necessarily include back gates. FIG. 15B illustrates a circuit diagram of that case. The structure illustrated in FIG. 15B can facilitate the manufacturing process of the pixel 103.

<Example of Pixel Circuit for Panel Including Liquid Crystal Element>

Figure 16A:
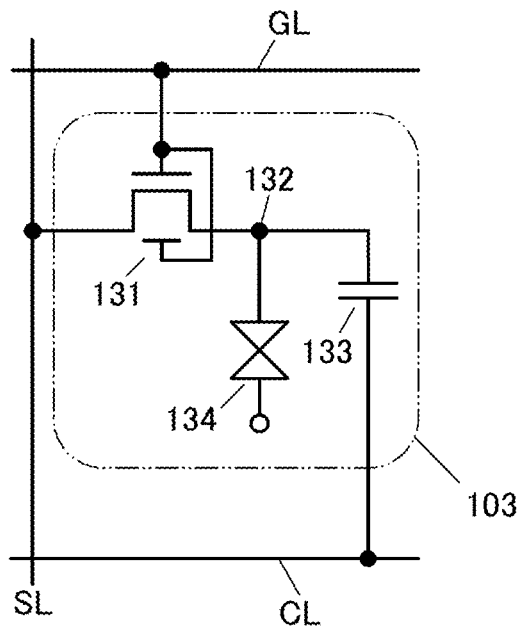
FIGS. 16A and 16B are circuit diagrams each illustrating a configuration example of a pixel.

FIG. 16A illustrates an example of a pixel circuit that can be used for a panel including a liquid crystal element. The pixel 103 illustrated in FIG. 16A includes a transistor 131, a capacitor 133, and a liquid crystal element 134 functioning as a display element.

Figure 16B:
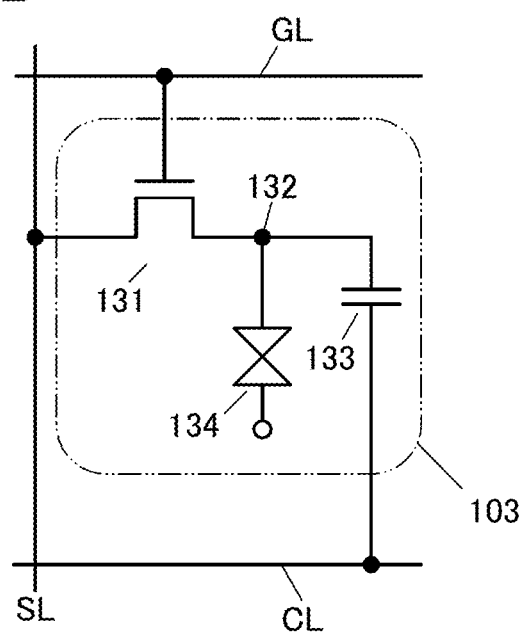

A gate of the transistor 131 is electrically connected to the scan line GL. A first terminal of the transistor 131 is electrically connected to the signal line SL. A second terminal of the transistor 131 is electrically connected to a first terminal of the capacitor 133 and a first terminal of the liquid crystal element 134. A node of the second terminal of the transistor 131, the first terminal of the capacitor 133, and the first terminal of the liquid crystal element 134 is referred to as a node 132. The transistor 131 has a function of controlling whether to write a data signal to the node 132. Note that although the transistor 131 has a back gate in FIG. 16A, the back gate is not necessarily provided as illustrated in FIG. 16B.

A second terminal of the capacitor 133 is electrically connected to a wiring (also referred to as a capacitor line CL) to which a particular potential is supplied. The potential of the capacitor line CL is set in accordance with the specifications of the pixel 103 as appropriate. The capacitor 133 functions as a storage capacitor for storing data written to the node 132.

The potential of a second terminal of the liquid crystal element 134 is set in accordance with the specifications of the pixel 103 as appropriate. The alignment state of a liquid crystal in the liquid crystal element 134 depends on data written to the node 132. A common potential may be supplied to the second terminal of the liquid crystal element 134 included in each of the pixels 103.

As examples of a mode of the liquid crystal element 134, any of the following modes can be given: a twisted nematic (TN) mode, a super twisted nematic (STN) mode, a vertical alignment (VA) mode, an axially symmetric aligned microcell (ASM) mode, an optically compensated birefringence (OCB) mode, a ferroelectric liquid crystal (FLC) mode, an antiferroelectric liquid crystal (AFLC) mode, a multi-domain vertical alignment (MVA) mode, a patterned vertical alignment (PVA) mode, an in-plane switching (IPS) mode, a fringe field switching (FFS) mode, and a transverse bend alignment (TBA) mode. Other examples of the mode include an electrically controlled birefringence (ECB) mode, a polymer-dispersed liquid crystal (PDLC) mode, a polymer network liquid crystal (PNLC) mode, and a guest-host mode. Note that the present invention is not limited to these examples, and various modes can be employed.

Here, an operation example of the display panel including the pixel 103 illustrated in FIG. 16A is described. The pixels 103 are sequentially selected row by row by the scan line driver circuit 101, whereby the transistor 131 is turned on and a data signal is written to the node 132.

Then, the transistor 131 is turned off and the data signal written to the node 132 is stored. The amount of light transmitted through the liquid crystal element 134 is determined in accordance with the data signal written to the node 132. This operation is sequentially performed row by row; thus, an image can be displayed on the display region.

Embodiment 4

In this embodiment, a more specific structure example of the display panel described in the above embodiment will be described with reference to FIGS. 17A to 17C, FIGS. 18A to 18C, FIGS. 19A and 19B, FIGS. 20A and 20B, and FIGS. 21A and 21B. In this embodiment, a display panel including a liquid crystal element and a display panel including a light-emitting element are described as examples of the display panel.

<Top View of Structure Example of Display Panel>

Figure 17A:
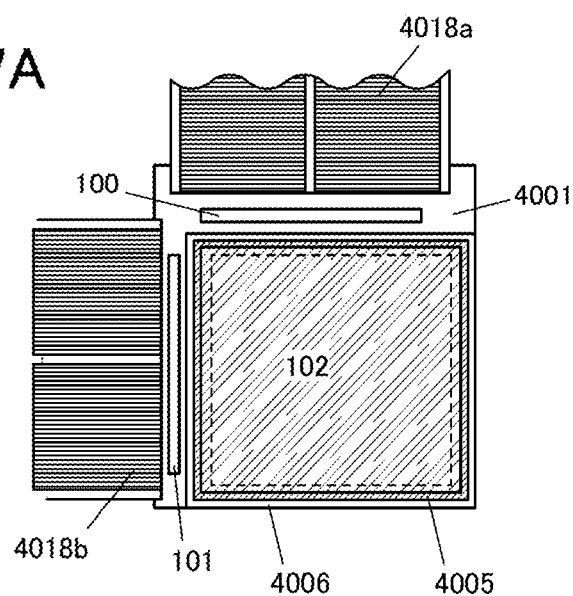
FIGS. 17A to 17C are top views each illustrating a structure example of a display panel.
Figure 17B:
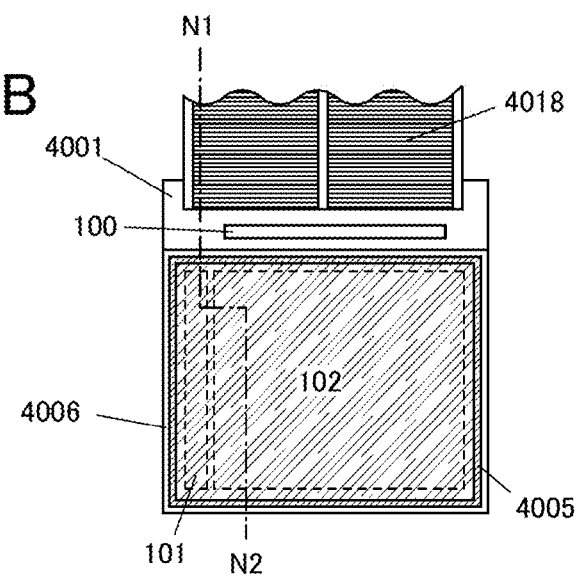
Figure 17C:
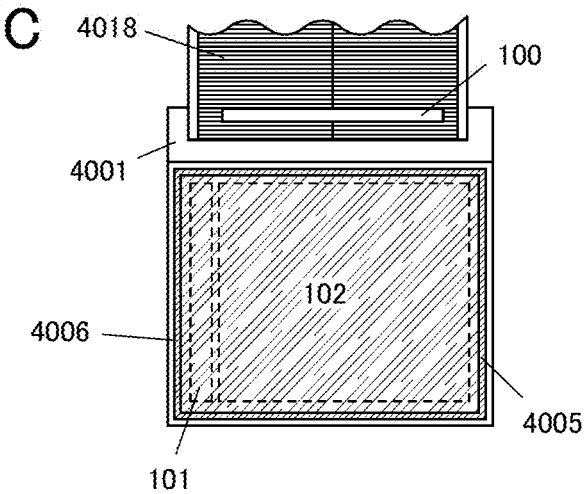

FIGS. 17A to 17C are top views each illustrating a structure example of a display panel.

In FIG. 17A, a sealant 4005 is provided so as to surround the pixel portion 102 provided over a first substrate 4001, and the pixel portion 102 is sealed by the sealant 4005 and a second substrate 4006. In FIG. 17A, the signal line driver circuit 100 and the scan line driver circuit 101 are each formed over a substrate separately prepared and mounted in a region different from the region surrounded by the sealant 4005 over the first substrate 4001. Various signals and potentials are supplied to the signal line driver circuit 100, the scan line driver circuit 101, and the pixel portion 102 from flexible printed circuits (FPCs) 4018a and 4018b. The signal line driver circuit 100 and the scan line driver circuit 101 are each formed using a single crystal semiconductor or a polycrystalline semiconductor including silicon, for example. Alternatively, the signal line driver circuit 100 and the scan line driver circuit 101 each may be formed using an oxide semiconductor and a single crystal semiconductor or a polycrystalline semiconductor including silicon. For example, the semiconductor device described in Embodiment 2 may be used for part of the signal line driver circuit 100 and part of the scan line driver circuit 101.

In FIGS. 17B and 17C, the sealant 4005 is provided so as to surround the pixel portion 102 and the scan line driver circuit 101 which are provided over the first substrate 4001. The second substrate 4006 is provided over the pixel portion 102 and the scan line driver circuit 101. Consequently, the pixel portion 102 and the scan line driver circuit 101 are sealed together with a display element by the first substrate 4001, the sealant 4005, and the second substrate 4006. In FIGS. 17B and 17C, the signal line driver circuit 100 formed over a substrate separately prepared is mounted in a region different from the region surrounded by the sealant 4005 over the first substrate 4001. In FIGS. 17B and 17C, various signals and potentials are supplied to the signal line driver circuit 100, the scan line driver circuit 101, and the pixel portion 102 from an FPC 4018. The signal line driver circuit 100 is formed using a single crystal semiconductor or a polycrystalline semiconductor including silicon, for example. Alternatively, the signal line driver circuit 100 may be formed using a single crystal semiconductor or a polycrystalline semiconductor including silicon and an oxide semiconductor. For example, the semiconductor device described in Embodiment 2 may be included in part of the signal line driver circuit 100.

In FIGS. 17B and 17C, examples in which a circuit formed through a process different from that of the pixel portion 102, such as an IC, is provided as the signal line driver circuit 100 over the first substrate 4001 are illustrated; however, the structure is not limited to these examples. The scan line driver circuit 101 may be formed using an IC or the like, or only part of the signal line driver circuit 100 or only part of the scan line driver circuit 101 may be formed using an IC or the like.

The connection method of a driver circuit formed using an IC or the like is not particularly limited; wire bonding, chip on glass (COG), tape carrier package (TCP), chip on film (COF), or the like can be used. FIG. 17A illustrates an example where the signal line driver circuit 100 and the scan line driver circuit 101 are mounted by COG. FIG. 17B illustrates an example where the signal line driver circuit 100 is mounted by COG. FIG. 17C illustrates an example where the signal line driver circuit 100 is mounted by TCP.

Figure 18A:
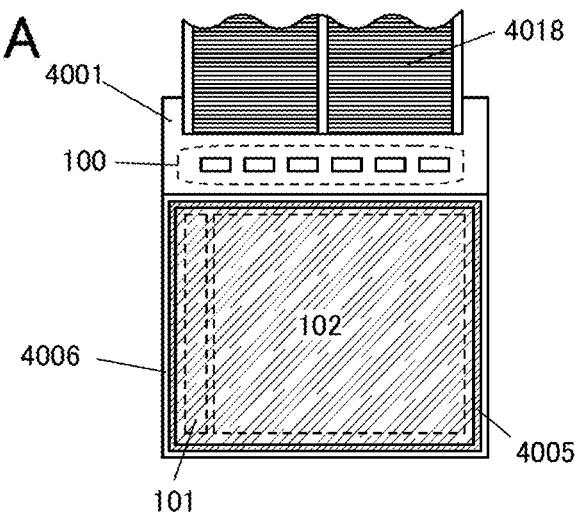
FIGS. 18A to 18C are top views each illustrating a structure example of a display panel.

In the case where the signal line driver circuit 100 is formed using an IC, the number of ICs is not limited to one and the signal line driver circuit 100 may include a plurality of ICs. Similarly, in the case where the scan line driver circuit 101 is formed using an IC, the number of ICs is not limited to one and the scan line driver circuit 101 may include a plurality of ICs. FIG. 18A illustrates an example where six ICs are used for the signal line driver circuit 100. The signal line driver circuit including a plurality of ICs can achieve higher definition of the pixel portion 102.

Figure 18B:
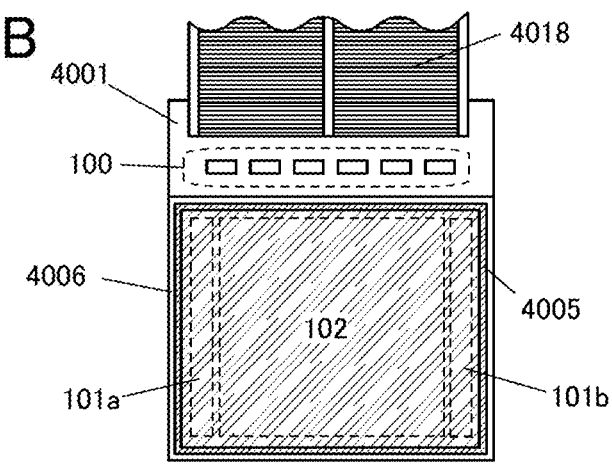

The scan line driver circuit 101 may be provided in both the left and right sides of the pixel portion 102. FIG. 18B illustrates a structure example of the case where a scan line driver circuit 101a and a scan line driver circuit 101b are provided in the left and right sides of the pixel portion 102.

Figure 18C:
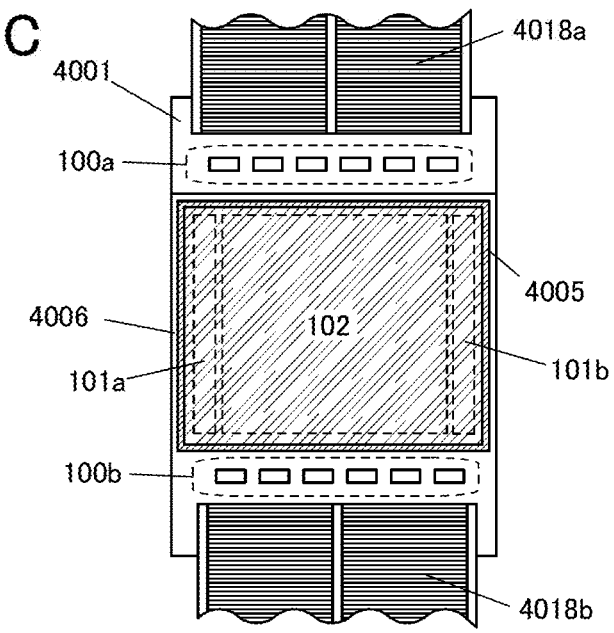

The signal line driver circuit 100 may be provided along both the top and bottom sides of the pixel portion 102. FIG. 18C illustrates a structure example of the case where a signal line driver circuit 100a and a signal line driver circuit 100b are provided along the top and bottom sides of the pixel portion 102. Each of the signal line driver circuits includes six ICs.

<Cross-Sectional View of Structure Example of Display Panel>

Figure 19A:
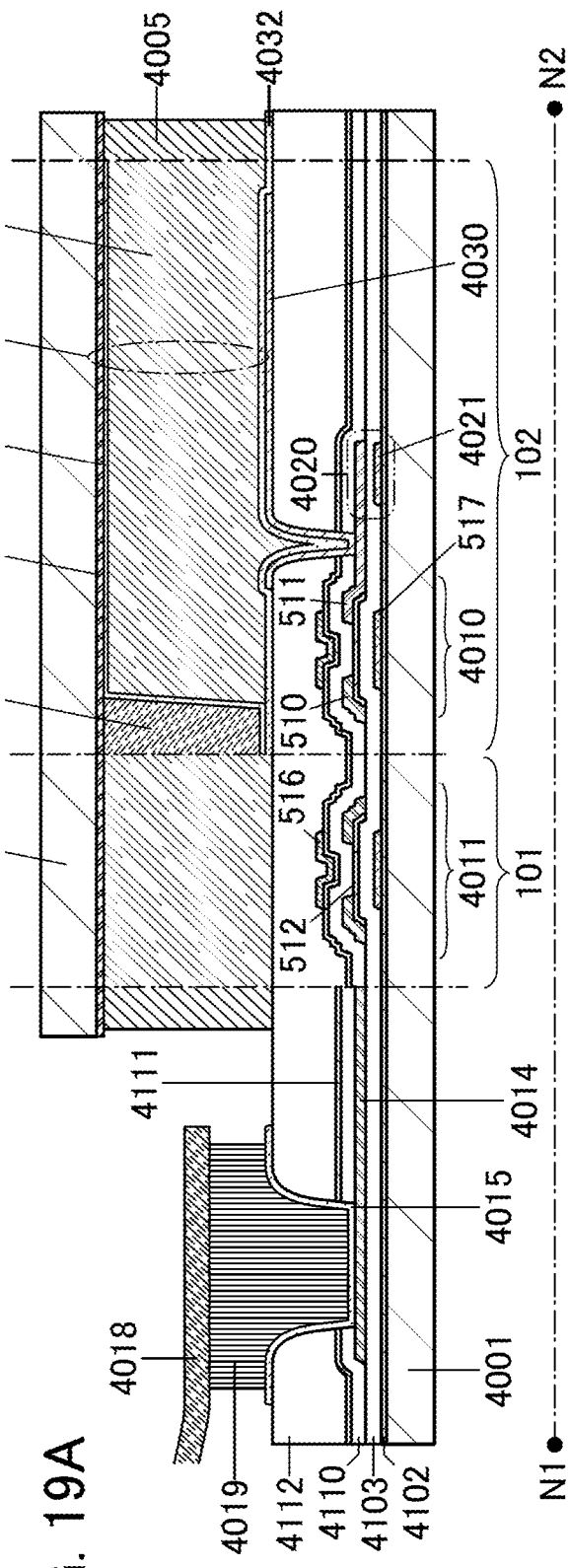
FIGS. 19A and 19B are cross-sectional views each illustrating a structure example of a display panel.
Figure 19B:
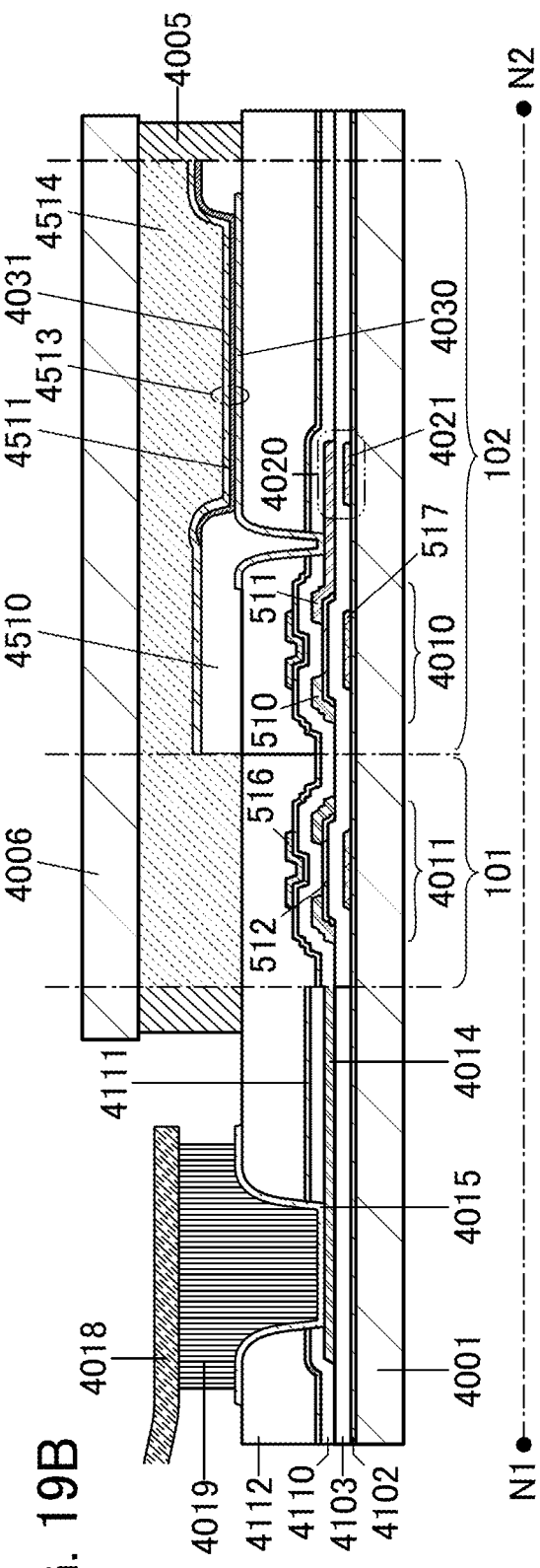

FIGS. 19A and 19B correspond to cross-sectional views taken along the chain line N1-N2 in FIG. 17B.

As illustrated in FIGS. 19A and 19B, the display panel has an electrode 4015, and the electrode 4015 is electrically connected to a terminal included in the FPC 4018 through an anisotropic conductive layer 4019. The electrode 4015 is electrically connected to a wiring 4014 in an opening formed in an insulating layer 4112, an insulating layer 4111, and an insulating layer 4110. The electrode 4015 is formed of the same conductive layer as a first electrode layer 4030.

The pixel portion 102 and the scan line driver circuit 101 provided over the first substrate 4001 each include a plurality of transistors. In each of FIGS. 19A and 19B, a transistor 4010 included in the pixel portion 102 and a transistor 4011 included in the scan line driver circuit 101 are illustrated. The insulating layer 4112 is provided over the transistor 4010 and the transistor 4011 in FIG. 19A, and a bank 4510 is further provided over the insulating layer 4112 in FIG. 19B.

The transistor 4010 and the transistor 4011 are provided over an insulating layer 4102. The transistor 4010 and the transistor 4011 include electrodes 517 over the insulating layer 4102. An insulating layer 4103 is formed over the electrodes 517. Semiconductor layers 512 are formed over the insulating layer 4103. Electrodes 510 and electrodes 511 are formed over the semiconductor layers 512. The insulating layer 4110 and the insulating layer 4111 are formed over the electrodes 510 and the electrodes 511. Electrodes 516 are formed over the insulating layer 4110 and the insulating layer 4111. The electrodes 510 and the electrodes 511 are formed of the same conductive layer as the wiring 4014.

In each of the transistor 4010 and the transistor 4011, the electrode 517 functions as a gate, the electrode 510 functions as one of a source and a drain, the electrode 511 functions as the other of the source and the drain, and the electrode 516 functions as a back gate.

Since the transistor 4010 and the transistor 4011 each include a bottom gate and a back gate, the on-state current of the transistors can be increased. Moreover, the threshold voltage of the transistors can be controlled.

In each of the transistor 4010 and the transistor 4011, the semiconductor layer 512 functions as a channel formation region. For the semiconductor layer 512, crystalline silicon, polycrystalline silicon, amorphous silicon, an oxide semiconductor, an organic semiconductor, or the like may be used. Impurities may be introduced to the semiconductor layer 512, if necessary, to increase conductivity of the semiconductor layer 512 or control the threshold voltage of the transistor.

In the case where an oxide semiconductor is used for the semiconductor layer 512, the semiconductor layer 512 preferably includes indium (In). When an oxide semiconductor containing indium is used for the semiconductor layer 512, the carrier mobility (electron mobility) of the semiconductor layer 512 can be high. The semiconductor layer 512 is preferably an oxide semiconductor containing an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M. The element M is an element having high bonding energy with oxygen, for example. The element M is an element whose bonding energy with oxygen is higher than that of indium, for example. The semiconductor layer 512 is preferably an oxide semiconductor containing zinc (Zn). When the oxide semiconductor contains zinc, the oxide semiconductor is easily crystallized in some cases.

The semiconductor layer 512 is not limited to the oxide semiconductor containing indium. The semiconductor layer 512 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

The transistor 200 which will be described later can be used as the transistor 4010 and the transistor 4011.

The display panels illustrated in FIGS. 19A and 19B each include a capacitor 4020. The capacitor 4020 has a region in which the electrode 511 overlaps with an electrode 4021 with the insulating layer 4103 positioned therebetween. The electrode 4021 is formed of the same conductive layer as the electrodes 517.

An example of a liquid crystal display panel using a liquid crystal element as a display element is illustrated in FIG. 19A. In FIG. 19A, a liquid crystal element 4013 which is a display element includes the first electrode layer 4030, a second electrode layer 4031, and a liquid crystal layer 4008. An insulating layer 4032 and an insulating layer 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control a distance between the first electrode layer 4030 and the second electrode layer 4031 (a cell gap). Alternatively, a spherical spacer may be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is not involved may be used. A blue phase is one of liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral material at 5 wt % or more is used for the liquid crystal layer in order to improve the temperature range. The liquid crystal composition that includes the liquid crystal exhibiting a blue phase and a chiral material has a short response time of 1 msec or less, and has optical isotropy, which makes the alignment process unnecessary and the viewing angle dependence small. In addition, since an alignment film does not need to be provided and rubbing treatment is unnecessary, electrostatic discharge caused by the rubbing treatment can be prevented and defects and damage of the liquid crystal display panel can be reduced in the manufacturing process. Thus, the productivity of the liquid crystal display panel can be increased.

Moreover, it is possible to use a method called domain multiplication or multi-domain design, in which a pixel is divided into some regions (subpixels) and molecules are aligned in different directions in their respective regions.

The specific resistivity of the liquid crystal material is higher than or equal to $1\times10^9$ Ω·cm, preferably higher than or equal to $1\times10^{11}$ Ω·cm, and further preferably higher than or equal to $1\times10^{12}$ Ω·cm. Note that the specific resistivity in this specification is measured at 20° C.

In the case where the transistor 4010 is an oxide semiconductor transistor, the transistor 4010 can have a small current in an off-state (off-state current). Accordingly, an electric signal such as an image signal can be held for a longer period, and a writing interval can be set longer in an on state. Accordingly, the frequency of refresh operation can be reduced, which leads to an effect of suppressing power consumption.

In the display panel, a black matrix (a light-blocking layer), an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source.

FIG. 19B illustrates an example of a display panel including, as a display element, a light-emitting element such as an EL element. EL elements are classified into organic EL elements and inorganic EL elements.

In the organic EL element, by voltage application, electrons are injected from one electrode to an EL layer and holes are injected from the other electrode to the EL layer. The carriers (electrons and holes) are recombined, and thus, a light-emitting organic compound is excited. The light-emitting organic compound returns to a ground state from the excited state, thereby emitting light. Owing to such a mechanism, this light-emitting element is referred to as a current-excitation light-emitting element. In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like. The EL layer can be formed by an evaporation method (including a vacuum evaporation method), a transfer method, a printing method, an inkjet method, a coating method, or the like.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions.

FIG. 19B illustrates an example where an organic EL element is used as a light-emitting element 4513.

In FIG. 19B, the light-emitting element 4513 is electrically connected to the transistor 4010 in the pixel portion 102. The structure of the light-emitting element 4513 is the stacked-layer structure of the first electrode layer 4030, a light-emitting layer 4511, and the second electrode layer 4031; however, this embodiment is not limited to this structure. The structure of the light-emitting element 4513 can be changed as appropriate depending on a direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, a filler 4514 is provided for sealing in a space which is enclosed by the first substrate 4001, the second substrate 4006, and the sealant 4005. It is preferable that, in this manner, the light-emitting element be packaged (sealed) with a protective film (such as a laminate film or an ultraviolet curable resin film) or a cover member with high air-tightness and little degasification so that the light-emitting element is not exposed to the outside air.

As the filler 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer 4030 and the second electrode layer 4031 each can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

Alternatively, a conductive composition containing a conductive high molecule (also called a conductive polymer) can be used for the first electrode layer 4030 and the second electrode layer 4031. As the conductive high molecule, a so-called π-electron conjugated conductive high molecule can be used. Examples include polyaniline or a derivative thereof, polypyrrole or a derivative thereof, polythiophene or a derivative thereof, and a copolymer of two or more of aniline, pyrrole, and thiophene or a derivative thereof.

In order to extract light emitted from the light-emitting element 4513 to the outside, at least one of the first electrode layer 4030 and the second electrode layer 4031 is transparent. In accordance with the way to extract light, the structures of the display panels are classified into a top emission structure, a bottom emission structure, and a dual emission structure. In the top emission structure, light is extracted through the substrate 4006. In the bottom emission structure, light is extracted through the substrate 4001. In the dual emission structure, light is extracted through both the substrate 4006 and the substrate 4001. For example, the second electrode layer 4031 is transparent in the case of the top emission structure. The first electrode layer 4030 is transparent in the case of the bottom emission structure. The first electrode layer 4030 and the second electrode layer 4031 are transparent in the case of the dual emission structure.

FIG. 20A is a cross-sectional view in which top-gate transistors are provided as the transistor 4011 and the transistor 4010 in FIG. 19A. Similarly, FIG. 20B is a cross-sectional view in which top-gate transistors are provided as the transistor 4011 and the transistor 4010 in FIG. 19B.

In each of the transistor 4010 and the transistor 4011 in each of FIGS. 20A and 20B, the electrode 517 functions as a gate, the electrode 510 functions as one of a source and a drain, and the electrode 511 functions as the other of the source and the drain.

The description of FIGS. 19A and 19B can be referred to for the detail of other components in FIGS. 20A and 20B.

FIG. 21A is a cross-sectional view in which the transistor 4010 and the transistor 4011 in FIG. 20A each include an electrode 516 functioning as a back gate. Similarly, FIG. 21B is a cross-sectional view in which the transistor 4010 and the transistor 4011 in FIG. 20B each include the electrode 516 functioning as a back gate.

The transistor 4010 and the transistor 4011 each include a top gate and a back gate, so that the on-state current of the transistors can be increased. In addition, the threshold voltage of the transistors can be controlled.

The description of FIGS. 19A and 19B can be referred to for the detail of other components in FIGS. 21A and 21B.

Figure 22A:
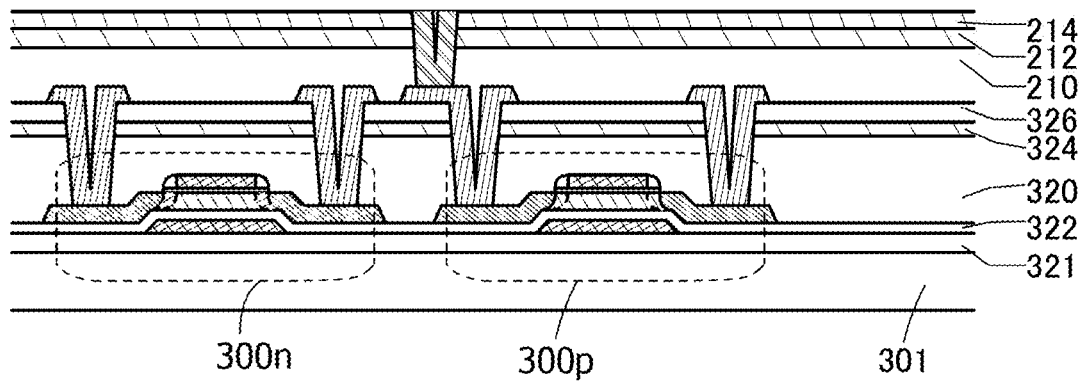
FIGS. 22A and 22B are a cross-sectional view of a layer and a top view illustrating a structure example of a display panel.

In addition, a layer 4001a may be used instead of the substrate 4001. The layer 4001a may include a semiconductor element such as a transistor. For example, as illustrated in FIG. 22A, the layer 4001a may include the transistor 300p, the transistor 300n, and the like. In the example of FIG. 22A, the transistor 300p and the transistor 300n each have the structure in FIG. 11B.

The layer 4001a illustrated in FIG. 22A includes the substrate 301, an insulator 321 over the substrate 301, and the transistor 300p and the transistor 300n over the insulator 321.

In the layer 4001a, the insulator 320 is provided over the transistor 300p and the transistor 300n. An insulator provided over the insulator 320 has a single-layer structure or a stacked-layer structure. It is preferable that at least one of the insulator 324, the insulator 212, and the insulator 214 be provided over the insulator 320. The layer 4001a in FIG. 22A includes the insulator 324, the insulator 326, the insulator 210, the insulator 212, and the insulator 214 as the insulator.

Figure 22B:
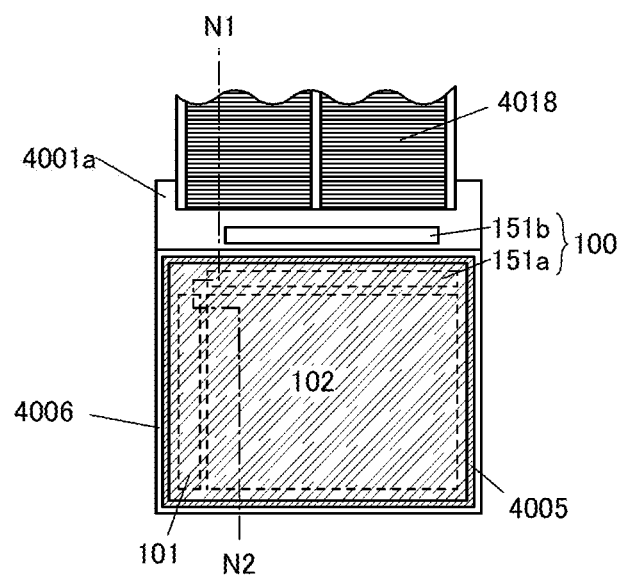
Figure 23:
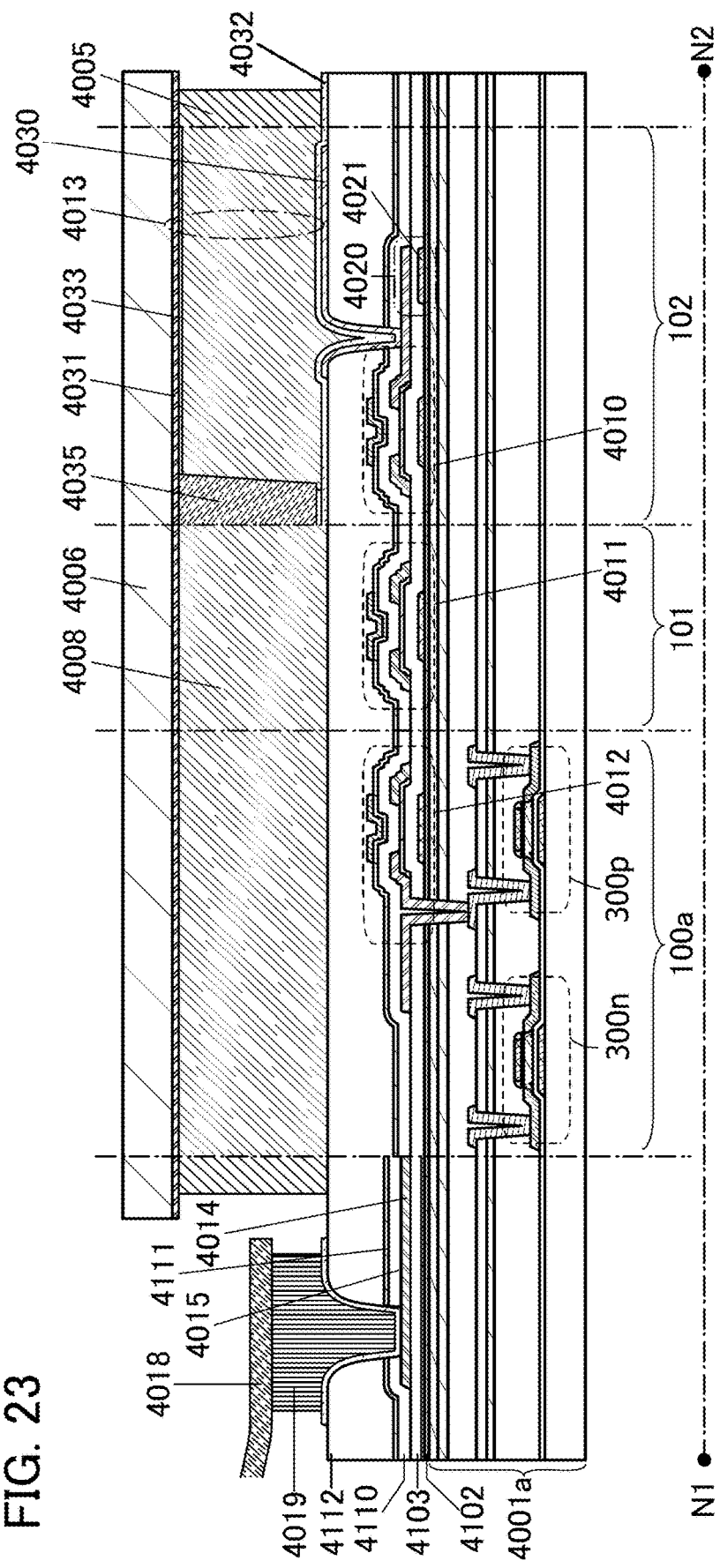
FIG. 23 is a cross-sectional view illustrating a structural example of a display panel.

An example where the layer 4001a in FIG. 22A is used in a display panel is described. FIG. 22B is a top view of the display panel. In FIG. 22B, the sealant 4005 is provided so as to surround the pixel portion 102 provided over the layer 4001a. The second substrate 4006 is provided over the pixel portion 102 and the scan line driver circuit 101. In addition, the pixel portion 102 and the scan line driver circuit 101 are sealed together with a display element by the first substrate 4001, the sealant 4005, and the second substrate 4006. Various signals and potentials are supplied to the signal line driver circuit 100, the scan line driver circuit 101, and the pixel portion 102 from the FPC 4018. The signal line driver circuit 100 includes a region 151a and a region 151b. The region 151a is provided in a region surrounded by the sealant 4005. The region 151b is provided in a region different from the region surrounded by the sealant 4005. Note that the region 151b may be provided over a separate substrate and then provided over the substrate 301 together with the substrate. FIG. 23 illustrates a cross section taken along the dashed-dotted line N1-N2 of FIG. 22B. Sources, drains, and gates of the transistor 300p and the like are electrically connected to a transistor 4012, a conductor, and the like in the upper layer through a conductor. The insulator 321 can be formed using a material similar to that used for forming the insulator 320 and the like.

Embodiment 5

An application example of a display module including the display panel described in the above embodiments will be described with reference to FIG. 24.

Figure 24:
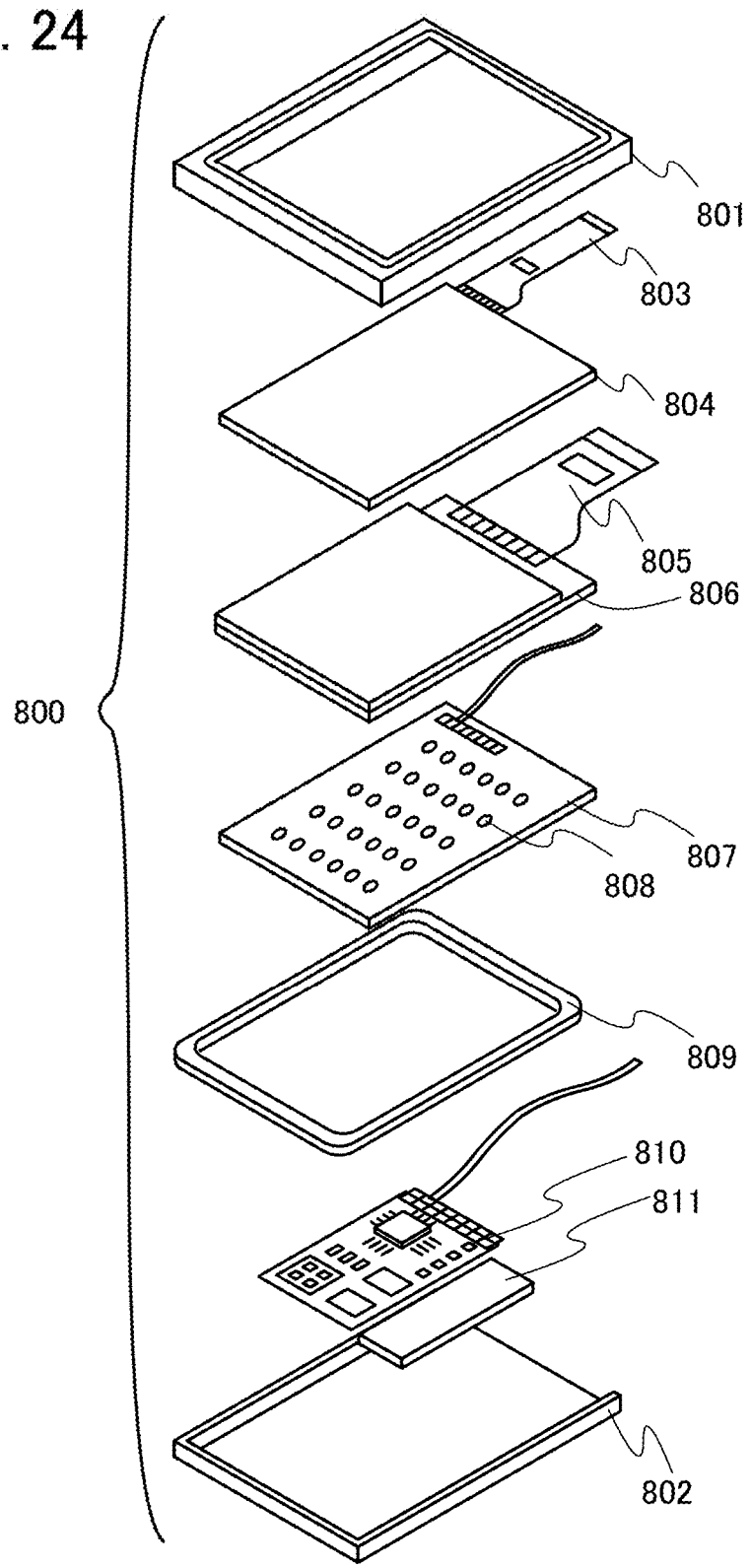
FIG. 24 illustrates an example of a display module.

In a display module 800 illustrated in FIG. 24, a touch panel 804 connected to an FPC 803, a display panel 806 connected to an FPC 805, a backlight unit 807, a frame 809, a printed circuit board 810, and a battery 811 are provided between an upper cover 801 and a lower cover 802. Note that the backlight unit 807, the battery 811, the touch panel 804, and the like are not provided in some cases.

The display panel described in the above embodiments can be used as the display panel 806 in FIG. 24.

The shapes and sizes of the upper cover 801 and the lower cover 802 can be changed as appropriate in accordance with the sizes of the touch panel 804 and the display panel 806.

The touch panel 804 can be a resistive touch panel or a capacitive touch panel and can be formed to overlap with the display panel 806. It is also possible to provide a touch panel function for a counter substrate (sealing substrate) of the display panel 806. Alternatively, a photosensor may be provided in each pixel of the display panel 806 so that an optical touch panel is obtained. Further alternatively, an electrode for a touch sensor may be provided in each pixel of the display panel 806 so that a capacitive touch panel is obtained. In such cases, the touch panel 804 can be omitted.

Figure 25A:
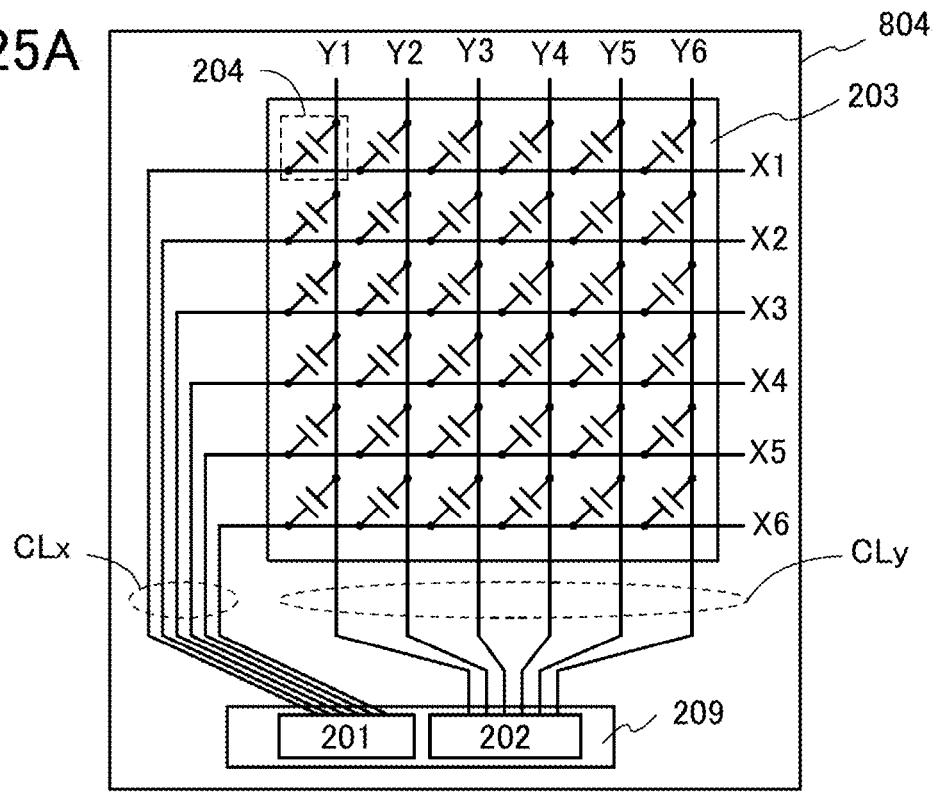
FIGS. 25A and 25B are schematic diagrams each illustrating a structure example of a touch panel.

FIG. 25A is a schematic diagram illustrating a structure example where the touch panel 804 is a mutual capacitive touch sensor. In FIG. 25A, as an example, six wirings X1 to X6 represent wirings CLx to which a pulse voltage is applied, and six wirings Y1 to Y6 represent wirings CLy which detect changes in current. The number of wirings is not limited to those illustrated in FIG. 25A. FIG. 25A also illustrates a capacitor 204 that is formed with the wiring CLx and the wiring CLy overlapping with each other or being provided close to each other.

The wirings CLx and the wirings CLy are electrically connected to an IC 209. The IC 209 includes a driver circuit 201 and a detecting circuit 202.

The driver circuit 201 is, for example, a circuit for sequentially applying a pulse voltage to the wirings X1 to X6. By applying a pulse voltage to the wirings X1 to X6, an electric field is generated between the wirings CLx and CLy of the capacitors 204. With a pulse voltage, current flows through the capacitor 204. An electric field generated between the wirings is changed by being blocked, for example, when a finger or a stylus touches the touch sensor. That is, for example, by touch with a finger or a stylus, the capacitance of the capacitor 204 is changed. By utilizing the change in capacitance caused by touch with a finger or a stylus as described above, the approach or contact of an object can be detected.

The detecting circuit 202 is a circuit for detecting changes in current flowing through the wirings Y1 to Y6 that are caused by the changes in capacitance of the capacitors 204. No change in the current values of the wirings Y1 to Y6 is detected when there is no approach or contact of an object, whereas a decrease in the current value is detected when capacitance is decreased owing to the approach or contact of an object. In order to detect a change in current, the total amount of current may be detected. In that case, an integrator circuit or the like may be used to detect the total amount of current. Alternatively, the peak value of current may be detected. In that case, current may be converted into voltage, and the peak value of voltage may be detected.

Although the driver circuit 201 and the detecting circuit 202 are formed in the same IC in FIG. 25A, the driver circuit 201 and the detecting circuit 202 may be formed in separate ICs. The detecting circuit 202 easily malfunctions due to the influence of noise, while the driver circuit 201 might be a generation source of noise. The detecting circuit 202 can be prevented from malfunctioning by being formed in an IC different from an IC in which the driver circuit 201 is formed.

The driver circuit 201, the detecting circuit 202, and a driver circuit of the display panel 806 may be formed in one IC, which results in reduction in proportion of cost of an IC in the cost of the whole display module.

Figure 25B:
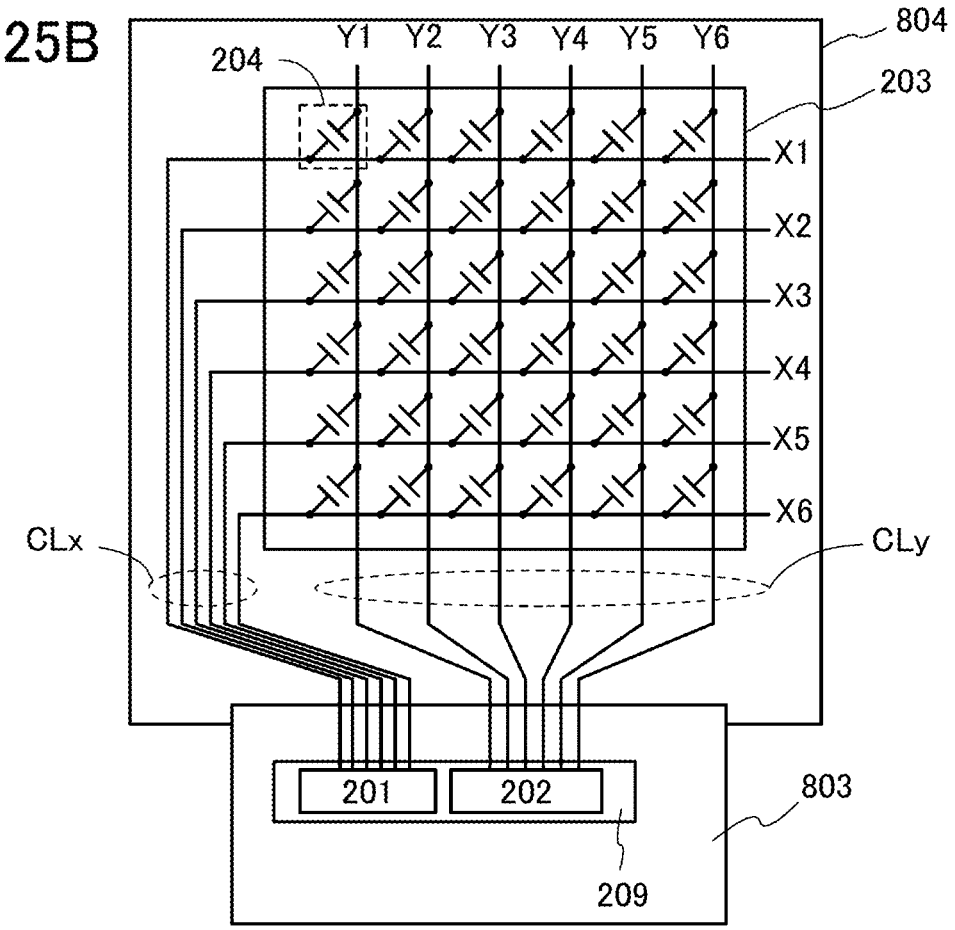

The IC 209 is provided in the touch panel 804 in FIG. 25A; however, the IC 209 may be provided in the FPC 803. FIG. 25B is a schematic view illustrating the case.

Description is continued with reference to FIG. 24.

The backlight unit 807 includes a light source 808. The light source 808 may be provided at an end portion of the backlight unit 807 and a light diffusion plate may be used.

The frame 809 protects the display panel 806 and functions as an electromagnetic shield for blocking electromagnetic waves generated by the operation of the printed circuit board 810. The frame 809 may also function as a radiator plate.

The printed circuit board 810 is provided with a power supply circuit and a signal processing circuit for outputting a video signal and a clock signal. As a power source for supplying power to the power supply circuit, an external commercial power source or a separate power source using the battery 811 may be used. The battery 811 can be omitted in the case of using a commercial power source.

The display module 800 may be additionally provided with a polarizing plate, a retardation plate, a prism sheet, or the like.

Embodiment 6

In this embodiment, examples of electronic devices including the display panel described in the above embodiments will be described with reference to FIGS. 26A to 26F.

Examples of electronic devices which include the above-described display panel in a display portion are television devices (also referred to as TV or television receivers), monitors for computers and the like, cameras such as digital cameras and digital video cameras, digital photo frames, cellular phones (also referred to as cell phones or portable telephone devices), portable game machines, portable information terminals, audio playback devices, large game machines such as pachinko machines, and the like. When having flexibility, the above-described electronic device can be incorporated along a curved inside/outside wall surface of a house or a building or a curved interior/exterior surface of a car. FIGS. 26A to 26F illustrate structure examples of the electronic devices.

Figure 26A:
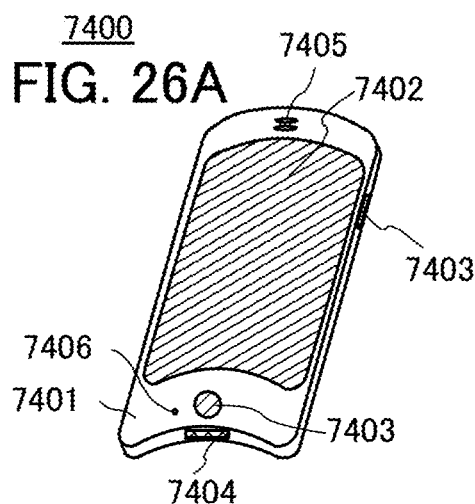
FIGS. 26A to 26F illustrate examples of electronic devices.

A cellular phone 7400 illustrated in FIG. 26A is provided with a display portion 7402 incorporated in a housing 7401, operation buttons 7403, an external connection port 7404, a speaker 7405, a microphone 7406, and the like. When the display portion 7402 of the cellular phone 7400 is touched with a finger or the like, data can be input to the cellular phone 7400. Furthermore, operations such as making a call and inputting a character can be performed by touch on the display portion 7402 with a finger or the like. The power can be turned on or off with the operation button 7403. In addition, types of images displayed on the display portion 7402 can be switched; for example, switching images from a mail creation screen to a main menu screen is performed with the operation button 7403.

Figure 26B:
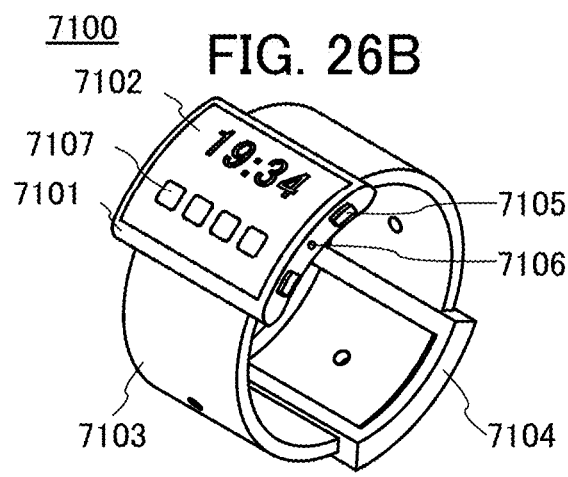

FIG. 26B illustrates an example of a watch-type portable information terminal. A portable information terminal 7100 illustrated in FIG. 26B includes a housing 7101, a display portion 7102, a band 7103, a buckle 7104, an operation button 7105, an input/output terminal 7106, and the like. The portable information terminal 7100 is capable of executing a variety of applications such as mobile phone calls, e-mailing, text viewing and editing, music reproduction, Internet communication, and computer games. The display surface of the display portion 7102 is bent, and images can be displayed on the bent display surface. Furthermore, the display portion 7102 includes a touch sensor, and operation can be performed by touching the screen with a finger, a stylus, or the like. For example, an application can be started by touching an icon 7107 displayed on the display portion 7102.

With the operation button 7105, a variety of functions such as time setting, ON/OFF of the power, ON/OFF of wireless communication, setting and cancellation of a silent mode, and setting and cancellation of a power saving mode can be performed. For example, the functions of the operation button 7105 can be set freely by setting the operating system incorporated in the portable information terminal 7100. The portable information terminal 7100 can employ near field communication that is a communication method based on an existing communication standard. In that case, for example, mutual communication between the portable information terminal 7100 and a headset capable of wireless communication can be performed, and thus hands-free calling is possible. Moreover, the portable information terminal 7100 includes the input/output terminal 7106, and data can be directly transmitted to and received from another information terminal via a connector. Power charging through the input/output terminal 7106 is possible. Note that the charging operation may be performed by wireless power feeding without using the input/output terminal 7106.

Figure 26C:
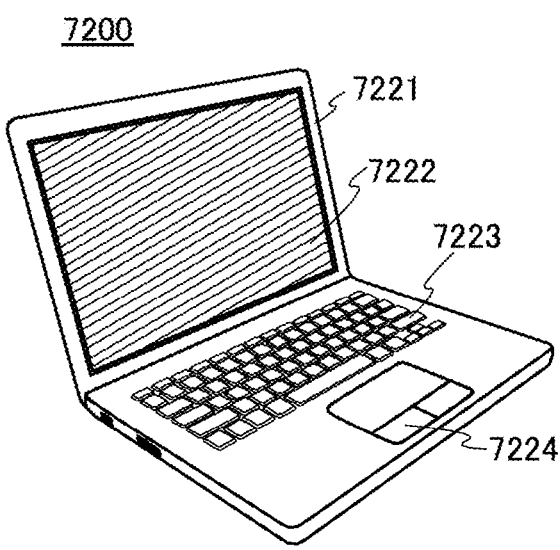

FIG. 26C illustrates a laptop personal computer (PC). A PC 7200 illustrated in FIG. 26C includes a housing 7221, a display portion 7222, a keyboard 7223, a pointing device 7224, and the like.

Figure 26D:
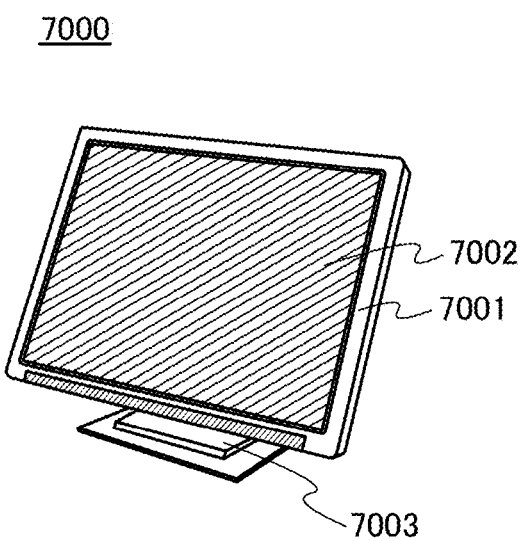

FIG. 26D illustrates a stationary display device. A display device 7000 illustrated in FIG. 26D includes a housing 7001, a display portion 7002, a supporting base 7003, and the like.

Figure 26E:
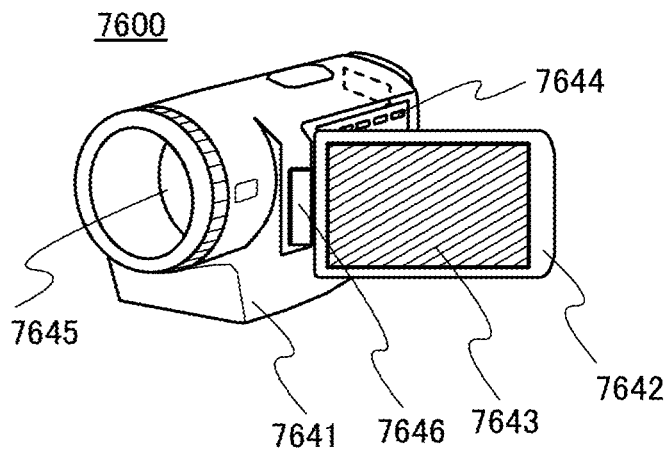

FIG. 26E illustrates a video camera 7600, which includes a first housing 7641, a second housing 7642, a display portion 7643, operation keys 7644, a lens 7645, a joint 7646, and the like.

Figure 26F:
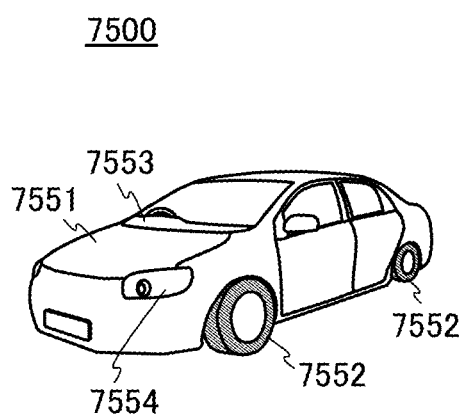

FIG. 26F illustrates a car 7500, which includes a car body 7551, wheels 7552, a dashboard 7553, lights 7554, and the like.

The electronic devices each including the semiconductor device described in Embodiment 1 can each have a display portion with excellent display quality.

Embodiment 7

In this embodiment, examples of a transistor which can be applied to one embodiment of the present invention will be described.
<Transistor 200>
The transistors 200 described below can be used as the transistor 200a and the transistor 200b described above.

Figure 27A:
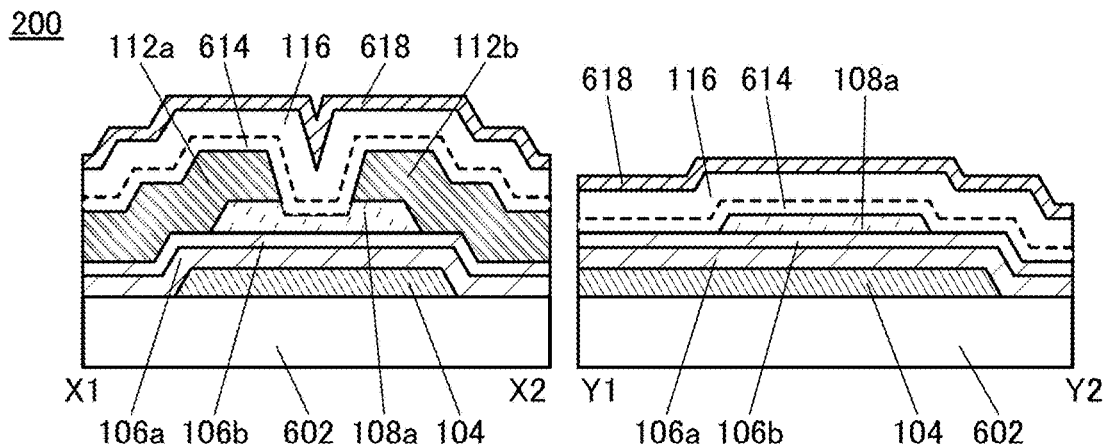
FIGS. 27A to 27C are a top view and cross-sectional views of a transistor.
Figure 27B:
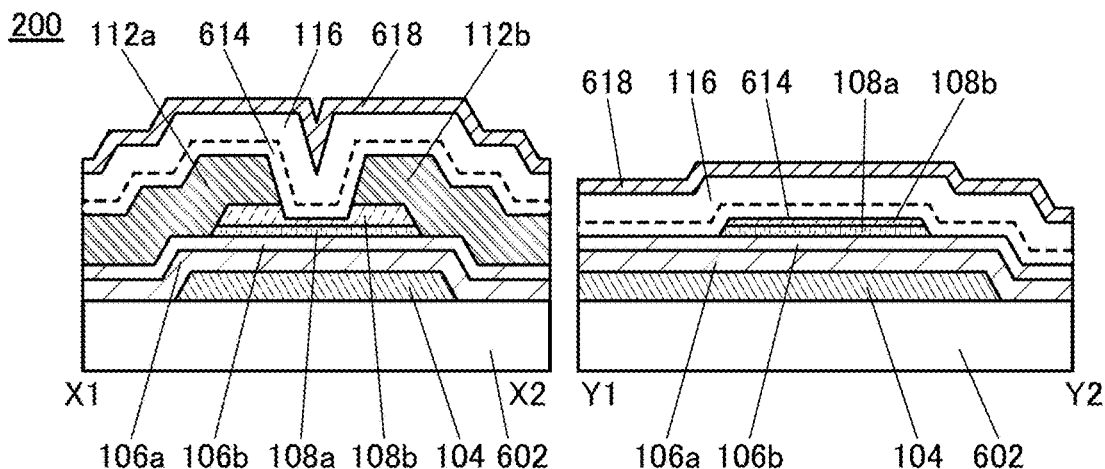
Figure 27C:
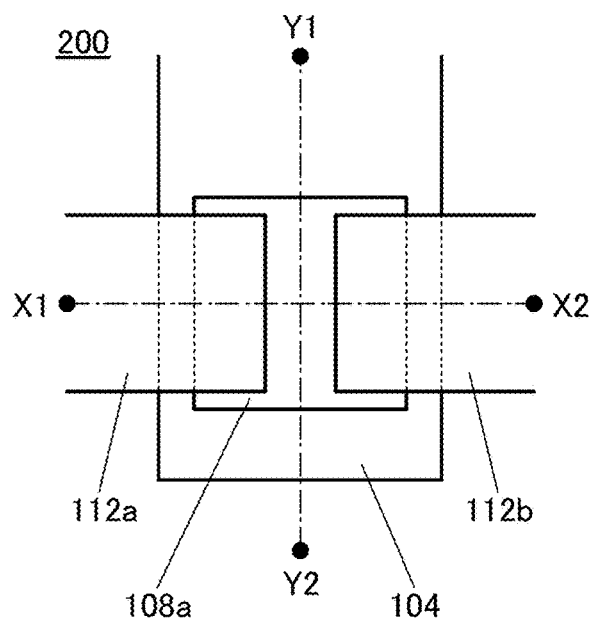

FIG. 27C is a top view of the transistor 200 that is a semiconductor device of one embodiment of the present invention. FIGS. 27A and 27B are cross-sectional view taken along the dashed-dotted line X1-X2 and cross-sectional views taken along the dashed-dotted line Y1-Y2 in FIG. 27C.

The transistor 200 includes a conductor 104 functioning as a gate over a substrate 602, an insulator 106a over the substrate 602 and the conductor 104, an insulator 106b over the insulator 106a, an oxide semiconductor 108a over the insulator 106b, a conductor 112a functioning as a source electrically connected to the oxide semiconductor 108a, and a conductor 112b functioning as a drain electrically connected to the oxide semiconductor 108a. The insulator 106a and the insulator 106b function as a gate insulator of the transistor 200. Over the transistor 200, specifically, over the conductors 112a and 112b and the oxide semiconductor 108a, an insulator 614, an insulator 116, and an insulator 618 are provided. The insulator 614, the insulator 116, and the insulator 618 function as a protective insulating film for the transistor 200. The insulator 614 and the insulator 116 are also referred to as a first protective insulating film and a second protective insulating film, respectively.

Here, as illustrated in FIG. 27B, the transistor 200 may have a stacked-layer structure in which two layers of the oxide semiconductor 108a on the conductor 104 side and an oxide semiconductor 108b over the oxide semiconductor 108a are stacked. Note that the conductor 104 functions as a gate.

As the oxide semiconductor 108a and the oxide semiconductor 108b, an oxide S2 and an oxide S3 which will be described in Embodiment 8 can be used, for example.

It is preferable that the insulator 614 and the insulator 116 each include a region (oxygen-excess region) including oxygen in excess of that in the stoichiometric composition. In other words, the insulator 614 and the insulator 116 are insulating films capable of releasing oxygen. Note that the oxygen-excess region is formed in the insulator 614 and the insulator 116 in such a manner that oxygen is introduced to the insulator 614 and the insulator 116 after the deposition, for example. As a method for introducing oxygen, an ion implantation method, an ion doping method, a plasma immersion ion implantation method, plasma treatment, or the like may be employed. Oxygen released from the insulator 614 and the insulator 116 is diffused into the oxide semiconductor 108a, so that an oxygen vacancy in the oxide semiconductor 108a can be filled.

The description of the substrate 4001 can be referred to for the substrate 602.

The conductor 104 functioning as the gate, the conductor 112a functioning as the source, and the conductor 112b functioning as the drain each can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as a component; an alloy including a combination of any of these metal elements; or the like.

Furthermore, the conductor 104 and the conductors 112a and 112b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductor 104 and the conductors 112a and 112b can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductors 104 and the conductors 112a and 112b. The use of a Cu—X alloy film enables the manufacturing cost to be reduced because wet etching process can be used in the processing.

As each of the insulator 106a and the insulator 106b functioning as the gate insulator of the transistor 200, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulator 106a and the insulator 106b, an insulating film of a single layer formed using a material selected from the above or an insulating film of three or more layers may be used.

The insulator 106a functions as a blocking film which inhibits penetration of oxygen. For example, in the case where excess oxygen is supplied to the insulator 106b, the insulator 614, the insulator 116, and/or the oxide semiconductor 108, the insulator 106*a* can inhibit penetration of oxygen.

Note that the insulator 106*b* that is in contact with the oxide semiconductor 108 functioning as a channel region of the transistor 200 is preferably an oxide insulating film and preferably includes a region including oxygen in excess of that in the stoichiometric composition (oxygen-excess region). In other words, the insulator 106*b* is an insulating film capable of releasing oxygen. In order to provide the oxygen-excess region in the insulator 106*b*, the insulator 106*b* is formed in an oxygen atmosphere, for example. Alternatively, the oxygen-excess region may be formed by introduction of oxygen into the insulator 106*b* after the deposition. As a method for introducing oxygen, an ion implantation method, an ion doping method, a plasma immersion ion implantation method, plasma treatment, or the like may be employed.

In the case where hafnium oxide is used for the insulator 106*b*, the following effect is attained. Hafnium oxide has a higher dielectric constant than silicon oxide and silicon oxynitride. Therefore, the insulator 106*b* using hafnium oxide can have a larger thickness than the insulator 106*b* using silicon oxide; thus, leakage current due to tunnel current can be low. That is, it is possible to provide a transistor with a low off-state current. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulator 106*a*, and a silicon oxide film is formed as the insulator 106*b*. A silicon nitride film has a higher dielectric constant than a silicon oxide film and needs a larger thickness for capacitance equivalent to that of a silicon oxide film. Thus, when a silicon nitride film is used as the gate insulator of the transistor 200, the physical thickness of the gate insulator can be increased. This makes it possible to reduce a decrease in the withstand voltage of the transistor 200 and furthermore to increase the withstand voltage, thereby reducing electrostatic discharge damage to the transistor 200.

The insulator 614 and the insulator 116 each have a function of supplying oxygen to the oxide semiconductor 108. The insulator 618 functions as a protective insulating film for the transistor 200. The insulator 614 and the insulator 116 contain oxygen. Furthermore, the insulator 614 is an insulating film which is permeable to oxygen. Note that the insulator 614 also functions as a film which relieves damage to the oxide semiconductor 108 at the time of forming the insulator 116 in a later step.

A silicon oxide film, a silicon oxynitride film, or the like with a thickness greater than or equal to 5 nm and less than or equal to 150 nm, preferably greater than or equal to 5 nm and less than or equal to 50 nm, can be used as the insulator 614.

In addition, it is preferable that the number of defects in the insulator 614 be small and typically, the spin density corresponding to a signal that appears at g=2.001 due to a dangling bond of silicon be lower than or equal to $3 \times 10^{17}$ spins/cm$^3$ by ESR measurement. This is because if the density of defects in the insulator 614 is high, oxygen is bonded to the defects and the amount of oxygen that passes through the insulator 614 is decreased.

Note that all oxygen entering the insulator 614 from the outside does not move to the outside of the insulator 614 and some oxygen remains in the insulator 614. Furthermore, movement of oxygen occurs in the insulator 614 in some cases in such a manner that oxygen enters the insulator 614 and oxygen included in the insulator 614 is moved to the outside of the insulator 614. When an oxide insulating film which can transmit oxygen is formed as the insulator 614, oxygen released from the insulator 116 provided over the insulator 614 can be moved to the oxide semiconductor 108 through the insulator 614.

The insulator 614 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, or the like can be used as the above oxide insulating film.

Note that a silicon oxynitride film that releases less nitrogen oxide is a film which releases more ammonia than the nitrogen oxide in thermal desorption spectroscopy analysis; the number of ammonia molecules released from the silicon oxynitride film is typically greater than or equal to $1 \times 10^{18}$/cm$^3$ and less than or equal to $5 \times 10^{19}$/cm$^3$. Note that the number of ammonia molecules released from the film is the number of ammonia molecules released by heat treatment with which the surface temperature of the film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulator 614, for example. The level is positioned in the energy gap of the oxide semiconductor 108. Therefore, when nitrogen oxide is diffused to the interface between the insulator 614 and the oxide semiconductor 108, an electron is in some cases trapped by the level on the insulator 614 side. As a result, the trapped electron remains in the vicinity of the interface between the insulator 614 and the oxide semiconductor 108; thus, the threshold voltage of the transistor is shifted in the positive direction.

Nitrogen oxide reacts with ammonia and oxygen in heat treatment. Since nitrogen oxide included in the insulator 614 reacts with ammonia included in the insulator 116 in heat treatment, nitrogen oxide included in the insulator 614 is reduced. Therefore, an electron is hardly trapped at the interface between the insulator 614 and the oxide semiconductor 108.

The insulator 614 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor. By using the oxide insulating film, a shift in the threshold voltage of the transistor can be reduced, which leads to reduced changes in the electrical characteristics of the transistor.

Note that in an ESR spectrum at 100 K or lower of the insulator 614, by heat treatment of a manufacturing process of the transistor, typically heat treatment at a temperature lower than 400° C. or lower than 375° C. (preferably, higher than or equal to 340° C. and lower than or equal to 360° C.), a first signal that appears at a g-factor greater than or equal to 2.037 and less than or equal to 2.039, a second signal that appears at a g-factor greater than or equal to 2.001 and less than or equal to 2.003, and a third signal that appears at a g-factor greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 correspond to signals attributed to nitrogen oxide ($NO_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is, the smaller amount of nitrogen oxide the oxide insulating film contains.

The nitrogen concentration in the oxide insulating film measured by SIMS is lower than or equal to $6 \times 10^{20}$ atoms/cm$^3$.

The oxide insulating film is formed by a PECVD method at a substrate temperature higher than or equal to 220° C. and lower than or equal to 350° C. using silane and dinitrogen monoxide, whereby a dense and hard film can be formed.

The insulator 116 is formed using an oxide insulating film that contains oxygen in excess of that in the stoichiometric composition. Part of oxygen is released by heating from the oxide insulating film containing oxygen in excess of that in the stoichiometric composition. The oxide insulating film containing oxygen in excess of that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$, in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm, can be used as the insulator 116.

It is preferable that the number of defects in the insulator 116 be small, and typically the spin density corresponding to a signal which appears at g=2.001 due to a dangling bond of silicon be lower than $1.5 \times 10^{18}$ spins/cm$^3$, preferably lower than or equal to $1 \times 10^{18}$ spins/cm$^3$, by ESR measurement. Note that the insulator 116 is provided more apart from the oxide semiconductor 108 than the insulator 614 is; thus, the insulator 116 may have higher density of defects than the insulator 614.

Furthermore, the insulator 614 and the insulator 116 can be formed using insulating films formed of the same kinds of materials; thus, a boundary between the insulator 614 and the insulator 116 cannot be clearly observed in some cases. Thus, in this embodiment, the boundary between the insulators 614 and the insulator 116 is shown by a dashed line. Although a two-layer structure of the insulator 614 and the insulator 116 is described in this embodiment, the present invention is not limited to this structure. For example, a single-layer structure of either one of the insulator 614 and the insulator 116 may be employed.

The insulator 618 has a function of blocking oxygen, hydrogen, water, alkali metal, alkaline earth metal, and the like. It is possible to prevent outward diffusion of oxygen from the oxide semiconductor 108, outward diffusion of oxygen included in the insulator 614 and the insulator 116, and entry of hydrogen, water, or the like into the oxide semiconductor 108 from the outside by providing the insulator 618. A nitride insulating film, for example, can be used as the insulator 618. The nitride insulating film is formed using silicon nitride, silicon nitride oxide, aluminum nitride, aluminum nitride oxide, or the like. In particular, a silicon nitride oxide film or a silicon nitride film is preferably used as the insulator 618, in which case outward diffusion of oxygen can be prevented.

Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided as the insulator 618. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given. As the oxide insulating film having a blocking effect against oxygen, hydrogen, water, and the like, an aluminum oxide film, a hafnium oxide film, or an yttrium oxide film is particularly preferable.

Although the variety of films of the conductors, the insulators, and the oxide semiconductors which are described above can be formed by a sputtering method or a PECVD method, such films may be formed by another method, e.g., a thermal chemical vapor deposition (CVD) method or an atomic layer deposition (ALD) method. As an example of a thermal CVD method, a metal organic chemical vapor deposition (MOCVD) method can be given.

Next, a structure example different from that of the transistor 200 in FIGS. 27A to 27C is described with reference to FIGS. 28A and 28B. Note that in the case where a portion has a function similar to that described above, the same hatch pattern is applied to the portion, and the portion is not especially denoted by a reference numeral in some cases.

Figure 28A:
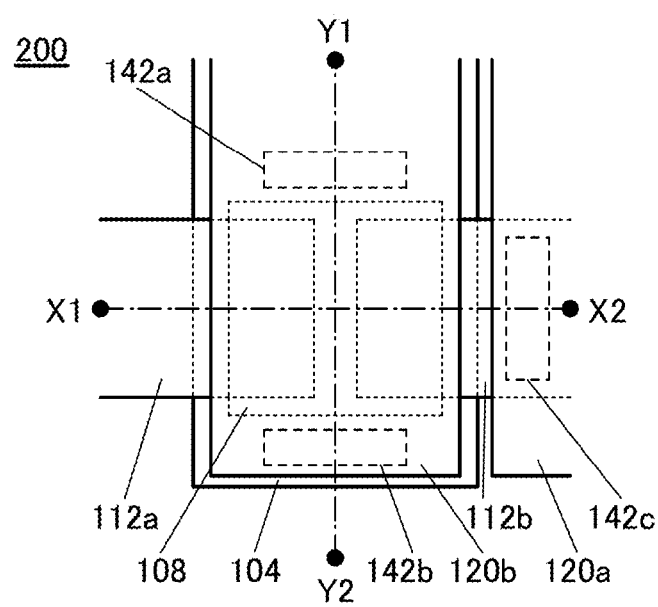
FIGS. 28A and 28B are a top view and a cross-sectional view of a transistor.

FIG. 28A is a top view of the transistor 200 that is a semiconductor device of one embodiment of the present invention. FIG. 28B is a cross-sectional view taken along the dashed-dotted line X1-X2 in FIG. 28A, and a cross-sectional view taken along the dashed-dotted line Y1-Y2 in FIG. 28A.

The transistor 200 includes the conductor 104 functioning as a first gate over the substrate 602, the insulator 106a over the substrate 602 and the conductor 104, the insulator 106b over the insulator 106a, an oxide semiconductor 108 over the insulator 106b, the insulator 614 over the oxide semiconductor 108, the insulator 116 over the insulator 614, the conductor 112a functioning as a source electrically connected to the oxide semiconductor 108, the conductor 112b functioning as a drain electrically connected to the oxide semiconductor 108, the insulator 618 over the insulator 116, a conductor 120a over the insulator 618, and a conductor 120b over the insulator 618. The insulator 614, the insulator 116, and the insulator 618 function as a second gate insulator of the transistor 200. The conductor 120a is electrically connected to the conductor 112b through an opening 142c provided in the insulator 614, the insulator 116, and the insulator 618. The conductor 120a in the transistor 200 functions as, for example, a pixel electrode used for a display device. The conductor 120b in the transistor 200 functions as a second gate (also referred to as a back gate).

Here, in the case where the transistor 200 is used as the n-channel transistor such as the transistor 52b described in Embodiment 1, the second gate of the transistor 200 may be connected to a signal at the potential $V_{SUB1}$, the potential $V_{SUB2}$, or the potential $V_N$, for example. By changing a potential supplied to the second gate of the transistor 200, the amount of current of the transistor 200 can be increased, and a threshold voltage of the transistor 200 can be changed, for example. Here, in some cases, a change in characteristics of the transistor 200 in the case where a potential is supplied to the second gate can be made larger by providing a charge trap layer in the second gate.

In the transistor 200, or the transistor 300n and the transistor 300p in FIG. 11B, an electric field is applied by the second gate through the second gate insulator. Here, the strength of the electric field can be changed in accordance with the thickness and the dielectric constant of the second gate insulator. Thus, in some cases, application of an electric field by the second gate through the second gate insulating film can control the characteristics of the transistor more easily than application of a substrate potential of the transistor 300n, the transistor 300p, and the like in FIG. 10 and FIG. 11A, for example.

Note that although the structure in which an opening 142a and an opening 142b are provided so that the conductor 120b and the conductor 104 are connected to each other is described in this embodiment, one embodiment of the present invention is not limited thereto. For example, a structure in which only one of the opening 142a and the opening 142b is provided so that the conductor 120b and the conductor 104 are connected to each other, or a structure in which the opening 142a and the opening 142b are not provided and the conductor 120b and the conductor 104 are not connected to each other may be employed. Note that in the case where the conductor 120b and the conductor 104 are not connected to each other, it is possible to apply different potentials to the conductor 120b and the conductor 104.

Figure 28B:
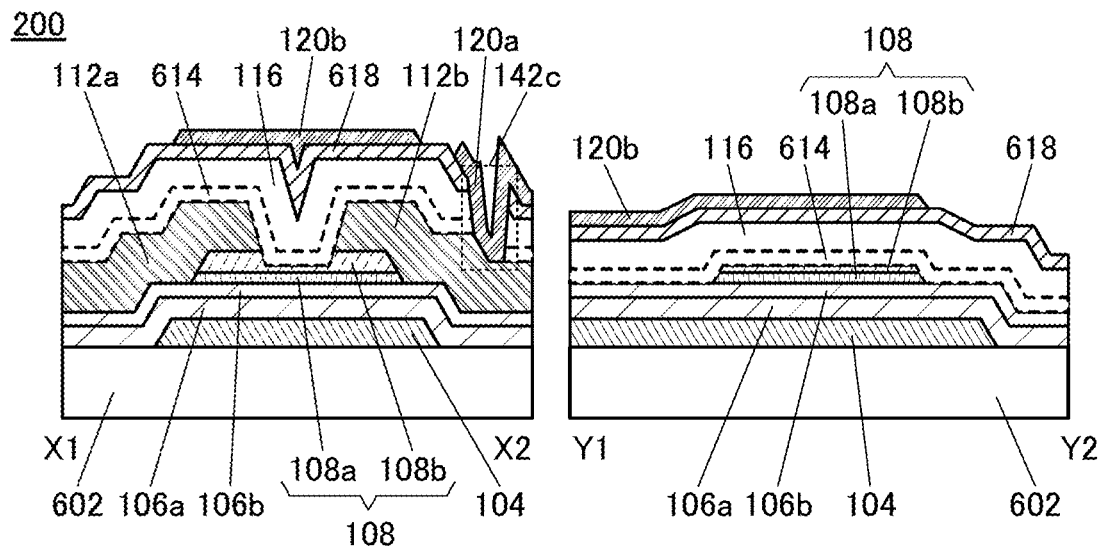

As illustrated in FIG. 28B, the oxide semiconductor 108 is positioned to face each of the conductor 104 functioning as a first gate and the conductor 120b functioning as a second gate, and is sandwiched between the two conductors functioning as gates. The lengths in the channel length direction and the channel width direction of the conductor 120b functioning as a second gate are longer than those in the channel length direction and the channel width direction of the oxide semiconductor 108. The whole oxide semiconductor 108 is covered with the conductor 120b with the insulator 614, the insulator 116, and 618 positioned therebetween. Since the conductor 120b functioning as a second gate is connected to the conductor 104 functioning as a first gate through the opening 142a and the opening 142b provided in the insulator 106a, the insulator 106b, the insulator 614, the insulator 116, and the insulator 618, a side surface of the oxide semiconductor 108 in the channel width direction faces the conductor 120b functioning as a second gate with the insulator 614, the insulator 116, and the insulator 618 positioned therebetween.

In other words, in the channel width direction of the transistor 200, the conductor 104 functioning as a first gate and the conductor 120b functioning as a second gate are connected to each other through the openings provided in the insulator 106a and the insulator 106b functioning as a first gate insulator and the insulator 614, the insulator 116, and the insulator 618 functioning as a second gate insulator; and the conductor 104 and the conductor 120b surround the oxide semiconductor 108 with the insulator 106a and the insulator 106b functioning as a first gate insulator and the insulator 614, the insulator 116, and the insulator 618 functioning as a second gate insulator positioned therebetween.

With such a structure, the oxide semiconductor 108 included in the transistor 200 can be electrically surrounded by electric fields of the conductor 104 functioning as a first gate and the conductor 120b functioning as a second gate. A device structure of a transistor, like that of the transistor 200, in which electric fields of a first gate and a second gate electrically surround an oxide semiconductor film where a channel region is formed can be referred to as a surrounded channel (s-channel) structure.

Since the transistor 200 has the s-channel structure, an electric field for inducing a channel can be effectively applied to the oxide semiconductor 108 by the conductor 104 functioning as a first gate; therefore, the current drive capability of the transistor 200 can be improved and high on-state current characteristics can be obtained. Since the on-state current can be increased, it is possible to reduce the size of the transistor 200. In addition, since the transistor 200 has a structure in which the oxide semiconductor 108 is surrounded by the conductor 104 functioning as a first gate and the conductor 120b functioning as a second gate, the mechanical strength of the transistor 200 can be increased.

Note that the other components of the transistor 200 are the same as those of the transistor 200 described above, and an effect similar to that of the transistor 200 can be obtained.

The structures of the transistors of this embodiment can be freely combined with each other.

Figure 29A:
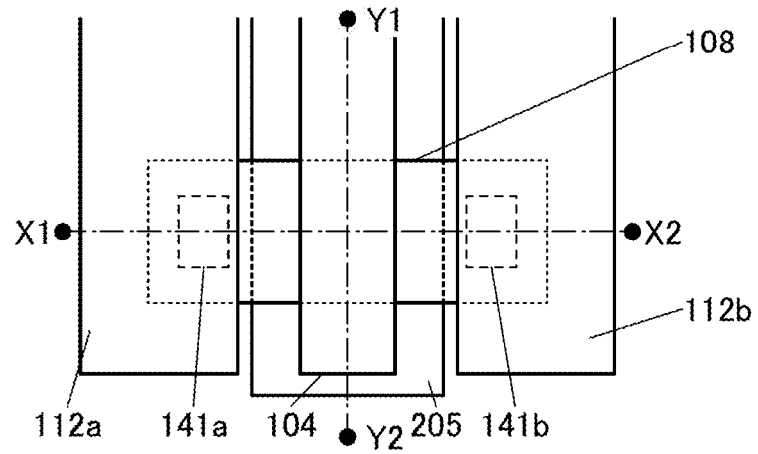
FIGS. 29A to 29C are a top view and cross-sectional views of a transistor.
Figure 29B:
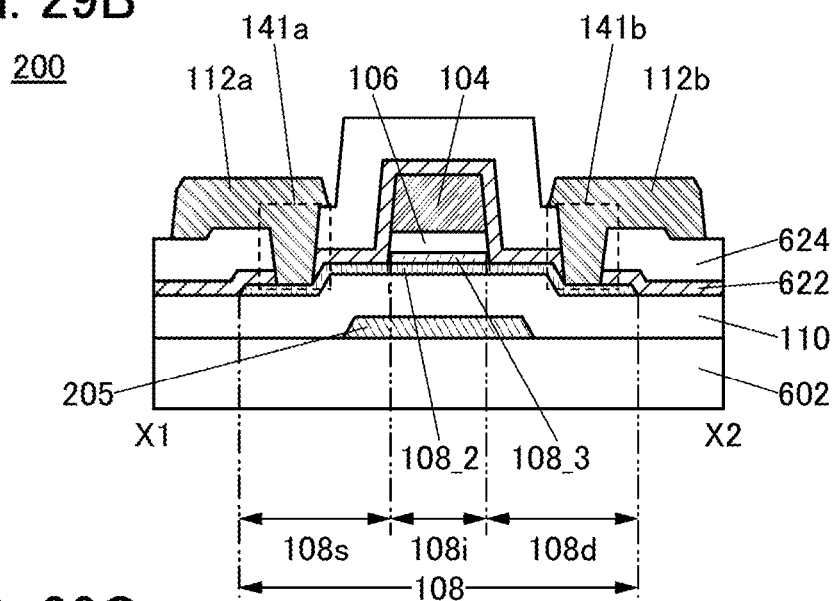
Figure 29C:
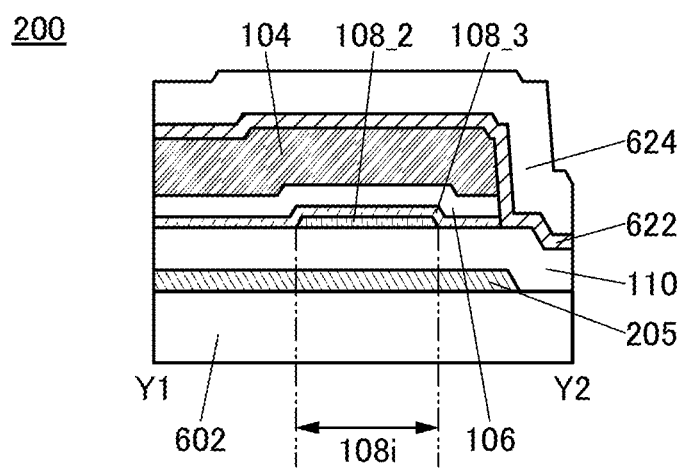

The transistor 200 illustrated in FIGS. 29A to 29C includes the conductor 205 formed over the substrate 602, the insulator 110 over the conductor 205, the oxide semiconductor 108 over the insulator 110, the insulator 106b over the oxide semiconductor 108, the conductor 104 over the insulator 106b, and an insulator 622 over the insulator 110, the oxide semiconductor 108, and the conductor 104. The oxide semiconductor 108 includes a channel region 108i overlapping with the conductor 104, a source region 108s in contact with the insulator 622, and a drain region 108d in contact with the insulator 622. The channel region 108i includes a layer 108_2 and a layer 108_3 which is in contact with a top surface of the layer 108_2 and covers side surfaces of the layer 108_2 in the channel width direction. Here, the above-described oxide semiconductor 108a can be used as the layer 108_2 in the channel region 108i. The insulator 106b functions as a gate insulator. The transistor 200 may further include an insulator 624 over the insulator 622, the conductor 112a electrically connected to the source region 108s through an opening 141a provided in the insulator 622 and the insulator 624, and the conductor 112b electrically connected to the drain region 108d through an opening 141b provided in the insulator 622 and the insulator 624.

Note that the conductor 205 functions as a second gate (also referred to as a bottom gate), the conductor 104 functions as a first gate (also referred to as a top gate), the insulator 106 functions as a first gate insulator, and the insulator 110 functions as a second gate insulator.

Here, an oxide semiconductor functioning as an electrode may be used as the conductor 104. The oxide semiconductor functioning as a gate has a function of supplying oxygen to the insulator 106b. The oxide semiconductor having a function of supplying oxygen to the insulator 106b enables the insulator 106b to contain excess oxygen. When the insulator 110 includes an excess oxygen region, excess oxygen can be supplied to the oxide semiconductor 108, specifically, the channel region 108i. Thus, oxygen vacancies in the channel region 108i are filled with excess oxygen, so that a highly reliable semiconductor device can be obtained.

The insulator 110, which is formed under the oxide semiconductor 108, may contain excess oxygen to be supplied to the oxide semiconductor 108. However, excess oxygen contained in the insulator 110 is also possibly supplied to the source region 108s and the drain region 108d of the oxide semiconductor 108. If excess oxygen is supplied to the source region 108s and the drain region 108d, the resistance of the source region 108s and the drain region 108d might be increased.

In contrast, in the structure in which the insulator 110 formed over the oxide semiconductor 108 contains excess oxygen, excess oxygen can be selectively supplied to the channel region 108i. Alternatively, after excess oxygen is supplied to the channel region 108i, the source region 108s, and the drain region 108d, the carrier density in the source region 108s and the drain region 108d may be selectively increased.

The insulator 622 contains nitrogen and/or hydrogen. From the insulator 622 containing nitrogen and/or hydrogen, nitrogen and/or hydrogen can be supplied to the oxide semiconductor 108 and the oxide semiconductor functioning as a gate.

The carrier density in the oxide semiconductor functioning as a gate having supplied oxygen to the insulator 106b is increased by nitrogen and/or hydrogen supplied from the insulator 622. In other words, the oxide semiconductor functioning as a gate also functions as an oxide conductor (OC). Thus, the oxide semiconductor functioning as a gate has a higher carrier density than the oxide semiconductor 108 and can function as a gate.

Furthermore, the oxide semiconductor functioning as a gate and the source region 108s and the drain region 108d of the oxide semiconductor 108 each may contain an element that forms an oxygen vacancy. Typical examples of the element that forms an oxygen vacancy are hydrogen, boron, carbon, nitrogen, fluorine, phosphorus, sulfur, chlorine, and a rare gas element. Typical examples of the rare gas element are helium, neon, argon, krypton, and xenon.

An impurity element added to the oxide semiconductor cuts a bond between a metal element and oxygen in the oxide semiconductor, so that an oxygen vacancy is formed. Alternatively, when an impurity element is added to the oxide semiconductor, oxygen bonded to a metal element in the oxide semiconductor is bonded to the impurity element and detached from the metal element, so that an oxygen vacancy is formed. As a result, the oxide semiconductor has a higher carrier density, and thus, the conductivity thereof becomes higher.

The transistor 200 preferably has a region in which a side end portion of the insulator 106b is aligned with a side end portion of the oxide semiconductor functioning as a gate. In other words, in the transistor 200, an upper end portion of the insulator 106b is substantially aligned with a lower end portion of the oxide semiconductor functioning as a gate. The above structure can be obtained by processing the insulator 106b with the use of the oxide semiconductor functioning as a gate as a mask, for example.

As described above, in the semiconductor device of one embodiment of the present invention, the insulator which covers the side surfaces of the oxide semiconductor serving as a channel region and which is formed over the channel region contains excess oxygen supplied from the oxide semiconductor functioning as a gate. A semiconductor device with such a structure can have high reliability.

A side surface of the channel region 108i in the channel width (W) direction or a region in the vicinity of the side surface is easily damaged by processing, resulting in a defect (e.g., an oxygen vacancy), or easily contaminated by an impurity attached thereto. Therefore, even when the channel region 108i is substantially intrinsic, stress such as an electric field applied thereto activates the side surface of the channel region 108i in the channel width (W) direction or the region in the vicinity of the side surface and turns it into a low-resistance (n-type) region easily. Moreover, if the side surface of the channel region 108i in the channel width (W) direction or the region in the vicinity of the side surface is an n-type region, a parasitic channel may be formed because the n-type region serves as a carrier path.

In the semiconductor device of one embodiment of the present invention, the channel region 108i has a stacked-layer structure and side surfaces of the channel region 108i in the channel width (W) direction are covered with one of the stacked layers. This structure can reduce defects on the side surfaces of the channel region 108i or in regions in the vicinity of the side surfaces or reduce impurities attached thereto.

The description of the oxide semiconductor 108b can be referred to for the layer 108_3 in the channel region 108i, for example.

The insulator 622 contains nitrogen and/or hydrogen. From the insulator 622 containing nitrogen and/or hydrogen, nitrogen and/or hydrogen can be supplied to the oxide semiconductor 108.

Meanwhile, the source region 108s and the drain region 108d are in contact with the insulator 622. Hydrogen and/or nitrogen are/is added from the insulator 622 to the source region 108s and the drain region 108d in contact with the insulator 622, so that the carrier densities in the source region 108s and the drain region 108d are increased.

Note that in the oxide semiconductor 108, the crystallinity of the channel region 108i is different from the crystallinity of each of the source region 108s and the drain region 108d in some cases. Specifically, in the oxide semiconductor 108, the crystallinity of each of the source region 108s and the drain region 108d is lower than the crystallinity of the channel region 108i in some cases. This is because, when the impurity element is added to the source region 108s and the drain region 108d, the source region 108s and the drain region 108d are damaged and thus have lower crystallinity.

The insulator 110 can be formed by a sputtering method, a CVD method, an evaporation method, a pulsed laser deposition (PLD) method, a printing method, a coating method, or the like as appropriate. For example, the insulator 110 can be formed to have a single-layer structure or stacked-layer structure of an oxide insulator and/or a nitride insulator. To improve the properties of the interface with the oxide semiconductor 108, at least a region of the insulator 110 which is in contact with the oxide semiconductor 108 is preferably formed using an oxide insulator. When the insulator 110 is formed using an oxide insulator from which oxygen is released by heating, oxygen contained in the insulator 110 can be moved to the oxide semiconductor 108 by heat treatment. For example, the insulator 110 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like. In this embodiment, the insulator 110 has a stacked-layer structure of a silicon nitride film and a silicon oxynitride film. With the insulator 110 having such a stacked-layer structure of a silicon nitride film as a lower layer and a silicon oxynitride film as an upper layer, oxygen can be efficiently introduced into the oxide semiconductor 108.

The thickness of the insulator 110 can be greater than or equal to 50 nm, greater than or equal to 100 nm and less than or equal to 3000 nm, or greater than or equal to 200 nm and less than or equal to 1000 nm. By increasing the thickness of the insulator 110, the amount of oxygen released from the insulator 110 can be increased, and interface states at the interface between the insulator 110 and the oxide semiconductor 108 and oxygen vacancies included in the channel region 108i of the oxide semiconductor 108 can be reduced.

The insulator 624 can be formed to have a single-layer structure or stacked-layer structure of an oxide insulator and/or a nitride insulator. For example, the insulator 618 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like. Furthermore, the insulator 618 preferably functions as a barrier film against hydrogen, water, and the like from the outside.

Note that the stacked-layer structure of the channel region 108i is not limited to the two-layer structure of the layer 108_2 and the layer 108_3 in FIGS. 29B and 29C. For example, the stacked-layer structure illustrated in FIGS. 30A and 30B may be employed.

Figure 30A:
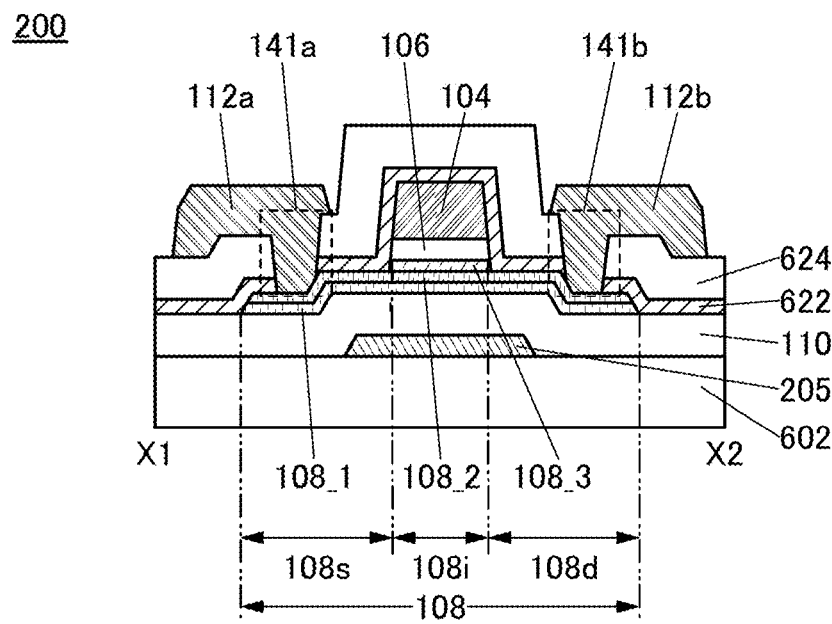
FIGS. 30A and 30B are cross-sectional views of a transistor.
Figure 30B:
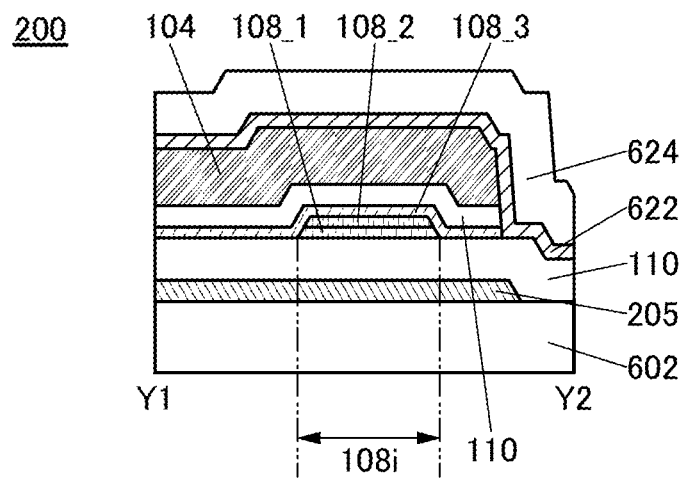

FIGS. 30A and 30B are cross-sectional views of the transistor 200. A top view of the transistor 200 is similar to that of the transistor 200 in FIG. 29A and will be described with reference to FIG. 29A. The cross-sectional view in FIG. 30A is taken along the dashed-dotted line X1-X2 in FIG. 29A, and the cross-sectional view in FIG. 30B is taken along the dashed-dotted line Y1-Y2 in FIG. 29A.

The oxide semiconductor 108 of the transistor 200 includes the channel region 108i overlapping with the conductor 104, the source region 108s in contact with the insulator 622, and the drain region 108d in contact with the insulator 622. The channel region 108i includes the layer 108_2, the layer 108_3 which is in contact with a top surface of the layer 108_2 and covers side surfaces of the layer 108_2 in the channel width direction, and a layer 108_1 in contact with a bottom surface of the layer 108_2.

As described above, the transistor 200 is different from the transistor 200 described above in the structure of the oxide semiconductor 108. Except that, the transistor 200 has a structure and an effect similar to those of the transistor 200.

The description of the oxide semiconductor 108b can be referred to for the layer 108_1 in the channel region 108i, for example.

Figure 31A:
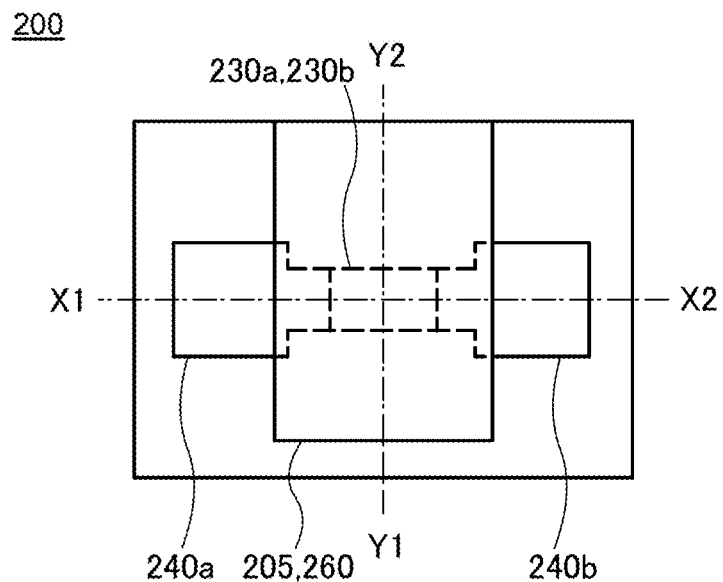
FIGS. 31A to 31C are a top view and cross-sectional views of a transistor.
Figure 31B:
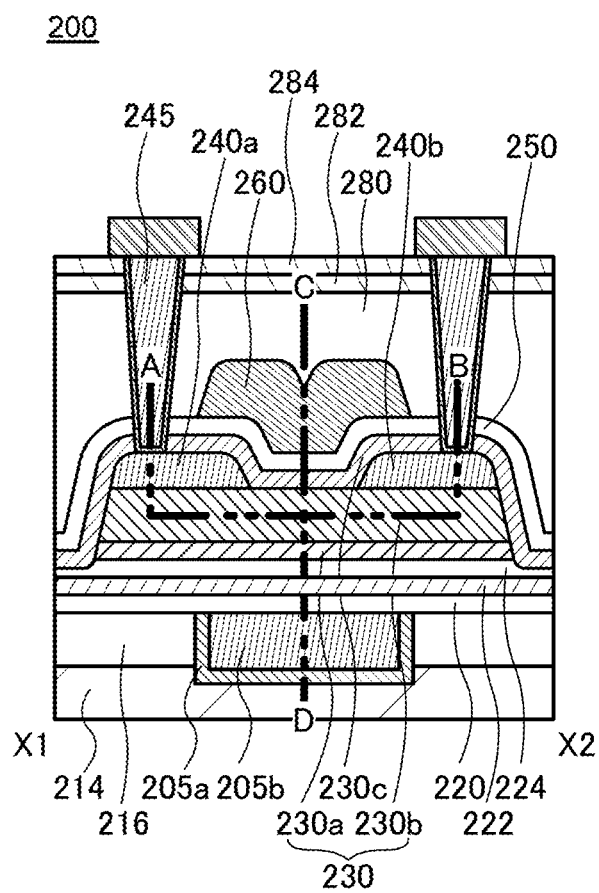
Figure 31C:
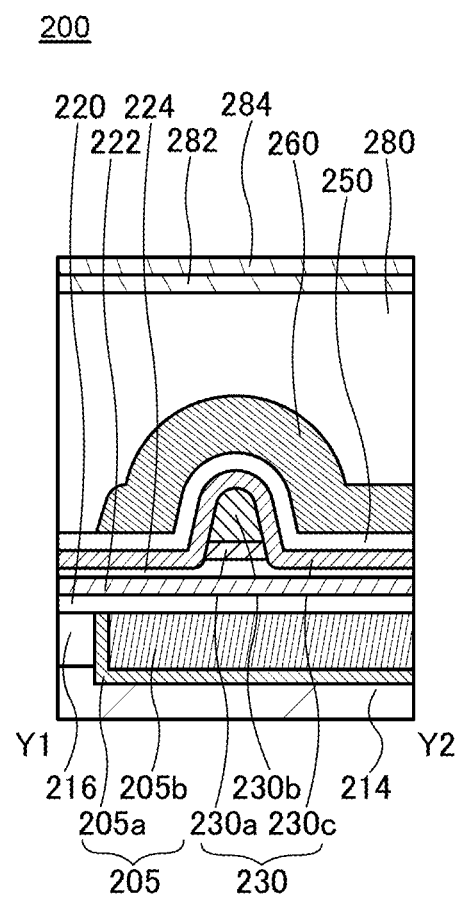

FIGS. 31A to 31C illustrate the transistor 200 as an example of a transistor of one embodiment of the present invention. FIG. 31A is a top view of the transistor 200. FIG. 31B is a cross-sectional view taken along the dashed-dotted line X1-X2 in FIG. 31A. FIG. 31C is a cross-sectional view taken along the dashed-dotted line Y1-Y2 in FIG. 31A.

The transistor 200 in FIGS. 31B and 31C includes an oxide semiconductor 230. In FIGS. 31B and 31C, the oxide semiconductor 230 is a three-layer structure of an oxide semiconductor 230a, an oxide semiconductor 230b over the oxide semiconductor 230a, and an oxide semiconductor 230c over the oxide semiconductor 230b. As the oxide semiconductor 230a, the oxide semiconductor 230b, and the oxide semiconductor 230c, an oxide S1, an oxide S2, and an oxide S3 which will be described in Embodiment 8 can be used, respectively.

In the transistor 200 in FIGS. 31A to 31C and the like, a conductor 260 and the conductor 205 preferably function as a first gate and a second gate, respectively. Here, in the transistor 200 in FIGS. 31A to 31C and the like, the conductor 260 and the conductor 205 are referred to as a top gate and a bottom gate, respectively, in some cases.

The transistor 200 preferably includes the insulator 220 over the conductor 205 and the insulator 222 between the insulator 220 and the insulator 224, between the insulator 224 and the conductor 205. The insulator 222 preferably functions as the charge trap layer. The threshold value of the transistor 200 can be controlled by trapping charges in the charge trap layer.

The transistor 200 includes the conductor 205 (conductors 205a and 205b) and the conductor 260 that function as gates; the insulator 220, the insulator 222, the insulator 224, and an insulator 250 that function as gate insulating layers; the oxide semiconductor 230 (the oxide semiconductors 230a, 230b, and 230c) having a region where a channel is formed; the conductor 240a functioning as one of a source and a drain; the conductor 240b functioning as the other of the source and the drain; and the insulator 280 containing excess oxygen The oxide semiconductor 230 includes the oxide semiconductor 230a, the oxide semiconductor 230b over the oxide semiconductor 230a, and the oxide semiconductor 230c over the oxide semiconductor 230b. When the transistor 200 is turned on, current flows (a channel is formed) mainly in the oxide semiconductor 230b. Although current sometimes flows through a region in the vicinity of the interface (a mixed region in some cases) between the oxide semiconductor 230b and the oxide semiconductor 230a and the oxide semiconductor 230c, the oxide semiconductor 230a and the oxide semiconductor 230c function as insulators at the other region.

The description of the conductor 104 and the like can be referred to for the conductor 205.

Each of the insulator 220 and the insulator 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). In the case where such an insulator containing excess oxygen is provided in contact with an oxide in the transistor 200, oxygen vacancies in the oxide can be compensated. Note that the insulator 222 and the insulator 224 are not necessarily formed of the same material.

The insulator 222 preferably has a single-layer structure or a stacked-layer structure formed using an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba, Sr)TiO$_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material but may be formed of different materials.

In the case where the insulator 222 including a high-k material is provided between the insulator 220 and the insulator 224, electrons can be trapped in the insulator 222 under specific conditions, and the threshold voltage can be increased. As a result, the insulator 222 is negatively charged in some cases.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source and the drain is kept at a temperature higher than the operating temperature or the storage temperature of the semiconductor device (e.g., at a temperature higher than or equal to 125° C. and lower than or equal to 450° C., typically higher than or equal to 150° C. and lower than or equal to 300° C.) for 10 milliseconds or longer, typically one minute or longer. Thus, electrons are moved from the oxide in the transistor 200 to the conductor 205. At this time, some of the moving electrons are trapped by the electron trap states of the insulator 222.

In the transistor in which a necessary amount of electrons is trapped by the electron trap states of the insulator 222, the threshold voltage is shifted in the positive direction. By controlling the voltage of the conductor 205, the amount of electrons to be trapped can be controlled, and thus the threshold voltage can be controlled. The transistor 200 having the structure is a normally-off transistor that is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging.

Furthermore, the threshold voltage can be controlled by appropriate adjustment of the thicknesses of the insulator 220, the insulator 222, and the insulator 224. A transistor having a low leakage current in an off state can be provided. A transistor having stable electrical characteristics can be provided. A transistor having a high on-state current can be provided. A transistor having a small subthreshold swing value can be provided. A highly reliable transistor can be provided.

The insulator 250 preferably has a single-layer structure or a stacked-layer structure formed using an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba, Sr)TiO$_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

As the insulator 250, like the insulator 224, an oxide insulator that contains oxygen in excess of the stoichiometric composition is preferably used. When such an insulator containing excess oxygen is provided in contact with the oxide semiconductor 230, oxygen vacancies in the oxide semiconductor 230 can be reduced.

As the insulator 250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties with respect to oxygen and hydrogen, can be used. The insulator formed of such a material functions as a layer that prevents release of oxygen from the oxide semiconductor 230 or entry of an impurity such as hydrogen from the outside.

Note that the insulator 250 may have a stacked-layer structure similar to that of the insulator 220, the insulator 222, and the insulator 224. When the insulator 250 includes an insulator in which a necessary amount of electrons is trapped by electron trap states, the threshold voltage of the transistor 200 can be shifted in the positive direction. The transistor 200 having the structure is a normally-off transistor that is in a non-conduction state (also referred to as an off state) even when the gate voltage is 0 V.

In addition to the insulator 250, a barrier film may be provided between the oxide semiconductor 230 and the conductor 260 in the semiconductor device in FIGS. 31A to 31C. Alternatively, the oxide semiconductor 230c may have a barrier property.

For example, an insulating film containing excess oxygen is provided in contact with the oxide semiconductor 230 and covered by a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide semiconductor 230.

One of a pair of the conductors 240a and 240b functions as a source, and the other functions as a drain.

The description of the conductor 104 can be referred to for the conductor 260 functioning as a gate, for example.

A plurality of layers may be stacked as the conductor 260 functioning as a gate. For example, a three-layer structure of a first layer, a second layer over the first layer, and a third layer over the second layer may be employed. The first layer is formed by a thermal CVD method, an MOCVD method, or an ALD method. In particular, the first layer is preferably formed by an atomic layer deposition (ALD) method. By employing an ALD method or the like, plasma damage to the insulator 250 can be reduced. Furthermore, it is preferable to use an ALD method or the like, because coverage can be improved. Thus, the transistor 200 having high reliability can be provided. The second layer is formed using a material having high conductivity such as tantalum, tungsten, copper, or aluminum. The third layer formed over the second layer is preferably formed using a conductor that is hardly oxidized, such as tungsten nitride. In the case where the insulator 280 is formed using an oxide material from which oxygen is released, the conductor 260 can be prevented from being oxidized by the released oxygen. Thus, the oxidation of the conductor 260 can be prevented, and oxygen released from the insulator 280 can be supplied to the oxide semiconductor 230 efficiently. The third layer has a large contact area with the insulator 280 including the excess-oxygen region. Thus, a conductor that is hardly oxidized is used for the third layer, whereby excess oxygen in the insulator 280 can be prevented from being absorbed into the conductor 260. Furthermore, a conductor that has high conductivity is used for the conductor 260b, whereby the transistor 200 with low power consumption can be provided.

The insulator 280 is provided over the transistor 200. The description of the insulator 614 and the like can be referred to for the insulator 280, for example.

Figure 32A:
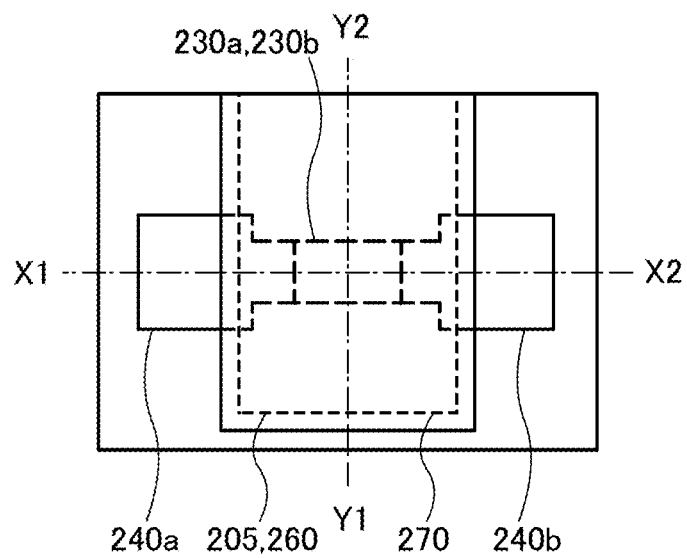
FIGS. 32A to 32C are a top view and cross-sectional views of a transistor.
Figure 32B:
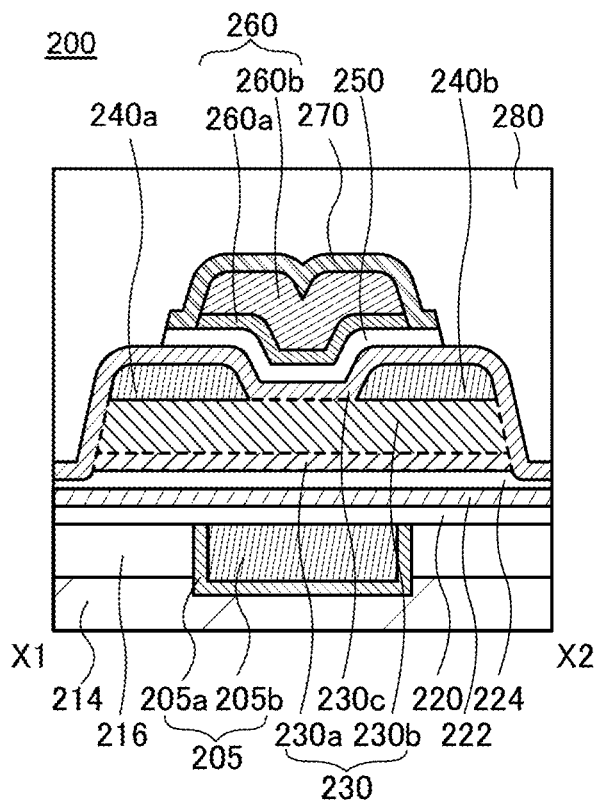
Figure 32C:
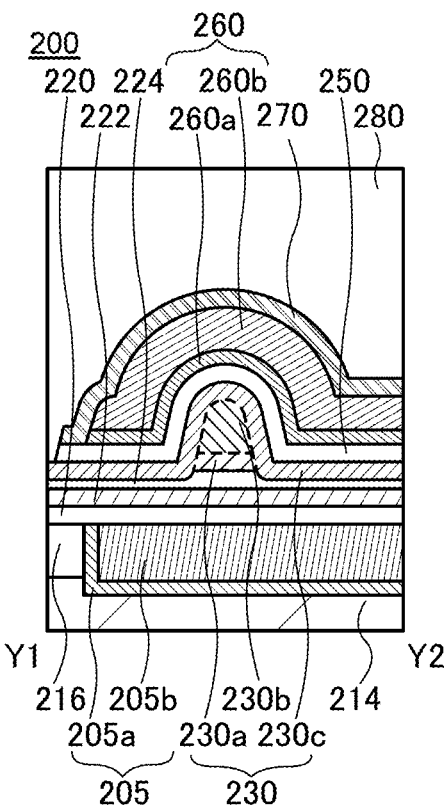

FIGS. 32A to 32C illustrate an example of a structure that can be used for the transistor 200. FIG. 32A illustrates a top surface of the transistor 200. For simplification of the figure, some films are omitted in FIG. 32A. FIG. 32B is a cross-sectional view taken along the dashed-dotted line X1-X2 in FIG. 32A, and FIG. 32C is a cross-sectional view taken along the dashed-dotted line Y1-Y2 in FIG. 32A.

Note that in the transistor 200 in FIGS. 32A to 32C, components having the same function as the components in the transistor 200 in FIGS. 31A to 31C are denoted by the same reference numerals.

In the structure illustrated in FIGS. 32A to 32C, the conductor 260 functioning as a gate has a stacked-layer structure of a conductor 260a and the conductor 260b. Furthermore, an insulator 270 is formed over the conductor 260 functioning as the gate.

The conductor 260a is formed by a thermal CVD method, an MOCVD method, or an ALD method. In particular, the conductor 260a is preferably formed by an ALD method. By employing an ALD method or the like, plasma damage to the insulator 250 can be reduced. Furthermore, it is preferable to use an ALD method or the like, because coverage can be improved. Thus, the transistor 200 having high reliability can be provided.

The conductor 260b is formed using a material having high conductivity such as tantalum, tungsten, copper, or aluminum.

The insulator 270 is provided to cover the conductor 260. In the case where the insulator 280 is formed using an oxide material from which oxygen is released, the insulator 270 is formed using a substance having a barrier property with respect to oxygen to prevent the conductor 260 from being oxidized by the released oxygen.

For example, the insulator 270 can be formed using a metal oxide such as aluminum oxide. The insulator 270 is formed to a thickness with which the oxidation of the conductor 260 is prevented. For example, the thickness of the insulator 270 is set to be greater than or equal to 1 nm and less than or equal to 10 nm, preferably greater than or equal to 3 nm and less than or equal to 7 nm.

Thus, the oxidation of the conductor 260 can be prevented, and oxygen released from the insulator 280 can be supplied to the oxide semiconductor 230 efficiently.

Figure 33A:
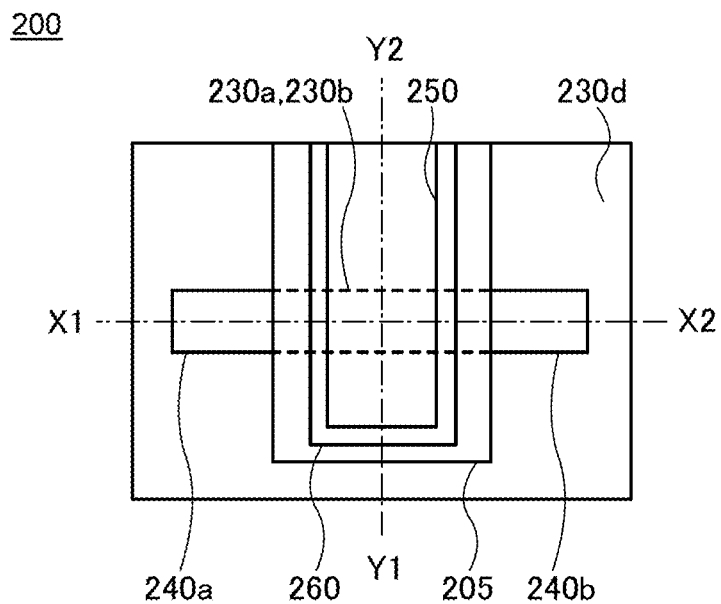
FIGS. 33A to 33C are a top view and cross-sectional views of a transistor.
Figure 33B:
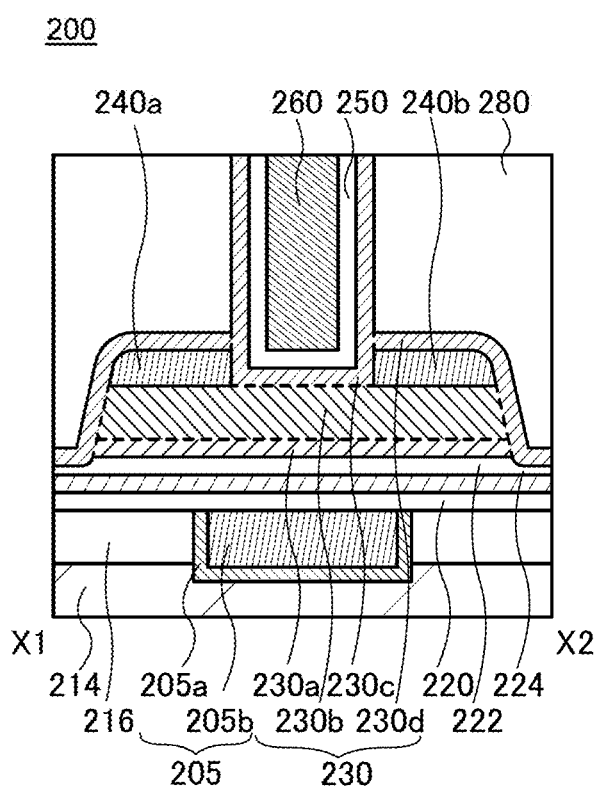
Figure 33C:
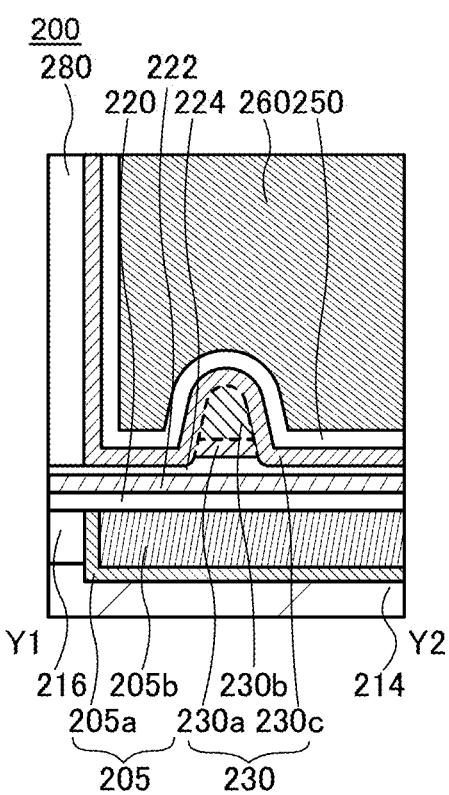

FIGS. 33A to 33C illustrate an example of a structure that can be used for the transistor 200. FIG. 33A illustrates a top surface of the transistor 200. For simplification of the figure, some films are omitted in FIG. 33A. FIG. 33B is a cross-sectional view taken along the dashed-dotted line X1-X2 in FIG. 33A, and FIG. 33C is a cross-sectional view taken along the dashed-dotted line Y1-Y2 in FIG. 33A.

Note that in the transistor 200 in FIGS. 33A to 33C, components having the same function as the components in the transistor 200 in FIGS. 31A to 31C are denoted by the same reference numerals.

The oxide semiconductor 230c, the insulator 250, and the conductor 260 are formed in an opening formed in the insulator 280. Furthermore, one end portion of each of the conductors 240a and 240b is aligned with an end portion of the opening formed in the insulator 280. Furthermore, three end portions of each of the conductors 240a and 240b are aligned with part of an end portion of the oxide semiconductor 230. Therefore, the conductors 240a and 240b can be formed concurrently with the oxide semiconductor 230 or the opening in the insulator 280. This leads to a reduction in the number of masks and steps and improvement in yield and productivity.

The conductors 240a and 240b and the oxide semiconductors 230b and 230c are in contact with the insulator 280 including the excess-oxygen region with the oxide semiconductor 230d provided therebetween. Therefore, generation of a shallow level in the vicinity of the channel formed in the oxide semiconductor 230b is inhibited; thus, a semiconductor device with high reliability can be provided.

Since the transistor 200 illustrated in FIGS. 33A to 33C has a structure in which the conductors 240a and 240b hardly overlap with the conductor 260, the parasitic capacitance added to the conductor 260 can be reduced. Thus, the transistor 200 with a high operation frequency can be provided.

In FIGS. 33A to 33C, the transistor 200 may have a structure without the oxide semiconductor 230d.

Embodiment 8

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 34A:
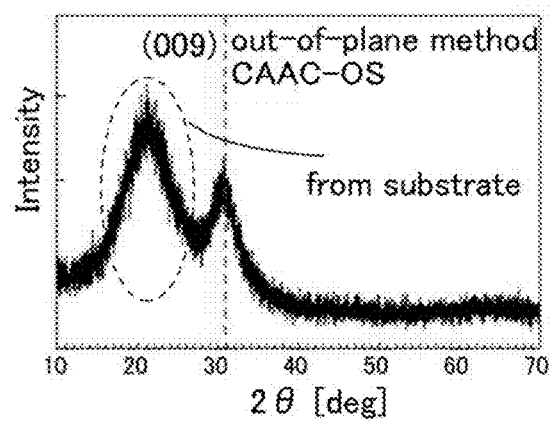
FIGS. 34A to 34E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle ($2\theta$) of around 31° as shown in FIG. 34A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 34B:
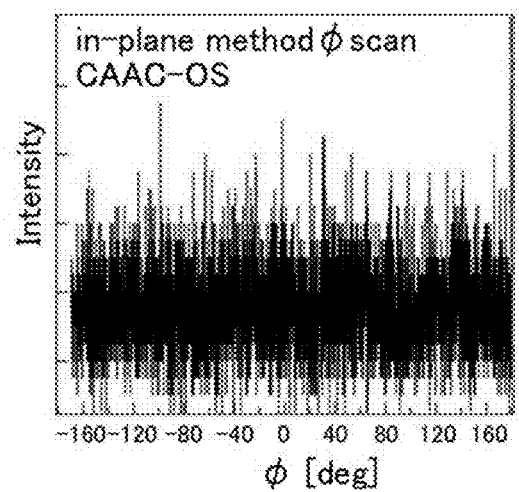
Figure 34C:
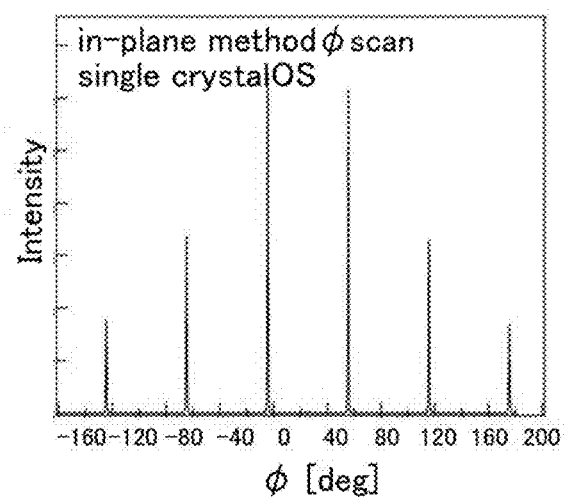

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with a 2θ fixed at around 56° and with the sample rotated using a normal vector to the sample surface as an axis (φ axis), as shown in FIG. 34B, a peak is not clearly observed. In contrast, in the case where single crystal InGaZnO$_4$ is subjected to φ scan with a 2θ fixed at around 56°, as shown in FIG. 34C, six peaks that are derived from crystal planes equivalent to the (110) plane are observed. Accordingly, the structural analysis using XRD shows that the directions of a-axes and b-axes are irregularly oriented in the CAAC-OS.

Figure 34D:
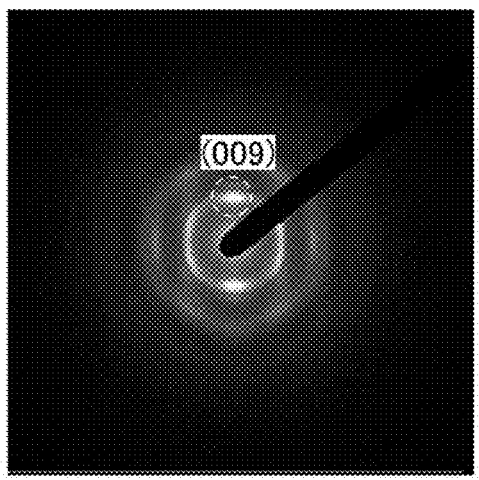
Figure 34E:
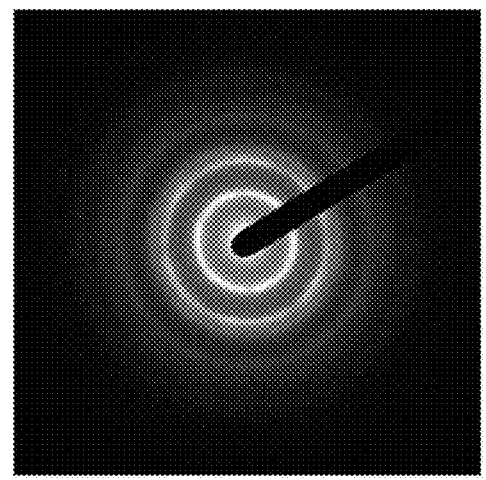

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 34D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 34E shows a diffraction pattern obtained in such a manner that an electron beam with a probe diameter of 300 nm is incident on the same sample in a direction perpendicular to the sample surface. As shown in FIG. 34E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 34E is considered to be derived from the (010) plane, the (100) plane, and the like of the InGaZnO$_4$ crystal. The second ring in FIG. 34E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 35A:
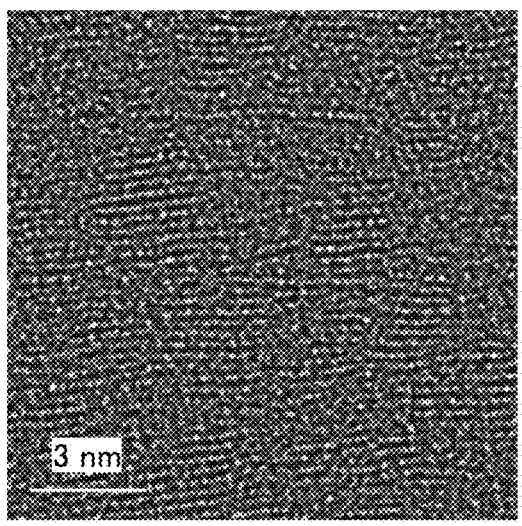
FIGS. 35A to 35E show a cross-sectional TEM image and plan-view TEM images of a CAAC-OS and images obtained through analysis thereof.

FIG. 35A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 35A shows pellets in which metal atoms are arranged in a layered manner. FIG. 35A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 35B:
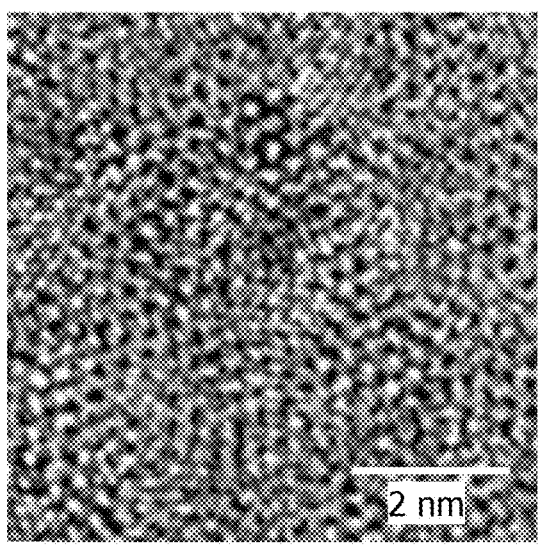
Figure 35C:
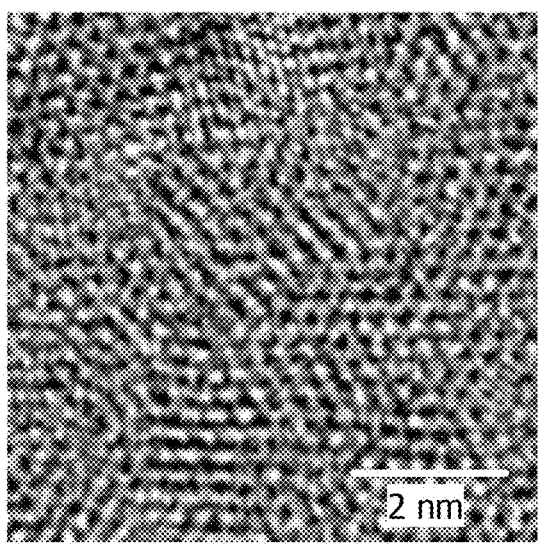
Figure 35D:
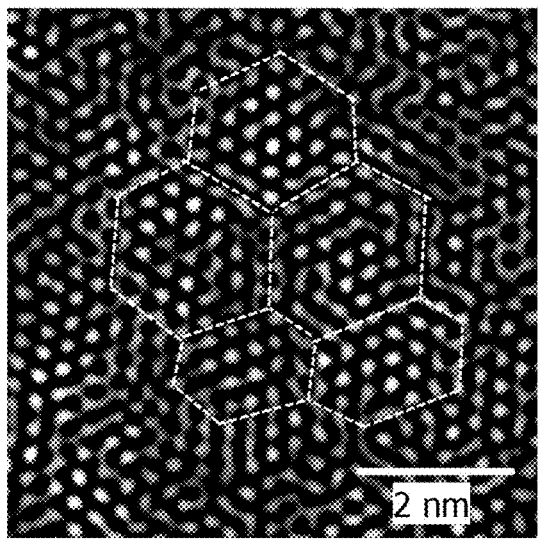
Figure 35E:
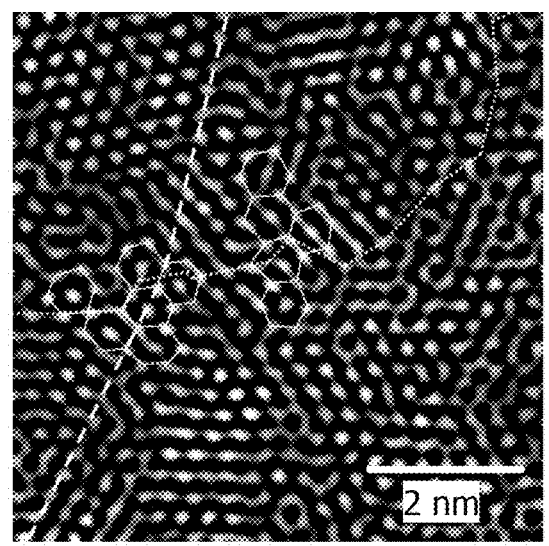

FIGS. 35B and 35C show Cs-corrected high-resolution TEM images of a plane of the CAAC-OS observed from a direction substantially perpendicular to the sample surface. FIGS. 35D and 35E are images obtained through image processing of FIGS. 35B and 35C. The method of image processing is as follows. The image in FIG. 35B is subjected to fast Fourier transform (FFT), so that FFT images are obtained. Then, mask processing is performed such that a range of from 2.8 nm$^{-1}$ to 5.0 nm$^{-1}$ from the origin point in the obtained FFT images remains. After the mask processing, the FFT images are processed by inverse fast Fourier transform (IFFT) to obtain processed images. The images obtained in this manner are called FFT filtering images. An FFT filtering image is a Cs-corrected high-resolution TEM image from which a periodic component is extracted, and shows a lattice arrangement.

In FIG. 35D, a portion where a lattice arrangement is broken is denoted with a dashed line. A region surrounded by a dashed line is one pellet. The portion shown by the dashed line is a junction of pellets. The dashed line draws a hexagon, which means that the pellet has a hexagonal shape. Note that the shape of the pellet is not always a regular hexagon but is a non-regular hexagon in many cases.

In FIG. 35E, a dotted line denotes a portion where the direction of a lattice arrangement is changed between a region with a regular lattice arrangement and another region with a regular lattice arrangement, and a dashed line denotes the change in the direction of the lattice arrangement. A clear grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

A CAAC-OS tends to have a layered crystal structure (also referred to as a layered structure) in which a layer that contains indium and oxygen (hereinafter referred to as an In layer) and a layer that contains an element M, zinc, and oxygen (hereinafter referred to as an "(M,Zn) layer") are stacked. Note that indium and the element M can be replaced with each other. When the element M in the (M,Zn) layer is replaced with indium, the layer can also be referred to as an (In,M,Zn) layer. Also, when indium in the In layer is replaced with the element M, the layer can be referred to as an (In,M) layer.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 36A:
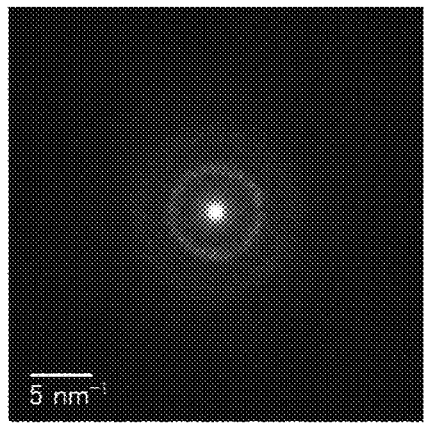
FIGS. 36A to 36D show electron diffraction patterns and a cross-sectional TEM image of an nc-OS.
Figure 36B:
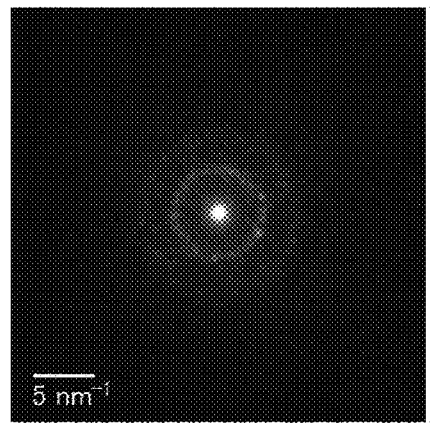

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 36A is observed. FIG. 36B shows a diffraction pattern (a nanobeam electron diffraction pattern) obtained when an electron beam with a probe diameter of 1 nm is incident on the same sample. As shown in FIG. 36B, a plurality of spots are observed in a ring-like region. In other words, ordering in an nc-OS is not observed with an electron beam with a probe diameter of 50 nm but is observed with an electron beam with a probe diameter of 1 nm.

Figure 36C:
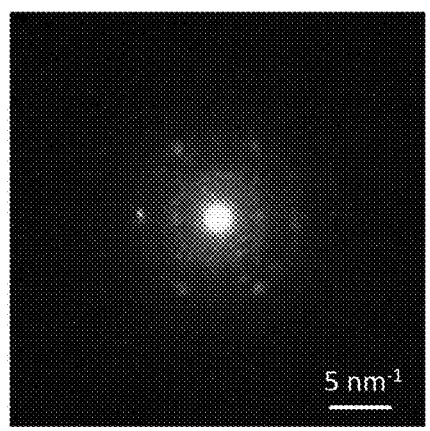

Furthermore, an electron diffraction pattern in which spots are arranged in an approximately regular hexagonal shape is observed in some cases as shown in FIG. 36C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 36D:
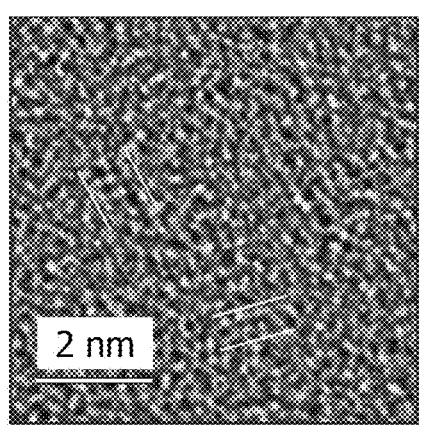

FIG. 36D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 36D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

Figure 37A:
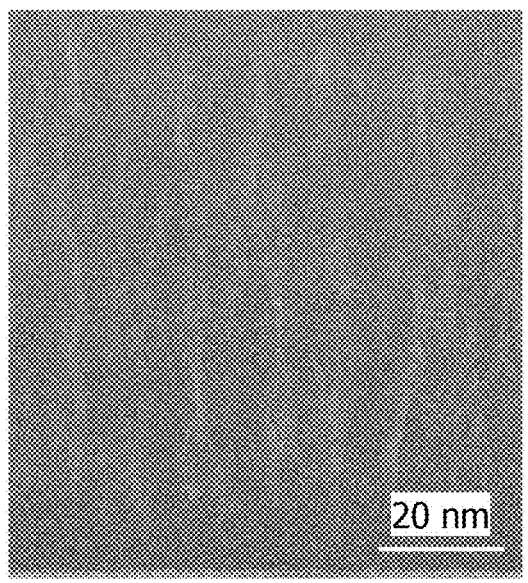
FIGS. 37A and 37B are cross-sectional TEM images of an a-like OS.
Figure 37B:
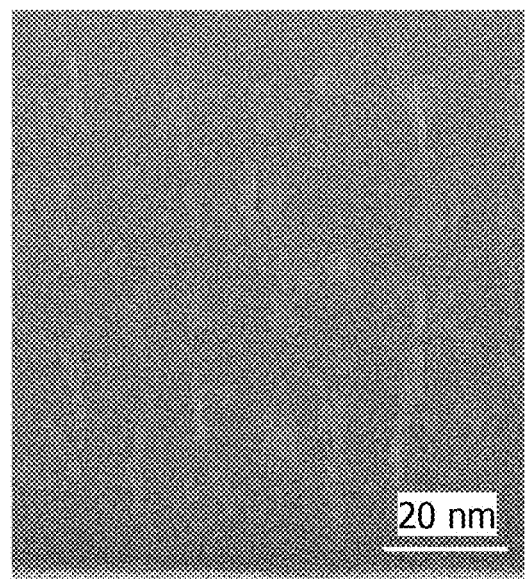

FIGS. 37A and 37B are high-resolution cross-sectional TEM images of an a-like OS. FIG. 37A is the high-resolution cross-sectional TEM image of the a-like OS at the start of the electron irradiation. FIG. 37B is the high-resolution cross-sectional TEM image of the a-like OS after the electron (e$^-$) irradiation at $4.3 \times 10^8$ e$^-$/nm$^2$. FIGS. 37A and 37B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 38:
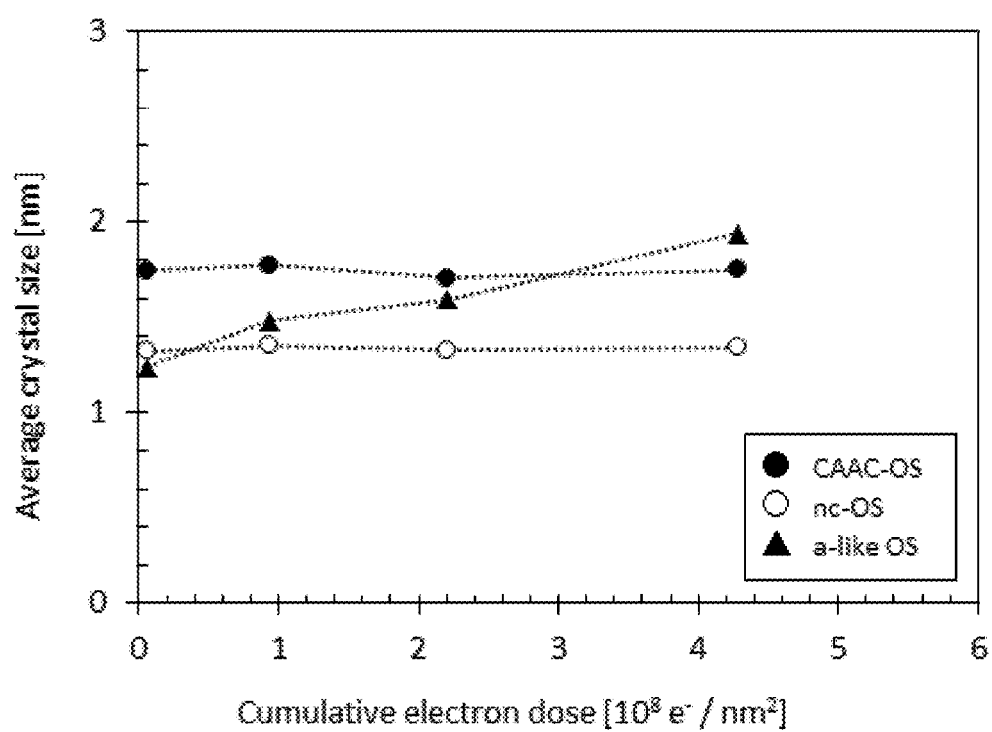
FIG. 38 shows a change of crystal parts of an In—Ga—Zn oxide owing to electron irradiation.

FIG. 38 shows a change in the average size of crystal parts (at 22 points to 30 points) in each sample. Note that the crystal part size corresponds to the length of a lattice fringe. FIG. 38 indicates that the crystal part size in the a-like OS increases with an increase in the cumulative electron dose in obtaining TEM images, for example. As shown in FIG. 38, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 38, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV, the current density was $6.7 \times 10^5$ $e^-/(nm^2 \cdot s)$, and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density lower than 78% of the density of the single crystal oxide semiconductor.

For example, in the case of an oxide semiconductor with an atomic ratio of In:Ga:Zn=1:1:1, the density of single crystal $InGaZnO_4$ with a rhombohedral crystal structure is 6.357 $g/cm^3$. Accordingly, in the case of the oxide semiconductor with an atomic ratio of In:Ga:Zn=1:1:1, the density of the a-like OS is higher than or equal to 5.0 $g/cm^3$ and lower than 5.9 $g/cm^3$. For example, in the case of the oxide semiconductor with an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stack of two or more films of an amorphous oxide semiconductor, an a-like OS, an nc-OS, and a CAAC-OS, for example.

<Carrier Density of Oxide Semiconductor>

Next, the carrier density of an oxide semiconductor is described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region is described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified instrinsic oxide semiconductor is lower than $8 \times 10^{15}$ $cm^{-3}$, preferably lower than $1 \times 10^{11}$ $cm^{-3}$, and further preferably lower than $1 \times 10^{10}$ $cm^{-3}$ and is higher than or equal to $1 \times 10^{-9}$ $cm^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$–$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The above oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ $cm^{-3}$ and lower than $1 \times 10^{18}$ $cm^{-3}$, further preferably higher than or equal to $1 \times 10^7$ $cm^{-3}$ and lower than or equal to $1 \times 10^{17}$ $cm^{-3}$, still further preferably higher than or equal to $1 \times 10^9$ $cm^{-3}$ and lower than or equal to $5 \times 10^{16}$ $cm^{-3}$, yet further preferably higher than or equal to $1 \times 10^{10}$ $cm^{-3}$ and lower than or equal to $1 \times 10^{16}$ $cm^{-3}$, and yet still preferably higher than or equal to $1 \times 10^{11}$ $cm^{-3}$ and lower than or equal to $1 \times 10^{15}$ $cm^{-3}$.

[Oxide]

An oxide of one embodiment of the present invention is described below.

An oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, InMZnO in which an oxide contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

Next, preferred ranges of atomic ratios of indium to the element M and zinc in the oxide of one embodiment of the present invention are described with reference to FIGS. 39A to 39C. Note that the proportion of oxygen atoms is not illustrated in FIGS. 39A to 39C. The terms of the atomic ratio of indium to the element M and zinc in the oxide are denoted by [In], [M], and [Zn], respectively.

Figure 39A:
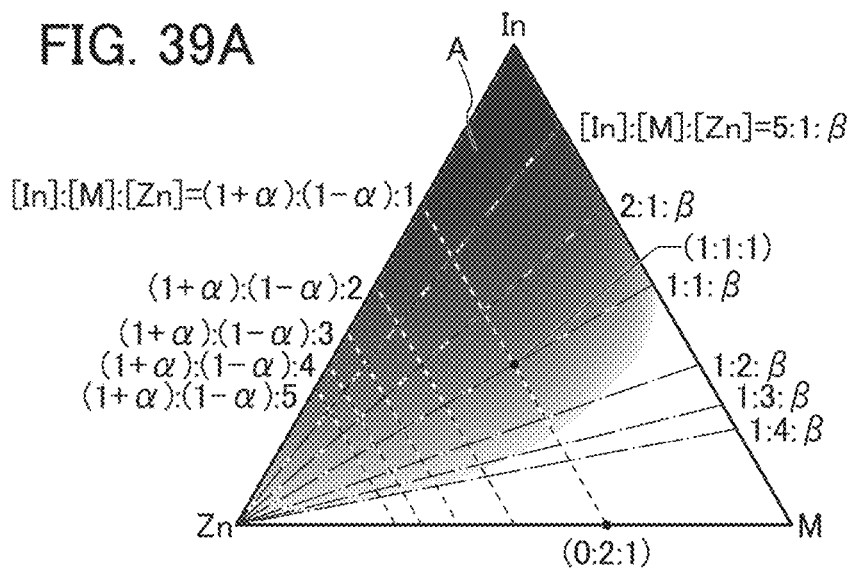
FIGS. 39A to 39C each illustrate an atomic ratio range of an oxide of the present invention.
Figure 39B:
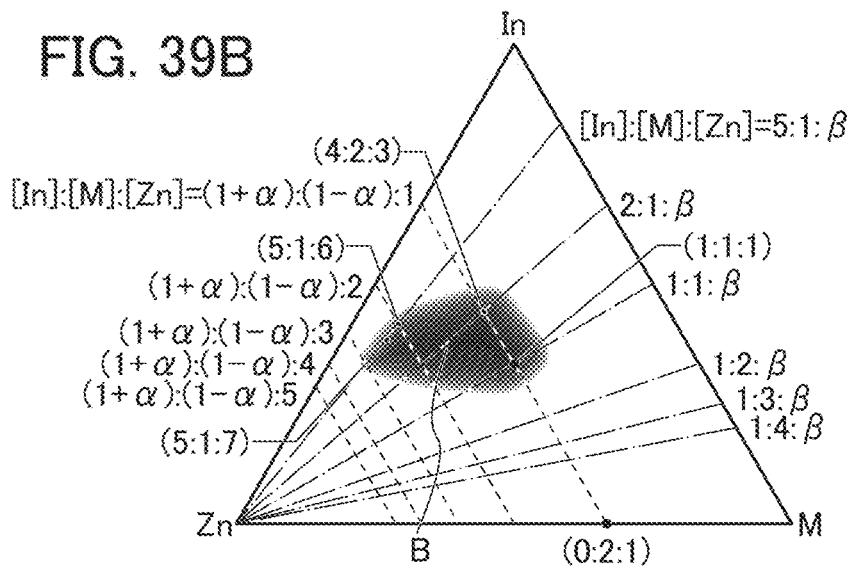
Figure 39C:
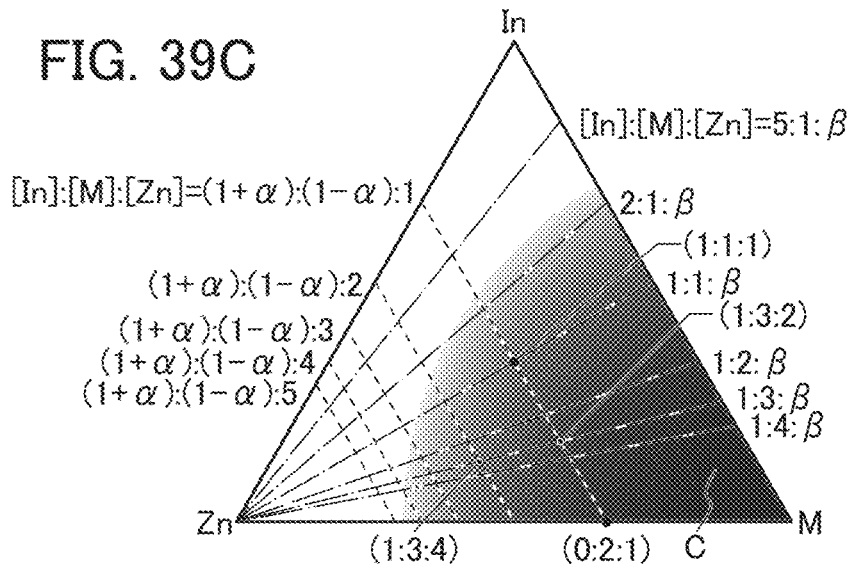

In FIGS. 39A to 39C, broken lines indicate a line where the atomic ratio of [In]:[M]:[Zn] is $(1+\alpha):(1-\alpha):1$, where $-1 \leq \alpha \leq 1$, a line where the atomic ratio of [In]:[M]:[Zn] is $(1+\alpha):(1-\alpha):2$, a line where the atomic ratio of [In]:[M]:[Zn] is $(1+\alpha):(1-\alpha):3$, a line where the atomic ratio of [In]:[M]:[Zn:] is $(1+\alpha):(1-\alpha):4$, and a line where the atomic ratio of [In]:[M]:[Zn] is $(1+\alpha):(1-\alpha):5$.

Dashed-dotted lines indicate a line where the atomic ratio of [In]:[M]:[Zn] is $1:1:\beta$, where $\beta \geq 0$, a line where the atomic ratio of [In]:[M]:[Zn] is $1:2:\beta$, a line where the atomic ratio of [In]:[M]:[Zn] is $1:3:\beta$, a line where the atomic ratio of [In]:[M]:[Zn] is $1:4:\beta$, a line where the atomic ratio of [In]:[M]:[Zn] is $2:1:\beta$, and a line where the atomic ratio of [In]:[M]:[Zn] is $5:1:\beta$.

An oxide having the atomic ratio of [In]:[M]:[Zn]=0:2:1 or a neighborhood thereof in FIGS. 39A to 39C tends to have a spinel crystal structure.

FIGS. 39A and 39B illustrate examples of the preferred ranges of the atomic ratios of indium to the element M and zinc contained in an oxide of one embodiment of the present invention.

Figure 40:
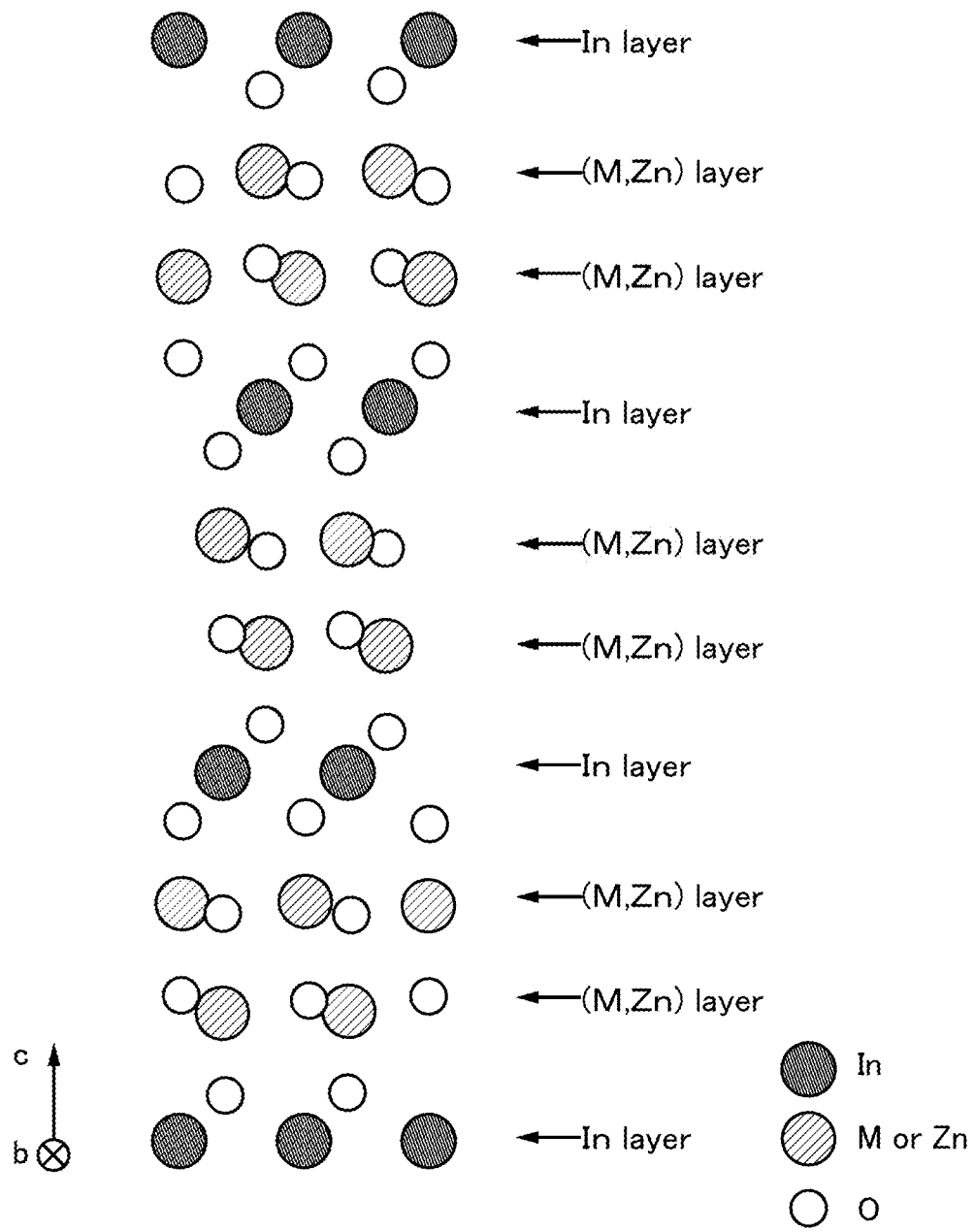
FIG. 40 illustrates a crystal of $InMZnO_4$.

FIG. 40 illustrates an example of the crystal structure of InMZnO$_4$ with an atomic ratio of [In]:[M]:[Zn]=1:1:1. The crystal structure illustrated in FIG. 40 is InMZnO$_4$ observed from a direction parallel to a b-axis. Note that a metal element in a layer that contains M, Zn, and oxygen (hereinafter, this layer is referred to as an "(M,Zn) layer") in FIG. 40 represents the element M or zinc.

For example, in the case where the oxide is deposited with a sputtering apparatus, a film with an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio of [In]:[M]:[Zn] that is close to 0:2:1, two phases of a spinel crystal structure and a layered crystal structure are likely to exist. In addition, with an atomic ratio of [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have high carrier mobility (electron mobility).

In contrast, when the indium content and the zinc content in an oxide become lower, carrier mobility becomes lower. Thus, with an atomic ratio of [In]:[M]:[Zn]=0:1:0 and the vicinity thereof (e.g., a region C in FIG. 39C), insulation performance becomes better.

The oxide of one embodiment of the present invention has an atomic ratio represented by a region A in FIG. 39A, with which a layered structure with high carrier mobility and a few grain boundaries is easily obtained.

In the region A, in particular a region B in FIG. 39B, an excellent oxide which easily becomes a CAAC-OS and has high carrier mobility can be obtained.

The region B in FIG. 39B represents an atomic ratio of [In]:[M]:[Zn]=4:2:3 to 4:2:4.1 and the vicinity thereof. The vicinity includes an atomic ratio of [In]:[M]:[Zn]=5:3:4, for example. Note that the region B includes an atomic ratio of [In]:[M]:[Zn]=5:1:6 and the vicinity thereof and an atomic ratio of [In]:[M]:[Zn]=5:1:7 and the vicinity thereof. An oxide with an atomic ratio represented by the region B is an excellent oxide that has particularly high crystallinity and high carrier mobility.

Note that the condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Thus, the illustrated regions each represent an atomic ratio with which an oxide has a layered structure, and boundaries of the regions A to C are not clear.

Next, the case where the oxide is used for a transistor is described.

Note that when the oxide is used for a transistor, carrier scattering or the like at a grain boundary can be reduced; thus, the transistor can have high field-effect mobility. In addition, the transistor can have high reliability.

An oxide with low carrier density is preferably used for the transistor. For example, an oxide whose carrier density is lower than $8 \times 10^{11}/cm^3$, preferably lower than $1 \times 10^{11}/cm^3$, and further preferably lower than $1 \times 10^{10}/cm^3$, and greater than or equal to $1 \times 10^{-9}/cm^3$ is used.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. Examples of impurities include hydrogen, nitrogen, alkali metal, alkaline earth metal, iron, nickel, and silicon.

Here, the influence of impurities in the oxide is described.

When silicon or carbon that is one of Group 14 elements is contained in the oxide, defect states are formed. Thus, the concentration of silicon or carbon in the oxide and around an interface with the oxide (measured by secondary ion mass spectrometry (SIMS)) is set lower than or equal to $2 \times 10^{18}$ atoms/cm$^3$, preferably lower than or equal to $2 \times 10^{17}$ atoms/cm$^3$.

When the oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide. Specifically, the concentration of alkali metal or alkaline earth metal in the oxide measured by SIMS is set lower than or equal to $1\times10^{18}$ atoms/cm$^3$, preferably lower than or equal to $2\times10^{16}$ atoms/cm$^3$.

When the oxide contains nitrogen, the oxide easily becomes n-type by generation of electrons serving as carriers and an increase of carrier density. Thus, a transistor whose semiconductor includes an oxide that contains nitrogen is likely to be normally-on. For this reason, nitrogen in the oxide is preferably reduced as much as possible; for example, the concentration of nitrogen in the oxide, which is measured by SIMS, can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, it is preferable that hydrogen in the oxide be reduced as much as possible. Specifically, the hydrogen concentration of the oxide measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide with sufficiently reduced impurity concentration is used for a channel formation region in a transistor, the transistor can have stable electrical characteristics.

Next, the case where the oxide has a two-layer structure or a three-layer structure is described. A band diagram of a stacked-layer structure of the oxide S1, the oxide S2, and the oxide S3 and insulators that are in contact with the stacked-layer structure and a band diagram of a stacked-layer structure of the oxide S2 and the oxide S3 and insulators that are in contact with the stacked-layer structure are described with reference to FIGS. 41A and 41B.

Figure 41A:
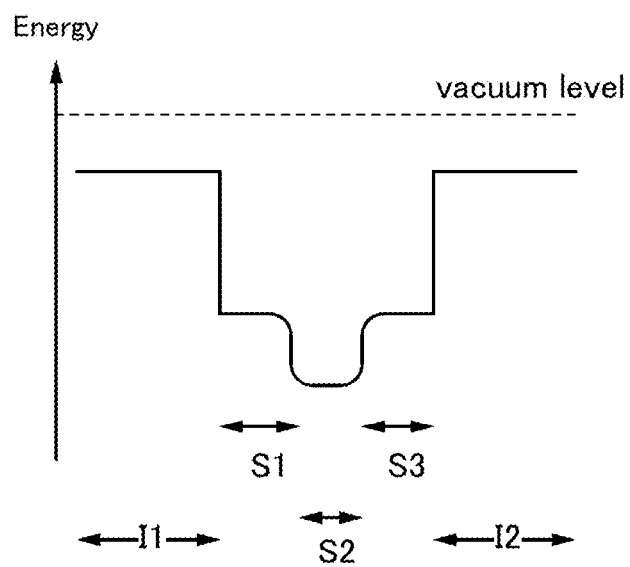
FIGS. 41A and 41B are each a band diagram of a stacked-layer structure of an oxide.
Figure 41B:
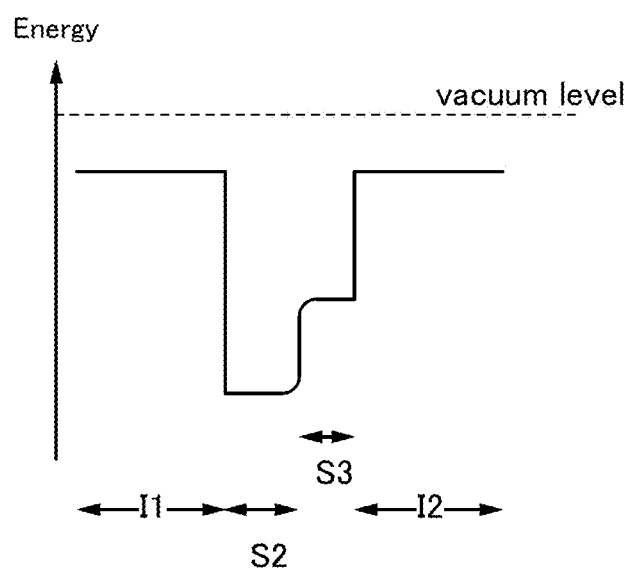

FIG. 41A is an example of the band diagram of a stacked-layer structure of an insulator I1, the oxide S1, the oxide S2, the oxide S3, and an insulator I2 in a film thickness direction. FIG. 41B is an example of the band diagram of a stacked-layer structure of the insulator I1, the oxide S2, the oxide S3, and the insulator I2 in a film thickness direction. Note that for easy understanding, the band diagrams show the energy level of the conduction band minimum (E$_c$) of each of the insulator I1, the oxide S1, the oxide S2, the oxide S3, and the insulator I2.

The energy level of the conduction band minimum of each of the oxide S1 and the oxide S3 is closer to the vacuum level than that of the oxide S2. Typically, a difference in the energy level between the conduction band minimum of the oxide S2 and the conduction band minimum of each of the oxide S1 and the oxide S3 is preferably greater than or equal to 0.15 eV or greater than or equal to 0.5 eV, and less than or equal to 2 eV or less than or equal to 1 eV. That is, a difference in the electron affinity between each of the oxide S1 and the oxide S3 and the oxide S2 is preferably greater than or equal to 0.15 eV or greater than or equal to 0.5 eV, and less than or equal to 2 eV or less than or equal to 1 eV.

As shown in FIGS. 41A and 41B, the energy level of the conduction band minimum of each of the oxide S1, the oxide S2, and the oxide S3 is gradually varied. In other words, the energy level of the conduction band minimum is continuously varied or continuously connected. In order to obtain such a band diagram, the density of defect states in a mixed layer formed at the interface between the oxide S1 and the oxide S2 or the interface between the oxide S2 and the oxide S3 is preferably made low.

Specifically, when the oxide S1 and the oxide S2, or the oxide S2 and the oxide S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxide S1, the oxide S2, and the oxide S3.

At this time, the oxide S2 serves as a main carrier path. Since the density of defect states at the interface between the oxide S1 and the oxide S2 and the interface between the oxide S2 and the oxide S3 can be made low, the influence of interface scattering on carrier conduction is small, and a high on-state current can be obtained.

When an electron is trapped in a trap state, the trapped electron behaves like fixed charge; thus, the threshold voltage of the transistor shifts in a positive direction. The oxide S1 and the oxide S3 can make the trap state apart from the oxide S2. This structure can prevent the positive shift of the threshold voltage of the transistor.

A material whose conductivity is sufficiently lower than that of the oxide S2 is used for the oxide S1 and the oxide S3. In that case, the oxide S2, the interface between the oxide S1 and the oxide S2, and the interface between the oxide S2 and the oxide S3 mainly function as a channel region. For example, an oxide with high insulation performance and the atomic ratio represented by the region C in FIG. 39C may be used as the oxide S1 and the oxide S3. The region C in FIG. 39C shows the atomic ratio of [In]:[M]:[Zn]=0:1:0 and the vicinity thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2, as each of the oxide S1 and the oxide S3. In addition, it is suitable to use an oxide with sufficiently high insulation performance and an atomic ratio where [M]/([Zn]+[In]) is greater than or equal to 1 as the oxide S3.

This application is based on Japanese Patent Application serial no. 2015-256954 filed with Japan Patent Office on Dec. 28, 2015, the entire contents of which are hereby incorporated by reference.

What is claimed is:

1. A circuit to which an N-bit signal is input, comprising:
a first digital-to-analog converter circuit;
a second digital-to-analog converter circuit; and
an amplifier circuit,
wherein the amplifier circuit comprises:
   a first transistor;
   a second transistor;
   a third transistor; and
   a fourth transistor,
wherein the first transistor forms a differential pair with the second transistor, and
wherein the third transistor forms a differential pair with the fourth transistor,
wherein an output terminal of the first digital-to-analog converter circuit is electrically connected to a gate of the first transistor and a gate of the third transistor, wherein an output terminal of the second digital-to-analog converter circuit is electrically connected to a substrate potential of the second transistor,
wherein an upper M-bit signal of the N-bit signal is input to the first digital-to-analog converter circuit, and
wherein a lower (N−M)-bit signal of the N-bit signal is input to the second digital-to-analog converter circuit.

2. The circuit according to claim 1, further comprising:
a third digital-to analog converter circuit;
wherein the first transistor and the second transistor are n-channel transistors,
wherein the third transistor and the fourth transistor are p-channel transistors,
wherein an output terminal of the third digital-to-analog converter circuit is electrically connected to a substrate potential of the fourth transistor,
wherein one of a source and a drain of the first transistor is electrically connected to one of a source and a drain of the second transistor,
wherein one of a source and a drain of the third transistor is electrically connected to one of a source and a drain of the fourth transistor,
wherein an output terminal of the amplifier circuit is electrically connected to a gate of the second transistor and a gate of the fourth transistor,
wherein a lower (N−M)-bit signal of the N-bit signal is input to the third digital-to-analog converter circuit.

3. A semiconductor device comprising:
the circuit according to claim 1; and
a low-voltage differential signaling receiver, a logic circuit, a shift register, a latch circuit, or a level shifter.

4. An electronic device comprising:
the semiconductor device according to claim 3; and
an input/output terminal, an operation button, or an external connection port.

5. A display device comprising:
the circuit according to claim 1;
a signal line driver circuit comprising a low-voltage differential signaling receiver, a logic circuit, a shift register, a latch circuit, or a level shifter; and
at least one of a touch sensor, a speaker, and an imaging device.

6. The circuit according to claim 5,
wherein the first amplifier circuit comprises a third transistor and a fourth transistor,
wherein the third transistor forms a differential pair with the fourth transistor,
wherein one of a source and a drain of the third transistor is electrically connected to the first output terminal of the first amplifier circuit, and
wherein one of a source and a drain of the fourth transistor is electrically connected to the second output terminal of the first amplifier circuit.

7. An electronic device comprising the display device according to claim 5.

8. A circuit to which an N-bit signal is input, comprising:
a first digital-to-analog converter circuit;
a second digital-to-analog converter circuit;
a first amplifier circuit; and
a second amplifier circuit,
wherein the first amplifier circuit comprises:
an input terminal;
a first output terminal; and
a second output terminal,
wherein an output terminal of the first digital-to-analog converter circuit is electrically connected to the input terminal of the first amplifier circuit,
wherein the second amplifier circuit comprises:
a first transistor; and
a second transistor,
wherein a gate of the first transistor and a gate of the second transistor are electrically connected to each other,
wherein an output terminal of the second digital-to-analog converter circuit is electrically connected to a substrate potential of the first transistor,
wherein a first potential is supplied to one of a source and a drain of the first transistor and one of a source and a drain of the second transistor,
wherein the first potential is a high potential signal when the first transistor and the second transistor are p-channel transistors,
wherein the first potential is a low potential signal when the first transistor and the second transistor are n-channel transistors,
wherein the other of the source and the drain of the first transistor is electrically connected to the first output terminal of the first amplifier circuit,
wherein the other of the source and the drain of the second transistor is electrically connected to the second output terminal of the first amplifier circuit,
wherein an upper M-bit signal of the N-bit signal is input to the first digital-to-analog converter circuit, and
wherein a lower (N−M)-bit signal of the N-bit signal is input to the second digital-to-analog converter circuit.

9. A semiconductor device comprising:
the circuit according to claim 8; and
a low-voltage differential signaling receiver, a logic circuit, a shift register, a latch circuit, or a level shifter.

10. An electronic device comprising:
the semiconductor device according to claim 9; and
an input/output terminal, an operation button, or an external connection port.

11. A display device comprising:
the circuit according to claim 8;
a signal line driver circuit comprising a low-voltage differential signaling receiver, a logic circuit, a shift register, a latch circuit, or a level shifter; and
at least one of a touch sensor, a speaker, and an imaging device.

12. A circuit to which an N-bit signal is input, comprising:
a first digital-to-analog converter circuit;
a second digital-to-analog converter circuit; and
an amplifier circuit,
wherein the amplifier circuit comprises:
a first transistor; and
a second transistor,
wherein the first transistor comprises a first gate,
wherein the second transistor comprises a first gate and a second gate, and
wherein an output terminal of the first digital-to-analog converter circuit is electrically connected to the first gate of the first transistor,
wherein an output terminal of the second digital-to-analog converter circuit is electrically connected to the second gate of the second transistor,
wherein one of a source and a drain of the second transistor is electrically connected to one of a source and a drain of the first transistor,
wherein an output terminal of the amplifier circuit is electrically connected to the first gate of the second transistor,
wherein an upper M-bit signal of the N-bit signal is input to the first digital-to-analog converter circuit, wherein a lower (N−M)-bit signal of the N-bit signal is input to the second digital-to-analog converter circuit, and wherein the first transistor and the second transistor each include an oxide semiconductor.

13. A semiconductor device comprising:
the circuit according to claim 12; and
a low-voltage differential signaling receiver, a logic circuit, a shift register, a latch circuit, or a level shifter.

14. An electronic device comprising:
the semiconductor device according to claim 13; and
an input/output terminal, an operation button, or an external connection port.

15. A display device comprising:
the circuit according to claim 12;
a signal line driver circuit comprising a low-voltage differential signaling receiver, a logic circuit, a shift register, a latch circuit, or a level shifter; and
at least one of a touch sensor, a speaker, and an imaging device.

16. The circuit according to claim 12,
wherein the one of the source and the drain of the second transistor is directly connected to the one of the source and the drain of the first transistor.

17. A circuit to which an N-bit signal is input, comprising:
a first digital-to-analog converter circuit;
a second digital-to-analog converter circuit;
a first amplifier circuit; and
a second amplifier circuit,
wherein the first amplifier circuit comprises:
 an input terminal;
 a first output terminal; and
 a second output terminal,
wherein an output terminal of the first digital-to-analog converter circuit is electrically connected to the input terminal of the first amplifier circuit,
wherein the second amplifier circuit comprises:
 a first transistor; and
 a second transistor,
wherein a gate of the first transistor and a first gate of the second transistor are electrically connected to each other,
wherein a low potential signal is supplied to one of a source and a drain of the first transistor and one of a source and a drain of the second transistor,
wherein the other of the source and the drain of the first transistor is electrically connected to the first output terminal of the first amplifier circuit, and
wherein the other of the source and the drain of the second transistor is electrically connected to the second output terminal of the first amplifier circuit,
wherein an output terminal of the second digital-to-analog converter circuit is electrically connected to a second gate of the second transistor,
wherein an upper −M-bit signal of the N-bit signal is input to the first digital-to-analog converter circuit,
wherein a lower (N−M)-bit signal of the N-bit signal is input to the second digital-to-analog converter circuit, and wherein the first transistor and the second transistor each include an oxide semiconductor.

18. The circuit according to claim 17,
wherein the first amplifier circuit comprises a third transistor and a fourth transistor,
wherein the third transistor forms a differential pair with the fourth transistor,
wherein one of a source and a drain of the third transistor is electrically connected to the first output terminal of the first amplifier circuit, and
wherein one of a source and a drain of the fourth transistor is electrically connected to the second output terminal of the first amplifier circuit.

19. A semiconductor device comprising:
the circuit according to claim 17; and
a low-voltage differential signaling receiver, a logic circuit, a shift register, a latch circuit, or a level shifter.

20. An electronic device comprising:
the semiconductor device according to claim 19; and
an input/output terminal, an operation button, or an external connection port.

21. A display device comprising:
the circuit according to claim 19;
a signal line driver circuit comprising a low-voltage differential signaling receiver, a logic circuit, a shift register, a latch circuit, or a level shifter; and
at least one of a touch sensor, a speaker, and an imaging device.

22. A method for driving a circuit to which an N-bit signal is input, the circuit comprising:
a first digital-to-analog converter circuit;
a second digital-to-analog converter circuit; and
an amplifier circuit the amplifier circuit comprising:
 a first transistor; and
 a second transistor,
wherein an output terminal of the first digital-to-analog converter circuit is electrically connected to a gate of the first transistor,
wherein the first transistor forms a differential pair with the second transistor,
wherein an output terminal of the second digital-to-analog converter circuit is electrically connected to a substrate potential of the second transistor,
wherein one of a source and a drain of the first transistor is electrically connected to one of a source and a drain of the second transistor,
wherein an output terminal of the amplifier circuit is electrically connected to the gate of the second transistor,
wherein a substrate potential of the first transistor is connected to a constant voltage source,
the method comprising the steps of:
 inputting an upper M-bit signal of the N-bit signal to the first digital-to-analog converter circuit;
 inputting a lower (N−M)-bit signal of the N-bit signal to the second digital-to-analog converter circuit; and
 changing a potential supplied to the substrate potential of the second transistor so that a potential output from the amplifier circuit is changed.

* * * * *